US012581891B2

(12) United States Patent
Yoshida et al.

(10) Patent No.: US 12,581,891 B2
(45) Date of Patent: Mar. 17, 2026

(54) SUBSTRATE PROCESSING METHOD, SUBSTRATE PROCESSING DEVICE, AND PROCESSING FLUID

(71) Applicant: SCREEN Holdings Co., Ltd., Kyoto (JP)

(72) Inventors: Yukifumi Yoshida, Kyoto (JP); Kana Tahara, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 367 days.

(21) Appl. No.: 18/005,103

(22) PCT Filed: Jul. 8, 2021

(86) PCT No.: PCT/JP2021/025861
§ 371 (c)(1),
(2) Date: Jan. 11, 2023

(87) PCT Pub. No.: WO2022/024709
PCT Pub. Date: Feb. 3, 2022

(65) Prior Publication Data

US 2023/0268172 A1 Aug. 24, 2023

(30) Foreign Application Priority Data

Jul. 27, 2020 (JP) ................................ 2020-126876

(51) Int. Cl.
*H01L 21/02* (2006.01)
*B08B 7/00* (2006.01)
(Continued)

(52) U.S. Cl.
CPC ...... *H01L 21/02057* (2013.01); *B08B 7/0014* (2013.01); *G03F 7/36* (2013.01);
(Continued)

(58) Field of Classification Search
CPC ......... H01L 21/02057; H01L 21/67051; H01L 21/68764; H01L 21/31111;
(Continued)

(56) References Cited

U.S. PATENT DOCUMENTS 3,520,684 A * 7/1970 Schaefer ............... G03F 7/0041
216/87
3,935,117 A * 1/1976 Suzuki .............. H01L 21/02107
438/746
(Continued)

FOREIGN PATENT DOCUMENTS

CN 111326456 A 6/2020
JP 2007-059876 A 3/2007
(Continued)

OTHER PUBLICATIONS

WO 2020129845 A1, Machine Translation. (Year: 2025).*
(Continued)

*Primary Examiner* — Joshua L Allen
*Assistant Examiner* — Christopher Remavege
(74) *Attorney, Agent, or Firm* — OSTROLENK FABER LLP

(57) ABSTRACT

A substrate processing method includes a processing film forming step in which a processing liquid is supplied to a front surface of a substrate to solidify or cure the processing liquid on the front surface of the substrate, thereby forming a processing film on the front surface of the substrate, an etching component forming step in which the processing film is subjected to etching component forming processing to form an etching component in the processing film, an etching step in which a surface layer portion of the substrate is etched by the etching component formed in the etching component forming step, and a processing film removing step in which a peeling liquid is supplied to a front surface
(Continued)

of the processing film, thereby peeling the processing film from the front surface of the substrate and removing the processing film from the front surface of the substrate.

16 Claims, 31 Drawing Sheets

(51) Int. Cl.
*G03F 7/36* (2006.01)
*G03F 7/42* (2006.01)
*H01L 21/67* (2006.01)
*H01L 21/687* (2006.01)

(52) U.S. Cl.
CPC .......... *G03F 7/42* (2013.01); *H01L 21/67051* (2013.01); *H01L 21/68764* (2013.01)

(58) Field of Classification Search
CPC ......... H01L 21/32134; H01L 21/67028; H01L 21/6708; H01L 21/67115; B08B 7/0014; G03F 7/36; G03F 7/42; G03F 7/20
See application file for complete search history.

(56) References Cited

U.S. PATENT DOCUMENTS

| | | | | |
|---|---|---|---|---|
| 3,960,559 | A * | 6/1976 | Suzuki | H01L 23/291 430/908 |
| 3,992,208 | A * | 11/1976 | Nagata | G03F 7/0041 430/323 |
| 4,735,892 | A * | 4/1988 | Orpwood | G03F 7/094 430/394 |
| 4,873,176 | A * | 10/1989 | Fisher | G03F 7/36 430/326 |
| 2005/0085087 | A1 | 4/2005 | Okigawa et al. | |
| 2007/0048911 | A1 | 3/2007 | Oh et al. | |
| 2008/0317949 | A1* | 12/2008 | Edgington | C11D 3/37 427/154 |
| 2012/0177891 | A1 | 7/2012 | Millward et al. | |
| 2012/0260949 | A1 | 10/2012 | Sekiguchi et al. | |
| 2014/0234198 | A1 | 8/2014 | Morita et al. | |
| 2015/0064911 | A1 | 3/2015 | Kaneko et al. | |
| 2015/0072536 | A1* | 3/2015 | Muramatsu | H01L 21/0271 355/27 |
| 2018/0182610 | A1* | 6/2018 | Kaneko | H01L 21/0206 |
| 2019/0366394 | A1 | 12/2019 | Yoshida et al. | |
| 2020/0194281 | A1* | 6/2020 | Yoshida | H01L 21/67028 |
| 2022/0056383 | A1* | 2/2022 | Kinuta | C11D 3/3765 |
| 2022/0323998 | A1 | 10/2022 | Yoshida | |

FOREIGN PATENT DOCUMENTS

| | | | | |
|---|---|---|---|---|
| JP | 2011-071385 | A | 4/2011 | |
| JP | 2013-008897 | A | 1/2013 | |
| JP | 2015-149410 | A | 8/2015 | |
| JP | 2015-165526 | A | 9/2015 | |
| JP | 2019-212889 | A | 12/2019 | |
| JP | 2021-009894 | A | 1/2021 | |
| TW | 200511431 | A | 3/2005 | |
| WO | WO 2020/120534 | A1 | 6/2020 | |
| WO | WO-2020129845 | A1 * | 6/2020 | G03F 7/20 |

OTHER PUBLICATIONS

International Search Report mailed Sep. 28, 2021 in corresponding PCT International Application No. PCT/JP2021/025861.

Written Opinion mailed Sep. 28, 2021 in corresponding PCT International Application No. PCT/JP2021/025861.

International Preliminary Report on Patentability (Chapter I) mailed Feb. 9, 2023 with a Notification from the International Bureau (Form PCT/IB/326) in corresponding PCT International Application No. PCT/JP2021/025861 in Japanese.

English translation of the International Preliminary Report on Patentability (Chapter I) mailed Feb. 9, 2023 with a Notification from the International Bureau (Form PCT/IB/338) in corresponding PCT International Application No. PCT/JP2021/025861 in English.

* cited by examiner

SUBSTRATE PROCESSING METHOD, SUBSTRATE PROCESSING DEVICE, AND PROCESSING FLUID

CROSS-REFERENCE TO RELATED APPLICATIONS

The present application is a 35 U.S.C. §§ 371 national stage application of International Application No. PCT/JP2021/025861 filed Jul. 8, 2021, which claims priority to Japanese Patent Application No. 2020-126876, filed Jul. 27, 2020, the contents of which are incorporated herein by reference.

TECHNICAL FIELD

The present invention relates to a substrate processing method and a substrate processing apparatus for processing substrates as well as a processing liquid which is used in these. Examples of substrates to be processed include substrates such as semiconductor wafers, substrates for optical disks, substrates for magnetic disks, substrates for magneto-optical disks, substrates for photomasks, ceramic substrates, substrates for solar cells, and substrates for FPDs (flat panel displays) such as liquid crystal display devices, plasma display panels, and organic EL (electroluminescence) display devices, etc.

BACKGROUND ART

Hydrofluoric acid is used as an etching liquid for etching a front surface of a substrate (refer to Patent Literature 1 mentioned below). After the substrate is processed by the etching liquid, the front surface of the substrate is rinsed with a rinse liquid such as DIW.

PATENT LITERATURE

Patent Literature 1: United States Patent Application Publication No. 2012/260949

SUMMARY OF INVENTION

Technical Problem

In the above-described etching processing, the etching liquid and the rinse liquid mixed with the etching liquid are drained in large quantities, thereby causing a great environmental load. Thus, an object of the present invention is to provide a substrate processing method, a substrate processing apparatus and a processing liquid which are capable of reducing the amount of etching components to be used.

Solution to Problem

A preferred embodiment of the present invention is to provide a substrate processing method including a processing film forming step in which a processing liquid is supplied to a front surface of a substrate to solidify or cure the processing liquid on the front surface of the substrate, thereby forming a processing film on the front surface of the substrate, an etching component forming step in which the processing film is subjected to etching component forming processing to form an etching component in the processing film, an etching step in which a surface layer portion of the substrate is etched by the etching component formed in the etching component forming step, and a processing film removing step in which a peeling liquid is supplied to a front surface of the processing film, thereby peeling the processing film from the front surface of the substrate and removing the processing film from the front surface of the substrate.

According to this method, the processing film which is formed on the substrate is subjected to the etching component forming processing such as heating, light irradiation, and supply of water. Thereby, an etching component is formed in the processing film, and the surface layer portion of the substrate is etched by the etching component.

Unlike this method, in a method in which an etching liquid is continuously supplied to the front surface of the substrate to etch the surface layer portion of the substrate, the etching component is expelled one after another to the outside of the substrate. By contrast thereto, the etching component which is formed in the processing film is not removed to the outside of the substrate but reacts with the surface layer portion of the substrate. Therefore, it is possible to reduce the amount of the etching component to be consumed.

Further, in the processing film removing step, the processing film is not removed from the front surface of the substrate by being dissolved in the peeling liquid but removed by being peeled from the front surface of the substrate. Therefore, objects to be removed such as particles adhering to the front surface of the substrate can be detached from the front surface of the substrate and removed.

Further, the surface layer portion of the substrate is etched by the etching component, by which the front surface of the substrate recedes further than before the etching step is started. Therefore, the objects to be removed are allowed to rise from the front surface of the substrate. Therefore, the processing film is removed by peeling after performing the etching by the etching component in the processing film, thus making it possible to detach favorably the objects to be removed.

It is noted that the processing film is not necessarily constituted of a solid component alone. The processing film may be constituted of both a solid component and a liquid component if a certain shape is kept as a whole.

In a preferred embodiment of the present invention, the substrate processing method further includes a high solubility component forming step in which after the etching component forming step and before the processing film removing step, the processing film is subjected to high solubility component forming processing, thereby forming in the processing film a first high solubility component which is higher in solubility with respect to the peeling liquid than other components in the processing film. Then, in the processing film removing step, the peeling liquid is supplied to the front surface of the substrate, thereby dissolving the first high solubility component in the processing film.

According to this method, the high solubility component forming processing such as light irradiation is performed, thereby forming the first high solubility component in the processing film. The first high solubility component formed in the processing film is dissolved by the peeling liquid which is supplied subsequently to the front surface of the substrate. The first high solubility component in the processing film is selectively dissolved by the peeling liquid, thereby forming a gap (through hole) in the processing film. Therefore, the peeling liquid can quickly reach an interface between the processing film and the substrate through the gap formed in the processing film. The peeling liquid enters the interface between the substrate and the processing film to peel the processing film from the front surface of the substrate. It is, thereby, possible to quickly peel the processing film from the front surface of the substrate after completion of the etching by the etching component.

In a preferred embodiment of the present invention, in the processing film forming step, the processing film is formed which contains a first low solubility component that is lower in solubility with respect to the peeling liquid than the first high solubility component.

According to this method, the solubility of the first low solubility component with respect to the peeling liquid is lower than the solubility of the first high solubility component with respect to the peeling liquid. Therefore, while the first high solubility component is dissolved by the peeling liquid, the first low solubility component is not dissolved by the peeling liquid but kept in a solid state in the processing film.

Consequently, while the first high solubility component is dissolved by the peeling liquid, the first low solubility component is not dissolved by the peeling liquid but can be kept in the processing film. Therefore, the peeling liquid passes through the gap which is formed by dissolution of the first high solubility component and reaches the interface between the substrate and the processing film.

As a result, it is possible to quickly peel the processing film from the front surface of the substrate after completion of the etching by the etching component.

Since the first low solubility component is kept in a solid state, even after the first high solubility component is dissolved, it is possible to hold the objects to be removed by the first low solubility component. Also, when the processing film is removed from the front surface of the substrate by the peeling liquid, it is possible to keep a state that the objects to be removed are held by the processing film.

In a preferred embodiment of the present invention, in the processing film forming step, the processing film which contains a first reaction component is formed. In the etching component forming step, the first reaction component is decomposed by the etching component forming processing to form a second reaction component in the processing film together with the etching component. Then, in the high solubility component forming step, the second reaction component is decomposed by the high solubility component forming processing to form the first high solubility component in the processing film.

According to this method, the first reaction component is decomposed by the etching component forming processing to form the etching component and the second reaction component. Since the etching component is formed in response to an external stimulation, it is easier to control the timing of the start of the etching as compared with a case where the etching component is formed by spontaneous decomposition of a component in the processing film.

Then, the second reaction component is decomposed in response to an external stimulation of the high solubility component forming processing, thereby forming the first high solubility component which is to be dissolved by the peeling liquid that is supplied subsequently to the front surface of the substrate. Therefore, the processing film is kept on the substrate before supply of the peeling liquid and quickly peeled by supply of the peeling liquid. Consequently, it is possible to accurately control an etching amount of the surface layer portion of the substrate, while suppressing the amount of the etching component to be consumed.

In a preferred embodiment of the present invention, the substrate processing method further includes a decomposition accelerating liquid supplying step in which a decomposition accelerating liquid to accelerate decomposition of the first reaction component in the etching component forming step is supplied to the front surface of the substrate. According to this method, decomposition of the first reaction component is accelerated by the decomposition accelerating liquid. Thereby, it is possible to quickly etch the surface layer portion of the substrate.

In a preferred embodiment of the present invention, in the decomposition accelerating liquid supplying step, decomposition of the second reaction component is accelerated by the decomposition accelerating liquid which is supplied to the front surface of the substrate. According to this method, decomposition of the second reaction component is accelerated by the decomposition accelerating liquid. It is, thereby, possible to quickly form the first high solubility component.

In a preferred embodiment of the present invention, in the processing film forming step, the processing film which contains the first reaction component is formed. Then, the processing film is subjected to the etching component forming processing, by which the first reaction component in the processing film is decomposed to form an etching component.

According to this method, the first reaction component is decomposed by the etching component forming processing to form the etching component. Since the etching component is formed in response to an external stimulation, it is easier to control the timing of the start of the etching as compared with a case where the etching component is formed by spontaneous decomposition of a component in the processing film. Consequently, it is possible to accurately control an etching amount of the surface layer portion of the substrate.

In a preferred embodiment of the present invention, the first reaction component is a carboxylic acid ester or a sulfonic acid ester. Carboxylic acid ester, sulfonic acid ester, etc., undergo hydrolysis and are able to form an acid component such as carboxylic acid or sulfonic acid which functions as the etching component.

In a preferred embodiment of the present invention, in the processing film forming step, the processing film which contains a second high solubility component is formed. Then, the second high solubility component in the processing film is dissolved by the peeling liquid supplied in the processing film removing step.

According to this method, in the processing film forming step, the processing film which contains the second high solubility component is formed. The second high solubility component in the processing film is dissolved by the peeling liquid which is supplied subsequently to the front surface of the substrate. The second high solubility component in the processing film is selectively dissolved by the peeling liquid, thereby forming a gap (through hole) in the processing film. Therefore, the peeling liquid can quickly reach an interface between the processing film and the substrate through the gap formed in the processing film. The peeling liquid enters the interface between the substrate and the processing film to peel the processing film from the front surface of the substrate. It is, thereby, possible to quickly peel the processing film from the front surface of the substrate after completion of the etching by the etching component.

In a preferred embodiment of the present invention, in the processing film forming step, the processing film is formed which contains a second low solubility component that is lower in solubility with respect to the peeling liquid than the second high solubility component.

According to this method, the solubility of the second low solubility component with respect to the peeling liquid is lower than the solubility of the second high solubility component with respect to the peeling liquid. Therefore, while the second high solubility component is dissolved by the peeling liquid, the second low solubility component is not dissolved by the peeling liquid but kept in a solid state in the processing film.

Consequently, while the second high solubility component is dissolved in the peeling liquid, the second low solubility component is not dissolved in the peeling liquid but can be kept in the processing film. Therefore, the peeling liquid passes through the gap formed by dissolution of the second high solubility component and reaches the interface between the substrate and the processing film.

As a result, it is possible to quickly peel the processing film from the front surface of the substrate after completion of the etching by the etching component.

Since the second low solubility component is kept in a solid state, it is possible to hold the objects to be removed by the second low solubility component even after dissolution of the second high solubility component. It is possible to keep a state that the objects to be removed are held by the processing film even after supply of the peeling liquid.

In a preferred embodiment of the present invention, in the etching step, etching residue is formed by etching of the surface layer portion of the substrate. The etching residue is held by the processing film which is formed in the processing film forming step. Then, the processing film removing step includes a step in which the etching residue is removed together with the processing film in a state that the etching residue is held by the processing film.

According to this method, the etching residue generated by the etching of the surface layer portion of the substrate is removed from the front surface of the substrate together with the processing film in the processing film removing step. Therefore, there is no need to separately perform processing for removing the etching residue after removal of the processing film.

Another preferred embodiment of the present invention is to provide a substrate processing apparatus including a processing liquid supplying unit which supplies a processing liquid to a front surface of a substrate, a processing film forming unit by which the processing liquid present on the front surface of the substrate is solidified or cured to form a processing film on the front surface of the substrate, an etching component forming processing unit which applies etching component forming processing to the processing film, a peeling liquid supplying unit which supplies to the front surface of the substrate a peeling liquid to peel the processing film from the front surface of the substrate, and a controller which controls the processing liquid supplying unit, the processing film forming unit, the etching component forming processing unit, and the peeling liquid supplying unit.

The controller is programmed so as to execute a processing film forming step in which the processing liquid is supplied from the processing liquid supplying unit to the front surface of the substrate and the processing liquid supplied to the front surface of the substrate is solidified or cured by the processing film forming unit to form the processing film on the front surface of the substrate, an etching component forming step in which the etching component forming processing is performed by the etching component forming processing unit to form an etching component in the processing film, an etching step in which a surface layer portion of the substrate is etched by the etching component that is formed in the etching component forming step, and a processing film removing step in which the peeling liquid is supplied from the peeling liquid supplying unit to the front surface of the substrate, thereby peeling the processing film from the front surface of the substrate and removing the processing film from the front surface of the substrate.

This apparatus provides the same effects as those of the invention of the substrate processing method described above.

Still another preferred embodiment of the present invention provides a processing liquid which is solidified or cured to form a processing film that can be peeled from a front surface of a substrate by a peeling liquid. The processing liquid has a reaction component which forms an etching component to etch a surface layer portion of the substrate in the processing film by etching component forming processing and a solid-state keeping component which keeps a solid state in the processing film even after the etching component forming processing is performed.

According to this arrangement, the processing liquid is solidified or cured on the front surface of the substrate to form the processing film. In this state, the etching component forming processing is performed by heating, light irradiation, supply of water, etc., by which the etching component can be formed in the processing film. On the other hand, the solid-state keeping component is kept in a solid state even after the etching component forming processing. Therefore, it is possible to etch a surface layer portion of the substrate by the etching component formed in the processing film. That is, it is possible to etch the surface layer portion of the substrate, without removing the etching component to the outside of the substrate. Therefore, it is possible to reduce the amount of the etching component to be consumed, as compared with a case where the etching liquid is supplied one after another to the front surface of the substrate to etch the surface layer portion of the substrate.

The aforementioned as well as yet other objects, features, and effects of the present invention will be made clear by the following description of the preferred embodiments, with reference to the accompanying drawings.

DESCRIPTION OF EMBODIMENTS

First Preferred Embodiment

Figure 1:
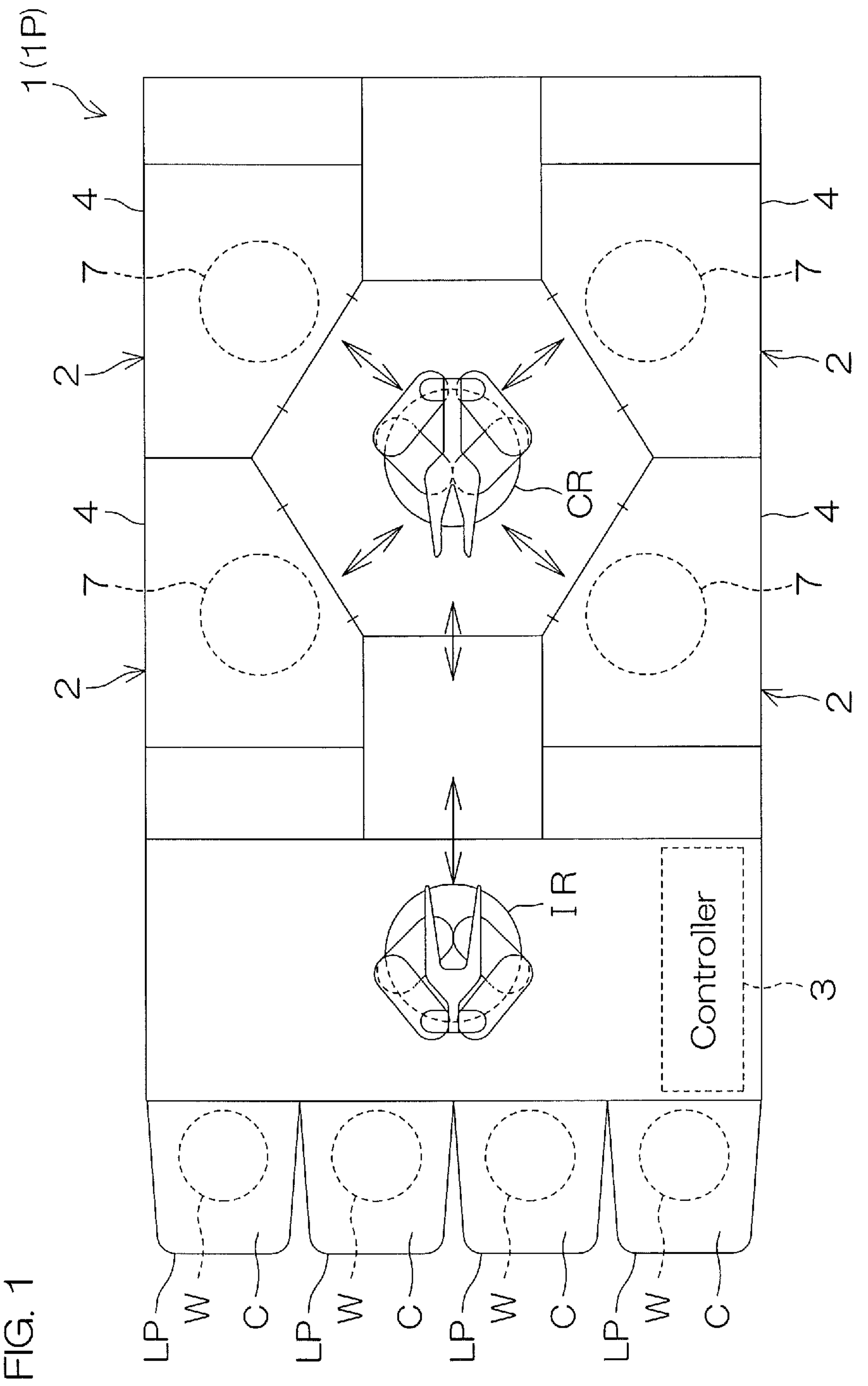
FIG. 1 is a schematic plan view which shows a layout of a substrate processing apparatus according to a first preferred embodiment of the present invention.

FIG. 1 is a schematic plan view which shows a layout of a substrate processing apparatus 1 according to a preferred embodiment of the present invention.

The substrate processing apparatus 1 is a single substrate processing type apparatus that processes a substrate W such as a silicon wafer one at a time. In the preferred embodiment, the substrate W is a disk-shaped substrate. Such a substrate that a component which can be etched is exposed on a front surface may be used as the substrate W.

As the substrate W, a substrate is favorably used in which any one among $SiO_2$ (silicon oxide), TiN (titanium nitride), Cu (copper) and Ru (ruthenium) is exposed on a front surface. Only one type of the above-described substances may be exposed on the front surface of the substrate W or the plural types of above-described substances may be exposed. A substance that can be etched other than the above-described substances may be exposed on the front surface of the substrate W.

The substrate processing apparatus 1 includes a plurality of processing units 2 to process the substrate W with fluids, load ports LP on which carriers C are placed that house the plurality of substrates W to be processed by the processing unit 2, transfer robots IR and CR that transfer the substrates W between the load port LP and the processing unit 2, and a controller 3 that controls the substrate processing apparatus 1.

The transfer robot IR transfers the substrates W between the carrier C and the transfer robot CR. The transfer robot CR transfers the substrates W between the transfer robot IR and the processing unit 2. The plurality of processing units 2 have, for example, the same arrangement. Although the details will be described later, fluids supplied to the substrate W inside the processing unit 2 include a processing liquid, a peeling liquid, a rinse liquid (decomposition accelerating liquid), a residue removing liquid, etc.

Each processing unit 2 includes a chamber 4 and a processing cup 7 disposed inside the chamber 4 and executes processing of the substrate W inside the processing cup 7. An inlet/outlet (not shown) to carry in the substrate W and to carry out the substrate W by the transfer robot CR is formed at the chamber 4. The chamber 4 is provided with a shutter unit (not shown) to open and to close the inlet/outlet.

Figure 2:
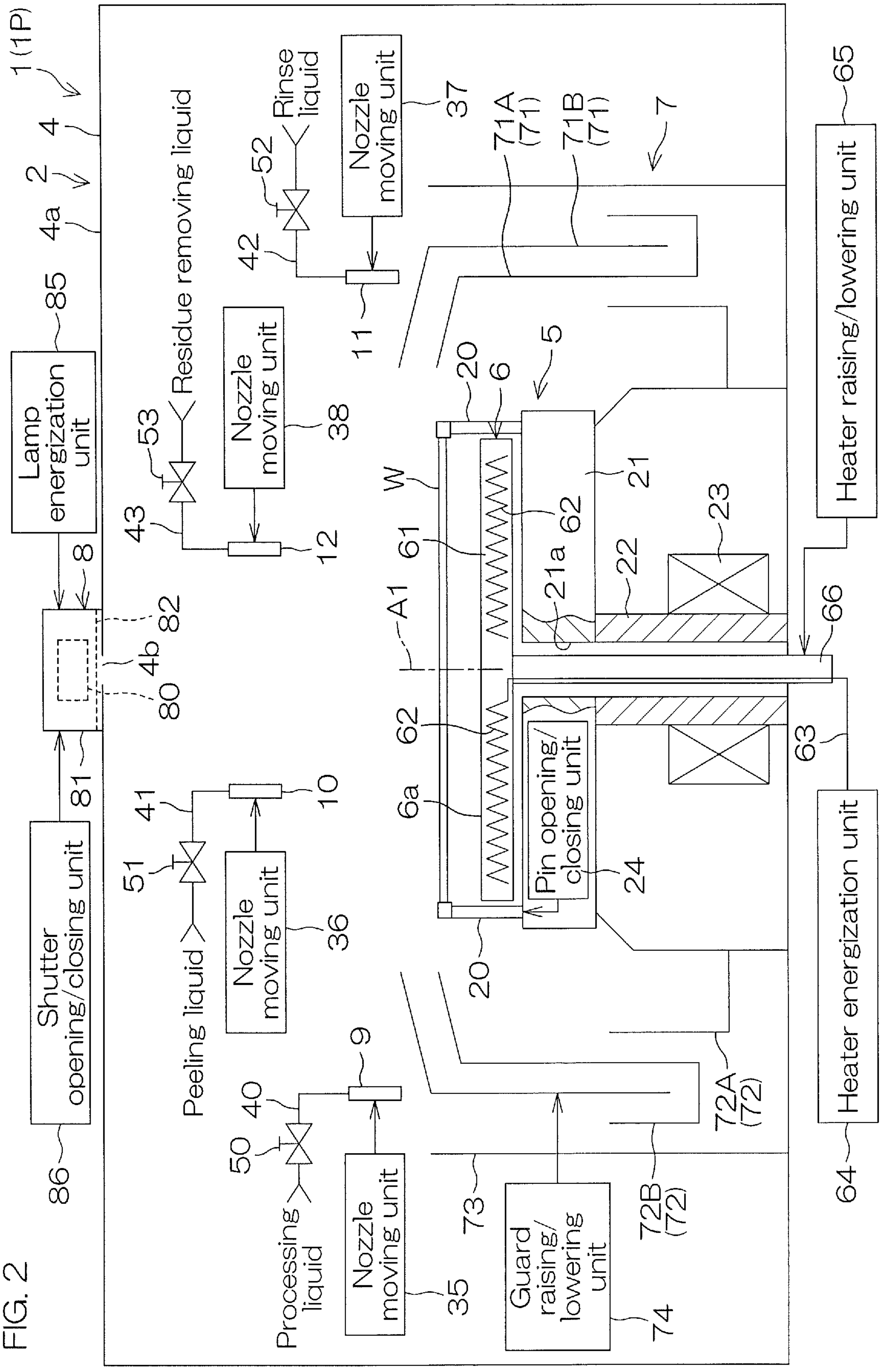
FIG. 2 is a schematic partial cross-sectional view which shows a general arrangement of a processing unit included in the substrate processing apparatus.

FIG. 2 is a schematic view for describing an arrangement example of the processing unit 2. The processing unit 2 further includes a spin chuck 5, a heater unit 6, a light irradiation unit 8, a first moving nozzle 9, a second moving nozzle 10, a third moving nozzle 11 and a fourth moving nozzle 12.

The spin chuck 5 is an example of a substrate holding/rotating unit which rotates the substrate W around a rotational axis A1 (vertical axis), while holding the substrate W horizontally. The rotational axis A1 is a vertical line which passes through a central portion of the substrate W. The spin chuck 5 includes a plurality of chuck pins 20, a spin base 21, a rotating shaft 22 and a spin motor 23.

The spin base 21 has a disk shape along a horizontal direction. On an upper surface of the spin base 21, the plurality of chuck pins 20 that grip a peripheral edge of the substrate W are disposed at intervals in a circumferential direction of the spin base 21.

The plurality of chuck pins 20 are opened and closed by a pin opening/closing unit 24. The plurality of chuck pins 20 are kept in a closed state by the pin opening/closing unit 24, thereby holding (clamping) the substrate W horizontally. The plurality of chuck pins 20 are kept in an open state by the pin opening/closing unit 24, thereby releasing the substrate W. The plurality of chuck pins 20 support the substrate W from below in the open state.

The spin base 21 and the plurality of chuck pins constitute a substrate holding unit to hold the substrate W horizontally. The substrate holding unit is also referred to as a substrate holder.

The rotating shaft 22 extends in a vertical direction along the rotational axis A1. An upper end portion of the rotating shaft 22 is coupled to a lower surface center of the spin base 21. The spin motor 23 applies a rotational force to the rotating shaft 22. The spin base 21 is rotated by the rotating shaft 22 being rotated by the spin motor 23. The substrate W is, thereby, rotated around the rotational axis A1. The spin motor 23 is an example of a substrate rotating unit that rotates the substrate W around the rotational axis A1.

The heater unit 6 is an example of a substrate heating unit which heats an entirety of the substrate W. The heater unit 6 has a form of a disk-shaped hot plate. The heater unit 6 is disposed between the upper surface of the spin base 21 and a lower surface of the substrate W. The heater unit 6 has a facing surface 6*a* that faces the lower surface of the substrate W from below.

The heater unit 6 includes a plate main body 61 and a heater 62. The plate main body 61 is slightly smaller than the substrate W in a plan view. An upper surface of the plate main body 61 constitutes a facing surface 6*a*. The heater 62 may be a resistor element built into the plate main body 61. The heater 62 is energized to heat the facing surface 6*a*. The facing surface 6*a* is heated, for example, to 195° C.

The processing unit 2 includes a heater energization unit 64 which supplies electricity to the heater 62 via a power supplying line 63 and a heater raising/lowering unit 65 which relatively raises and lowers the heater unit 6 with respect to the spin base 21. The heater energization unit 64 is, for example, a power supply. The heater raising/lowering unit 65 includes, for example, a ball screw mechanism (not shown) and an electric motor (not shown) which supplies a driving force thereto. The heater raising/lowering unit 65 is also referred to as a heater lifter.

A raising/lowering shaft 66 which extends along the rotational axis A1 in a vertical direction is coupled to a lower surface of the heater unit 6. The raising/lowering shaft 66 penetrates through the hollow rotating shaft 22 and a through hole 21*a* which is formed at a central portion of the spin base 21. The power supplying line 63 is passed through an interior of the raising/lowering shaft 66.

The heater raising/lowering unit 65 raises and lowers the heater unit 6 via the raising/lowering shaft 66. The heater unit 6 can be positioned at a lower position and an upper position by being raised and lowered by the heater raising/lowering unit 65. The heater raising/lowering unit 65 is capable of disposing the heater unit 6 not only at the lower position and at the upper position but also at any position between the lower position and the upper position.

When raised, the heater unit 6 is able to receive the substrate W from the plurality of chuck pins 20 in the open state. The heater unit 6 is disposed at a position in contact with the lower surface of the substrate W or at a position proximate to the lower surface of the substrate W by the heater raising/lowering unit 65, thereby able to heat the substrate W.

The processing cup 7 includes a plurality of guards 71 that receive a liquid splashing outward from the substrate W held by the spin chuck 5, a plurality of cups 72 that receive a liquid guided downward by the plurality of guards 71, and a circular-cylindrical outer wall member 73 that surrounds the plurality of guards 71 and the plurality of cups 72.

In this preferred embodiment, an example is shown in which two guards 71 (first guard 71A and second guard 71B) and two cups 72 (first cup 72A and second cup 72B) are provided.

The first cup 72A and the second cup 72B each have a form of an annular groove which is opened upward.

The first guard 71A is disposed so as to surround the spin base 21. The second guard 71B is disposed so as to surround the spin base 21 further outside than the first guard 71A.

The first guard 71A and the second guard 71B each have a substantially circular cylindrical shape. An upper end portion of each of the guards 71 is inclined inward so as to move toward the spin base 21.

The first cup 72A receives a liquid guided downward by the first guard 71A. The second cup 72B is formed integrally with the first guard 71A and receives a liquid guided downward by the second guard 71B.

The processing unit 2 includes a guard raising/lowering unit 74 which raises and lowers the first guard 71A and the second guard 71B independently in a vertical direction. The guard raising/lowering unit 74 raises and lowers the first guard 71A between the lower position and the upper position. The guard raising/lowering unit 74 raises and lowers the second guard 71B between the lower position and the upper position.

When the first guard 71A and the second guard 71B are both positioned at the upper position, a liquid splashing from the substrate W is received by the first guard 71A. When the first guard 71A is positioned at the lower position and the second guard 71B is positioned at the upper position, a liquid splashing from the substrate W is received by the second guard 71B. When the first guard 71A and the second guard 71B are both positioned at the lower position, the transfer robot CR is able to gain access to the spin chuck 5 so as to carry in and carry out the substrate W.

The guard raising/lowering unit 74 includes, for example, a first ball screw mechanism (not shown) that is coupled to the first guard 71A, a first motor (not shown) that applies a driving force to the first ball screw mechanism, a second ball screw mechanism (not shown) that is coupled to the second guard 71B, and a second motor (not shown) that applies a driving force to the second ball screw mechanism. The guard raising/lowering unit 74 is also referred to as a guard lifter.

The light irradiation unit 8 is, for example, attached to an upper wall 4*a* of the chamber 4. An upper surface of the substrate W is irradiated with light by the light irradiation unit 8 via a slit 4*b* provided in the upper wall 4*a* of the chamber 4.

The light irradiation unit 8 includes a lamp 80 which emits light, a lamp housing 81 which houses the lamp 80 and a shutter 82 which blocks light emitted from the lamp 80. The lamp 80 includes, for example, a filament and a quartz tube that houses the filament. Examples of the light emitted by the lamp 80 include infrared rays, ultraviolet rays, visible light, etc.

The processing unit 2 includes a lamp energization unit 85 which is arranged so as to energize the lamp 80 or stop energizing the lamp 80 and a shutter opening/closing unit 86 which opens and closes the shutter 82. The lamp 80 is energized to emit light. The shutter 82 moves between a closed position (blocking position) which blocks light emitted by the lamp 80 and an open position (irradiation position) which allows light from the lamp 80 to pass through.

The lamp energization unit 85 is, for example, a power source and the shutter opening/closing unit 86 is, for example, a motor.

The first moving nozzle 9 is an example of a processing liquid nozzle (processing liquid supplying unit) that supplies (discharges) the processing liquid to the upper surface of the substrate W held by the spin chuck 5.

The first moving nozzle 9 is moved by a first nozzle moving unit 35 in a horizontal direction and in a vertical direction. The first moving nozzle 9 can move between a center position and a home position (retreat position) in the horizontal direction. When positioned at the center position, the first moving nozzle 9 faces a central region of the upper surface of the substrate W.

When positioned at the home position, the first moving nozzle 9 does not face the upper surface of the substrate W and is positioned outside the processing cup 7 in a plan view. By moving in the vertical direction, the first moving nozzle 9 is able to move close to the upper surface of the substrate W and retreat upward from the upper surface of the substrate W.

The first nozzle moving unit 35 may include an arm (not shown) which is coupled to the first moving nozzle 9 and extends horizontally, a pivoting shaft (not shown) which is coupled to the arm and extends along the vertical direction, and a pivoting shaft driving unit (not shown) which raises, lowers, and pivots the pivoting shaft.

The pivoting shaft driving unit swings the arm by pivoting the pivoting shaft around a vertical pivoting axis. Further, the pivoting shaft driving unit raises and lowers the pivoting shaft along the vertical direction and thereby raises and lowers the arm. In response to the arm which is swung, raised, or lowered, the first moving nozzle 9 moves in the horizontal direction and in the vertical direction. The rotating shaft driving unit includes a motor which pivots the pivoting shaft and a ball screw mechanism which raises and lowers the pivoting shaft.

The first moving nozzle 9 is connected to a processing liquid piping 40 which guides the processing liquid into the first moving nozzle 9. When a processing liquid valve 50 interposed in the processing liquid piping is opened, the processing liquid is discharged continuously downward from the first moving nozzle 9. When the first moving nozzle 9 is positioned at a central position and the processing liquid valve 50 is opened, the processing liquid is supplied to the central region of the upper surface of the substrate W.

The processing liquid contains a solute and a solvent. The processing liquid is solidified or cured by at least partial volatilization (evaporation) of the solvent contained in the processing liquid. The processing liquid is solidified or cured on the substrate W to form a solid-state processing film. When the processing liquid is solidified or cured, the processing film captures therein objects to be removed such as particles present on the substrate W and holds them. The objects to be removed are, for example, foreign matter adhering to the front surface of the substrate W.

Here, "solidified" means that a solute is hardened by the force, etc., acting between molecules and atoms, for example, along with volatilization of a solvent. "Cured" means that a solute is hardened by chemical changes, for example, polymerization, cross linkage, etc. Consequently, "solidified or cured" means that a solute is "hardened" due to various factors.

However, the processing film is not necessarily constituted of a solid component alone. If the processing film has no fluidity and has a certain shape as a whole, it may be constituted of both a solid component and a liquid component. That is, the solvent is not necessarily removed from the processing liquid completely, and the solvent may remain in the processing film.

The processing liquid contains as the solute a first reaction component (reaction component) and a low solubility component. The first reaction component is a component which exhibits an etching function by an external stimulation. The external stimulation is, for example, heating, light irradiation, and supply of a liquid such as water.

The above-described external stimulation causes a decomposition reaction which decomposes the first reaction component. Thereby, an etching component and a second reaction component are formed. The etching component is a component capable of etching a surface layer of the substrate W.

The second reaction component is decomposed by light irradiation. In other words, light irradiation causes a decomposition reaction which decomposes the second reaction component. The second reaction component is decomposed to form a first high solubility component. The first high solubility component is a component that is relatively high in solubility with respect to the peeling liquid which is to be described later (higher than other components in the processing film). The etching component and the first high solubility component are, for example, an organic acid. The first high solubility component does not have an acidity that effects etching of the surface layer of the substrate W and may have such a polarity that it is dissolved by the peeling liquid to be described later.

As the first reaction component, for example, a carboxylic acid ester or a sulfonic acid ester may be used. Examples of the carboxylic acid ester include polyethyleneterephthalate, polylactic acid, polybutyleneterephthalate, polyethylene naphthalate, etc.

The carboxylic acid ester which can be used as the first reaction component may not necessarily be a polymer. Examples of the carboxylic acid ester which is not a polymer include diethoxyethyl succinate, adipic acid di-2-ethylhexyl, sebacic acid di-2-ethylhexyl, 4,5-epoxycyclohexane-1,2-dicarboxylic acid di-2-ethylhexyl, 4-cyclohexene-1,2-dicarboxylic acid bis(2-ethylhexyl), phthalic acid bis(2-ethylhexyl), diisoamyl phthalate, naphthalenedicarboxylic acid diethylhexyl, etc.

The first reaction component may contain one type or plural types of carboxylic acid esters that are selected from these carboxylic acid esters.

Examples of the sulfonic acid ester include N-(tert-butoxycarbonyl)-p-toluene sulfonamide, isophthalic acid dimethyl-5-sulfonic acid sodium, 1-methoxycarbonyl pentadecane sulfonic acid, tert-butyl4-[3-(methoxycarbonyl) phenyl sulfonamide] piperidine-1-carboxylate, 2-t-butoxycarbonyl methoxyphenyl diphenyl sulfonium nonafluoro-n-butane sulfonate, etc.

The first reaction component may contain one type or plural types of sulfonic acid esters that are selected from these sulfonic acid esters.

Figure 3A:
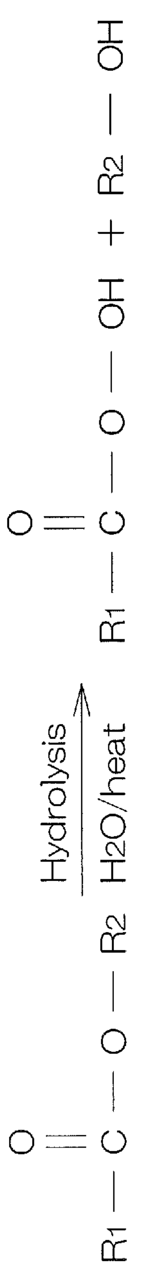
FIG. 3A is a schematic view for describing an example of a decomposition reaction of a first reaction component in a processing film by etching component forming processing.

As shown in FIG. 3A, where the first reaction component is a carboxylic acid ester, the first reaction component undergoes hydrolysis under heating conditions (for example, not less than 50° C. and not more than 80° C.) in the presence of water. A carboxylic acid produced by hydrolysis is the etching component, and an alcohol produced together with the carboxylic acid upon hydrolysis is the second reaction component.

Figure 3B:
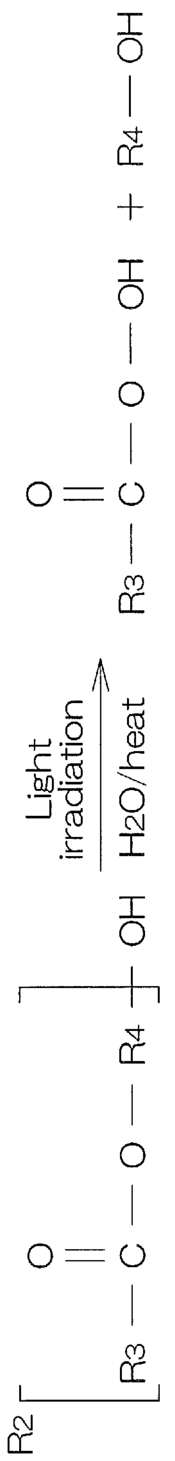
FIG. 3B is a schematic view for describing an example of a decomposition reaction of a second reaction component in the processing film by high solubility component forming processing.

In FIG. 3A, $R_1$ is, for example, a hydrocarbon group, $R_2$ is, for example, a functional group which partially has an ester group. As shown in FIG. 3B, $R_2$ is $R_3—CO_2—R_4$. $R_3$ and $R_4$ are, for example, a hydrocarbon group.

$R_1$ may be a functional group in which hydrogen atoms in a hydrocarbon group are replaced by fluorine atoms or chlorine atoms. Where $R_1$ is a functional group in which hydrogen atoms in a hydrocarbon group are replaced by fluorine atoms or chlorine atoms, the etching component is higher in acidity as compared with a case where $R_1$ is a functional group in which fluorine atoms or chlorine atoms are not contained in a hydrocarbon group. Therefore, it is possible to quickly etch the surface layer portion of the substrate W.

Where the first reaction component is a carboxylic acid ester, as shown in FIG. 3B, light is emitted under heating conditions (for example, not less than 50° C. and not more than 80° C.) in the presence of water to hydrolyze the second reaction component. A carboxylic acid which is produced by hydrolysis of the second reaction component is the first high solubility component. In FIG. 3B, $R_3$ and $R_4$ are a hydrocarbon group, etc. The carboxylic acid which functions as the first high solubility component does not have an acidity that effects etching of the surface layer of the substrate W and may have such a polarity that it is dissolved by the peeling liquid to be described later.

Figure 4A:
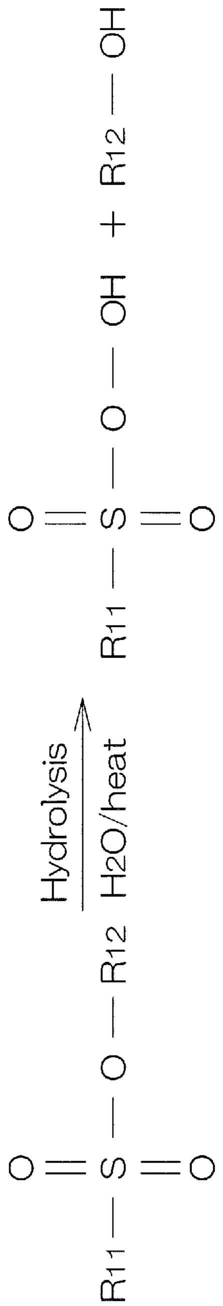
FIG. 4A is a schematic view for describing another example of the decomposition reaction of the first reaction component in the processing film by the etching component forming processing.
Figure 4B:
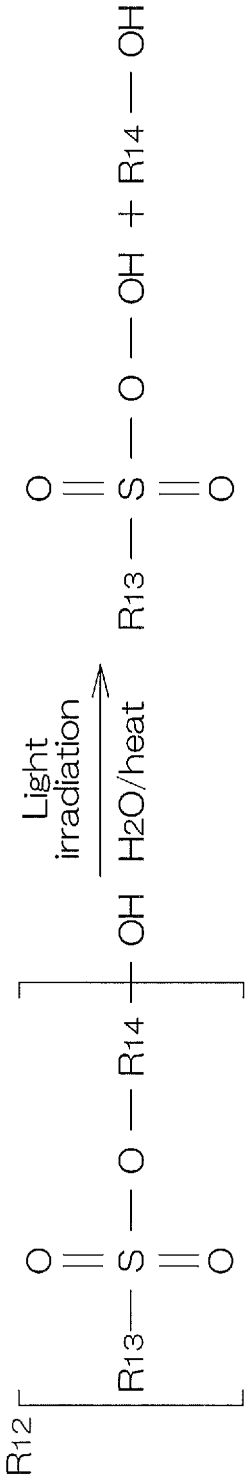
FIG. 4B is a schematic view for describing still another example of the decomposition reaction of the second reaction component in the processing film by the high solubility component forming processing.

As shown in FIG. 4A, where the first reaction component is a sulfonic acid ester, the first reaction component undergoes hydrolysis under heating conditions (for example, not less than 50° C. and not more than 80° C.) in the presence of water. A sulfonic acid which is produced by hydrolysis of the first reaction component is the etching component, and an alcohol which is produced together with the sulfonic acid upon hydrolysis is the second reaction component. In FIG. 4A, $R_{11}$ is, for example, a hydrocarbon group, $R_{12}$ is, for example, a functional group which partially has an ester group. $R_{12}$ is, as shown in FIG. 4B, $R_{13}—SO_3—R_{14}$. $R_{13}$ and $R_{14}$ are, for example, a hydrocarbon group.

$R_{11}$ may be a functional group in which hydrogen atoms in hydrocarbon are replaced by fluorine atoms or chlorine atoms. Where $R_{11}$ is a functional group in which hydrogen atoms in a hydrocarbon group are replaced by fluorine atoms or chlorine atoms, the etching component is higher in acidity as compared with a case where $R_{11}$ is a functional group in which fluorine atoms or chlorine atoms are not contained in the hydrocarbon group. Therefore, it is possible to quickly etch the surface layer portion of the substrate W.

Where the first reaction component is a sulfonic acid ester, as shown in FIG. 4B, light is emitted under heating conditions (for example, not less than 50° C. and not more than 80° C.) in the presence of water to hydrolyze the second reaction component. A sulfonic acid which is produced by hydrolysis of the second reaction component is the first high solubility component. In FIG. 4B, $R_{13}$ and $R_{14}$ are, for example, a hydrocarbon group. A sulfonic acid which functions as the first high solubility component does not have an acidity that effects etching of the surface layer of the substrate W and may have such a polarity that it is dissolved by the peeling liquid to be described later.

Where the first reaction component is a carboxylic acid, the etching component is a molecule having a carboxyl group as a functional group at an end. Where the first reaction component is a sulfonic acid, the etching component is a molecule having a sulfo group as a functional group at an end. Where the first reaction component is a carboxylic acid, the second reaction component has a carboxylic acid ester bond inside the molecule and is a molecule having a hydroxy group (hydroxyl group) at an end. Where the first reaction component is a sulfonic acid, the second reaction component has a sulfonic acid ester bond inside the molecule and is a molecule having a hydroxy group (hydroxyl group) at an end.

As the low solubility component, a substance which is lower in solubility with respect to the peeling liquid to be described later than the first high solubility component may be used. The low solubility component is kept in a solid state even after the etching component forming processing is performed. The low solubility component is, for example, novolak. The low solubility component is an example of a first low solubility component and also an example of a solid-state keeping component.

The solvent which is contained in the processing liquid may be any liquid which dissolves the low solubility component and the first reaction component. The solvent which is contained in the processing liquid is preferably a liquid having compatibility (miscibility) with the peeling liquid. Compatibility is a property that two types of liquids are dissolved and mixed with each other. Examples of the solvent which is contained in the processing liquid include alcohols such as isopropanol (IPA).

The processing film is constituted mainly of the low solubility component (low solubility component solid) in a solid state and the first reaction component (first reaction component solid) in a solid state.

The solid state may be a state that does not contain any liquid component and is constituted of a solid component alone. The solid state may be a semi-solid state or gel state that contains a liquid component. The solvent may remain in the processing film.

The solvent and the low solubility component which are contained in the processing liquid will be described later in detail.

The second moving nozzle 10 is an example of a peeling liquid nozzle (peeling liquid supplying unit) which supplies (discharges) continuously the peeling liquid such as an ammonia solution to the upper surface of the substrate W held by the spin chuck 5. The peeling liquid is a liquid for peeling the processing film formed on the substrate W from the upper surface of the substrate W.

The second moving nozzle 10 is moved by a second nozzle moving unit 36 in a horizontal direction and in a vertical direction. The second moving nozzle 10 can move between a center position and a home position (retreat position) in the horizontal direction.

When positioned at the center position, the second moving nozzle 10 faces the central region of the upper surface of the substrate W. When positioned at the home position, the second moving nozzle 10 does not face the upper surface of the substrate W and is positioned outside the processing cup 7 in a plan view. By moving in the vertical direction, the second moving nozzle 10 is able to move close to the upper surface of the substrate W or retreat upward from the upper surface of the substrate W.

The second nozzle moving unit 36 has the same arrangement as the first nozzle moving unit 35. That is, the second nozzle moving unit 36 may include an arm (not shown) which is coupled to the second moving nozzle 10 and extends horizontally, a pivoting shaft (not shown) which is coupled to the arm and extends along the vertical direction, and a pivoting shaft driving unit (not shown) which raises, lowers, and pivots the pivoting shaft.

The second moving nozzle 10 is connected to a peeling liquid piping 41 to guide the peeling liquid to the second moving nozzle 10. When a peeling liquid valve 51 interposed in the peeling liquid piping 41 is opened, the peeling liquid is continuously discharged downward from a discharge port of the second moving nozzle 10. When the second moving nozzle 10 is positioned at the central position and the peeling liquid valve 51 is opened, the peeling liquid is supplied to the central region of the upper surface of the substrate W.

The peeling liquid discharged from the second moving nozzle 10 is a liquid which dissolves the first high solubility component more easily than the low solubility component. The peeling liquid discharged from the second moving nozzle 10 is, for example, an alkaline aqueous solution (alkaline liquid) such as an ammonia solution. Specific examples of the alkaline aqueous solution include an ammonia solution, an SC1 solution (ammonia-hydrogen peroxide mixture), a TMAH (tetramethylammonium hydroxide) aqueous solution, a choline aqueous solution, and any combination of them. The peeling liquid is not limited to an alkaline liquid and may be pure water (preferably, DIW) or a neutral or acidic aqueous solution (non-alkaline aqueous solution).

The third moving nozzle 11 is an example of a rinse liquid nozzle (rinse liquid supplying unit) which supplies (discharges) continuously the rinse liquid such as pure water to the upper surface of the substrate W which is held by the spin chuck 5. The rinse liquid is a liquid which washes away a liquid adhering to the front surface of the substrate W.

The third moving nozzle 11 is moved in the horizontal direction and in the vertical direction by a third nozzle moving unit 37. The third moving nozzle 11 can move between a center position and a home position (retreat position) in the horizontal direction.

When positioned at the center position, the third moving nozzle 11 faces the central region of the upper surface of the substrate W. When positioned at the home position, the third moving nozzle 11 does not face the upper surface of the substrate W and is positioned outside the processing cup 7 in a plan view. By moving in the vertical direction, the third moving nozzle 11 is able to move close to the upper surface of the substrate W and retreat upward from the upper surface of the substrate W.

The third nozzle moving unit 37 has the same arrangement as the first nozzle moving unit 35. That is, the third nozzle moving unit 37 may include an arm (not shown) which is coupled to the third moving nozzle 11 and extends horizontally, a pivoting shaft (not shown) which is coupled to the arm and extends along the vertical direction, and a pivoting shaft driving unit (not shown) which raises, lowers, and pivots the pivoting shaft.

The third moving nozzle 11 is connected to a rinse liquid piping 42 for guiding the rinse liquid to the third moving nozzle 11. When a rinse liquid valve 52 interposed in the rinse liquid piping 42 is opened, the rinse liquid is continuously discharged downward from a discharge port of the third moving nozzle 11. When the third moving nozzle 11 is positioned at the central position and the rinse liquid valve 52 is opened, the rinse liquid is supplied to the central region of the upper surface of the substrate W.

Examples of the rinse liquid include pure water such as DIW, carbonated water, electrolyzed ion water, a hydrochloric acid aqueous solution of dilute concentration (of, for example, approximately 1 ppm to 100 ppm), an ammonia solution of dilute concentration (of, for example, approximately 1 ppm to 100 ppm), reduced water (hydrogen water), etc. A liquid which can be used as the rinse liquid contains water. Therefore, the rinse liquid can be used as an external stimulation to effect an etching function in the first reaction component. Specifically, the rinse liquid can be used as a decomposition accelerating liquid that is used for decomposition (hydrolysis) of the first reaction component. The third moving nozzle 11 is also a decomposition accelerating liquid nozzle (decomposition accelerating liquid supplying unit).

The fourth moving nozzle 12 is an example of a residue removing liquid nozzle (residue removing liquid supplying unit) which supplies (discharges) continuously the residue removing liquid such as an organic solvent to the upper surface of the substrate W which is held by the spin chuck 5.

The fourth moving nozzle 12 is moved in the horizontal direction and in the vertical direction by a fourth nozzle moving unit 38. The fourth moving nozzle 12 can move between a center position and a home position (retreat position) in the horizontal direction.

When positioned at the center position, the fourth moving nozzle 12 faces the central region of the upper surface of the substrate W. When positioned at the home position, the fourth moving nozzle 12 does not face the upper surface of the substrate W and is positioned outside the processing cup 7 in a plan view. By moving in the vertical direction, the fourth moving nozzle 12 is able to move close to the upper surface of the substrate W and retreat upward from the upper surface of the substrate W.

The fourth nozzle moving unit 38 has the same arrangement as the first nozzle moving unit 35. That is, the fourth nozzle moving unit 38 may include an arm (not shown) which is coupled to the fourth moving nozzle 12 and extends horizontally, a pivoting shaft (not shown) which is coupled to the arm and extends along the vertical direction, and a pivoting shaft driving unit (not shown) which raises, lowers, and pivots the pivoting shaft.

The fourth moving nozzle 12 is connected to a residue removing liquid piping 43 for guiding the residue removing liquid to the fourth moving nozzle 12. When a residue removing liquid valve 53 interposed in the residue removing liquid piping 43 is opened, the residue removing liquid is continuously discharged downward from a discharge port of the fourth moving nozzle 12. When the fourth moving nozzle 12 is positioned at the central position and the residue removing liquid valve 53 is opened, the residue removing liquid is supplied to the central region of the upper surface of the substrate W.

The residue removing liquid is a liquid for washing away residue of the processing film which slightly remains on the substrate W after the peeling liquid has been supplied to the substrate W and for removing them from the upper surface of the substrate W. Therefore, the residue removing liquid preferably has compatibility with the peeling liquid. The residue removing liquid dissolves and removes the residue of the processing film which remains on the upper surface of the substrate W after peeling and removal from the upper surface of the substrate W by the peeling liquid. As the residue removing liquid, for example, an organic solvent may be used. The residue removing liquid is also referred to as a residue dissolving liquid.

The residue removing liquid is preferably a low surface tension liquid which is lower in surface tension than the rinse liquid. In the substrate processing to be described later, the upper surface of the substrate W is not dried by spinning off the rinse liquid on the substrate W, but after the rinse liquid on the substrate W has been replaced by the residue removing liquid, the residue removing liquid on the substrate W is spun off to dry the upper surface of the substrate W. Therefore, the residue removing liquid which is a low surface tension liquid is able to lower a surface tension which acts on the upper surface of the substrate W when the upper surface of the substrate W is dried.

Examples of the organic solvent which functions as the residue removing liquid and the low surface tension liquid include a liquid which contains at least one of IPA, HFE (hydrofluoroether), methanol, ethanol, acetone, PGEE (propylene glycol monoethyl ether) and Trans-1,2-dichloroethylene.

The organic solvent which functions as the residue removing liquid and the low surface tension liquid does not have to be constituted of a single component alone but may be a liquid that is mixed with other components. For example, it may be a mixture solution of IPA and DIW or a mixture solution of IPA and HFE.

Figure 5:
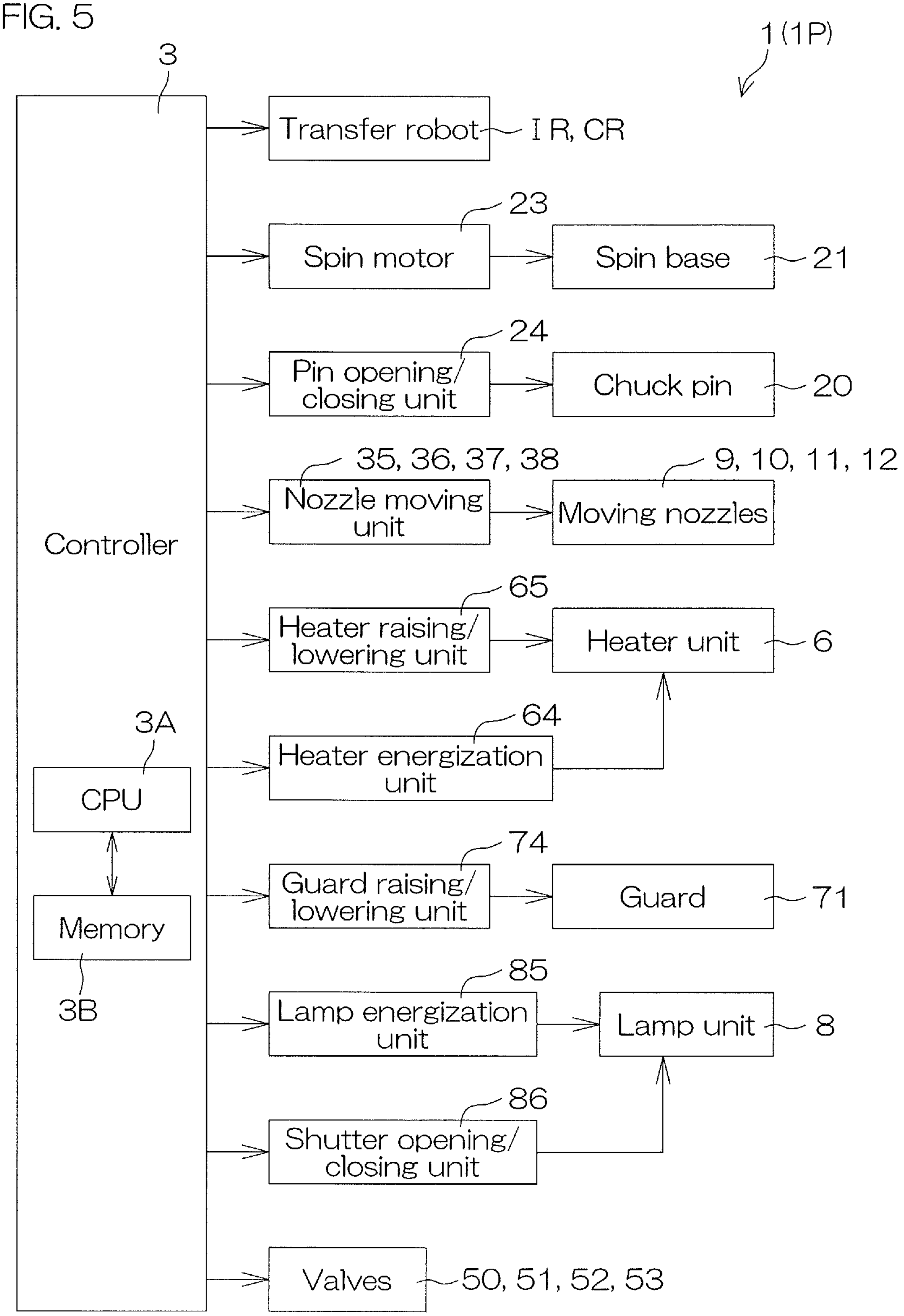
FIG. 5 is a block diagram which shows an electrical configuration of a main portion of the substrate processing apparatus.

FIG. 5 is a block diagram which shows an electrical configuration of the main portion of the substrate processing apparatus 1. The controller 3 is provided with a microcomputer and controls control objects installed in the substrate processing apparatus 1 according to a predetermined control program.

Specifically, the controller 3 includes a processor (CPU) 3A and a memory 3B in which control programs are stored. The controller 3 is arranged so as to execute various types of control for substrate processing in accordance with execution of the control programs by the processor 3A.

The controller 3 is programmed so as to control, in particular, the transfer robots IR, CR, the spin motor 23, the pin opening/closing unit 24, the first nozzle moving unit 35, the second nozzle moving unit 36, the third nozzle moving unit 37, the fourth nozzle moving unit 38, the heater energization unit 64, the heater raising/lowering unit 65, the guard raising/lowering unit 74, the lamp energization unit 85, the shutter opening/closing unit 86, the processing liquid valve 50, the peeling liquid valve 51, the rinse liquid valve 52 and the residue removing liquid valve 53. The valves are controlled by the controller 3 so as to control whether a processing fluid from a corresponding nozzle is discharged or not and at which flow rate of the processing fluid from the corresponding nozzle is discharged.

Figure 6:
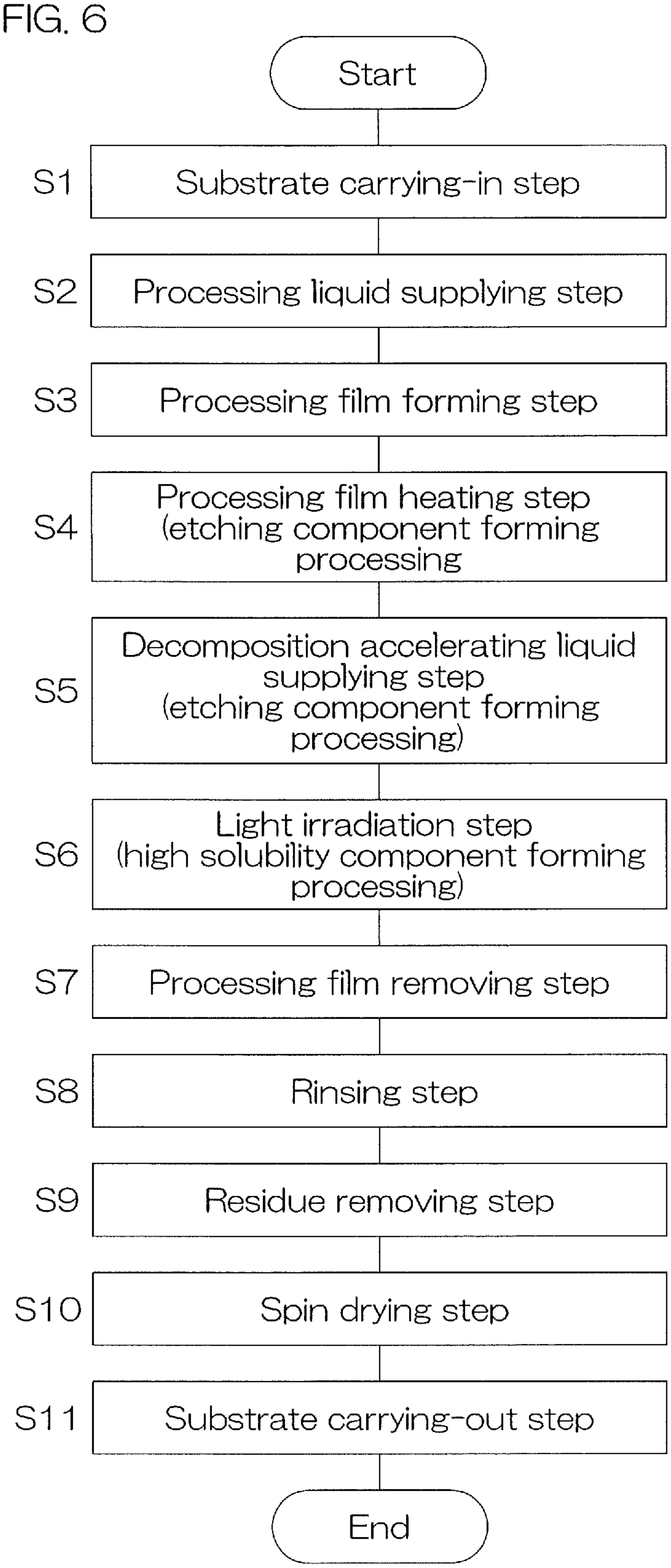
FIG. 6 is a flowchart for describing an example of substrate processing by the substrate processing apparatus.

FIG. 6 is a flowchart for describing a first example of the substrate processing by the substrate processing apparatus 1. FIG. 6 mainly shows the processing which is realized by execution of programs by the controller 3. FIG. 7A to FIG. 7I are each a schematic view for describing conditions of each step of the substrate processing.

In the substrate processing by the substrate processing apparatus 1, for example, as shown in FIG. 6, the substrate carrying-in step (Step S1), the processing liquid supplying step (Step S2), the processing film forming step (Step S3), the processing film heating step (Step S4), the decomposition accelerating liquid supplying step (Step S5), the light irradiation step (Step S6), the processing film removing step (Step S7), the rinsing step (Step S8), the residue removing step (Step S9), the spin drying step (Step S10), and the substrate carrying-out step (Step S11) are executed in this order.

Hereinafter, FIG. 2 and FIG. 6 are mainly referred to. FIG. 7A to FIG. 7I are referred to, whenever necessary.

First, a substrate W which is not processed is carried in the processing unit 2 from the carrier C by the transfer robots IR, CR (refer to FIG. 1) and transferred to the spin chuck 5 (Step S1). Thereby, the substrate W is horizontally held by the spin chuck 5 (substrate holding step).

When the substrate W is carried in, the heater unit 6 is disposed at a non-heating position at which no heating is applied to the substrate W in a state that the heater 62 is energized. The non-heating position is, for example, a lower position. The non-heating position may be a position that is isolated from the substrate W to such an extent that a temperature of the substrate W will not rise. When the substrate W is carried in, the light irradiation unit 8 is in a state that the lamp is energized, and the shutter 82 is disposed at the closed position.

The substrate W is held continuously by the spin chuck 5 until the spin drying step (Step S10) ends. The guard raising/lowering unit 74 adjusts a height position of the first guard 71A and that of the second guard 71B so that at least one of the guards 71 is positioned at the upper position from the start of the substrate holding step to the end of the spin drying step (Step S10). In a state that the substrate W is held by the spin chuck 5, the spin motor 23 rotates the spin base 21. Thereby, rotation of the substrate W that is held horizontally is started (substrate rotating step).

Next, after the transfer robot CR is retreated to the outside of the processing unit 2, the processing liquid supplying step (Step S2) is executed which supplies the processing liquid to the upper surface of the substrate W. Specifically, the first nozzle moving unit 35 moves the first moving nozzle 9 to a processing position. The processing position of the first moving nozzle 9 is, for example, the central position.

Figure 7A:
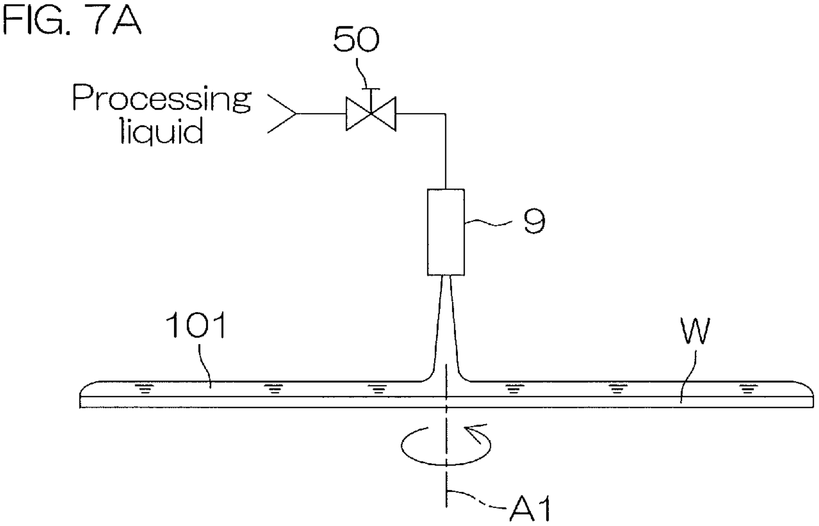
FIG. 7A is a schematic view for describing conditions of a processing liquid supplying step (Step S2) of the substrate processing.

In a state that the first moving nozzle 9 is positioned at the processing position, the processing liquid valve 50 is opened. Thereby, as shown in FIG. 7A, the processing liquid is supplied (discharged) from the first moving nozzle 9 to the central region of the upper surface of the substrate W in a rotating state (processing liquid supplying step, processing liquid discharging step). The processing liquid supplied to the upper surface of the substrate W spreads across the entire upper surface of the substrate W by a centrifugal force and is coated on the entire upper surface of the substrate W. Thereby, a liquid film 101 of the processing liquid (processing liquid film) is formed on the substrate W (processing liquid film forming step).

Supply of the processing liquid from the first moving nozzle 9 continues for a predetermined time of, for example, 2 to 4 seconds. In the processing liquid supplying step, the substrate W is rotated at a predetermined processing liquid rotational speed of, for example, 10 rpm to 1500 rpm.

Figure 7B:
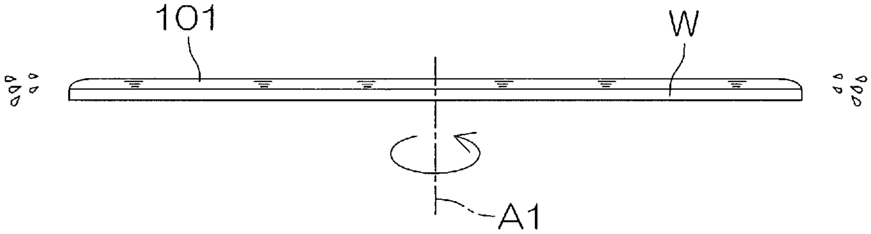
FIG. 7B is a schematic view for describing conditions of a processing film forming step (Step S3) of the substrate processing.
Figure 7C:
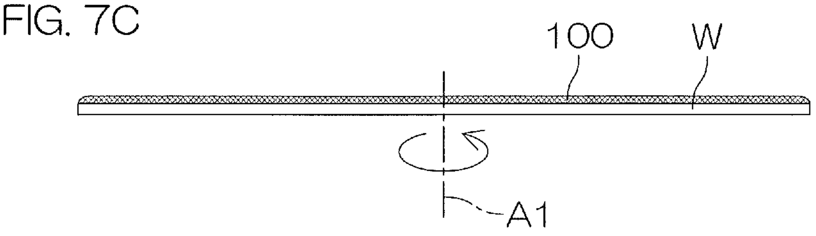
FIG. 7C is a schematic view for describing conditions of the processing film forming step (Step S3) of the substrate processing.

Next, the processing film forming step (Step S3) shown in FIG. 7B and FIG. 7C is executed. In the processing film forming step, the processing liquid on the substrate W is solidified or cured to form a processing film 100 (refer to FIG. 7C) on the upper surface of the substrate W.

In the processing film forming step, the liquid film 101 of the processing liquid on the substrate W is reduced in thickness (processing liquid film thinning step, processing liquid spin-off step). Specifically, the processing liquid valve 50 is closed. Thereby, as shown in FIG. 7B, supply of the processing liquid to the substrate W is stopped. Then, the first moving nozzle 9 is moved to the home position by the first nozzle moving unit 35.

As shown in FIG. 7B, in the processing liquid film thinning step, since the substrate W is rotated in a state that supply of the processing liquid to the upper surface of the substrate W is stopped, the processing liquid is partially removed from the upper surface of the substrate W. Thereby, the liquid film 101 on the substrate W is made appropriate in thickness.

A centrifugal force resulting from rotation of the substrate W not only removes the processing liquid from the upper surface of the substrate W but also acts on a gas in contact with the liquid film 101. Therefore, an airflow that the gas moves from the center side of the substrate W to the peripheral edge side is formed due to actions of the centrifugal force. A solvent in a gaseous state which is in contact with the liquid film 101 is removed by this airflow from an atmosphere in contact with the substrate W. Therefore, as shown in FIG. 7C, evaporation (volatilization) of the solvent from the processing liquid on the substrate W is accelerated to form the processing film 100. In the processing film forming step, the spin motor 23 functions as a processing film forming unit. The spin motor 23 also functions as an evaporation unit (evaporation accelerating unit) for evaporating the solvent in the processing liquid.

In the processing film forming step, the processing liquid may not be removed by a centrifugal force and the processing film 100 may be formed only by evaporation of the solvent. In this case, it is possible to suppress the amount of the processing liquid to be consumed.

In the processing film forming step, the spin motor 23 changes the rotational speed of the substrate W to a predetermined processing film forming speed. The processing film forming speed is, for example, 300 rpm to 1500 rpm. The rotational speed of the substrate W may be kept at a fixed speed in a range of 300 rpm to 1500 rpm. The rotational speed may be changed in a range of 300 rpm to 1500 rpm whenever necessary in the middle of the processing film forming step. The processing film forming step is executed for a predetermined time of, for example, seconds.

Next, the processing film heating step (Step S4) which heats the processing film 100 and the decomposition accelerating liquid supplying step (Step S5) in which the rinse liquid as a decomposition accelerating liquid is supplied to the upper surface of the substrate W are executed.

Figure 7D:
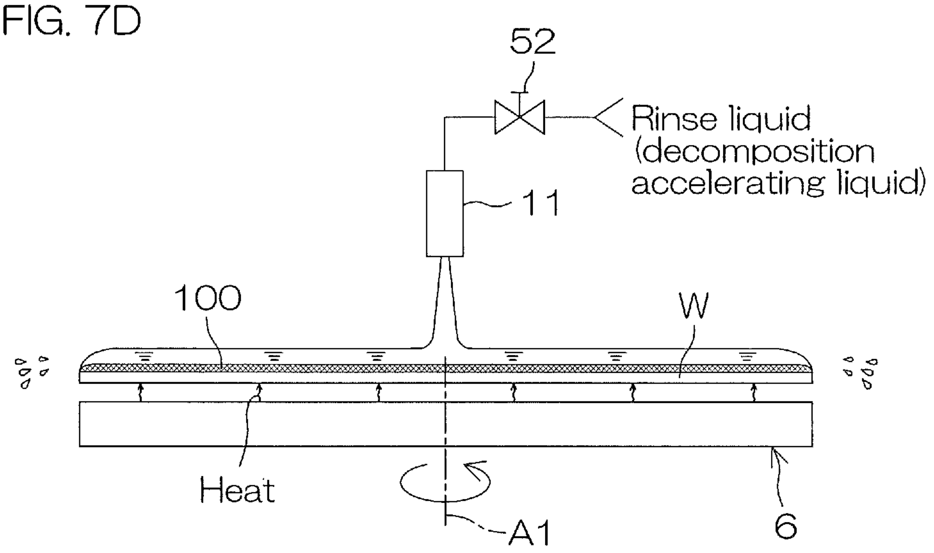
FIG. 7D is a schematic view for describing conditions of a processing film heating step (Step S4) of the substrate processing.

Specifically, the third nozzle moving unit 37 moves the third moving nozzle 11 to the processing position. The processing position of the third moving nozzle 11 is, for example, the central position. Then, in a state that the third moving nozzle 11 is positioned at the processing position, the rinse liquid valve 52 is opened. Thereby, as shown in FIG. 7D, the rinse liquid as the decomposition accelerating liquid is supplied (discharged) from the third moving nozzle 11 to the central region of the upper surface of the substrate W in a rotating state (decomposition accelerating liquid supplying step, decomposition accelerating liquid discharging step). The rinse liquid supplied to the upper surface of the substrate W spreads across the entire upper surface of the substrate W by a centrifugal force. Thereby, the processing film 100 on the substrate W is swollen by the rinse liquid.

Then, the heater unit 6 is disposed at a heating position by the heater raising/lowering unit 65. The heating position is, for example, an isolated heating position in which the substrate W is heated at a position isolated from the lower surface of the substrate W. Thereby, as shown in FIG. 7D, the processing film 100 is heated via the substrate W by the heater unit 6 (processing film heating step). The heater unit 6 is an example of a processing film heating unit.

One of the processing film heating step (Step S4) and the decomposition accelerating liquid supplying step (Step S5) may be started first.

The first reaction component in the processing film 100 is decomposed by heating of the processing film 100 and supply of the rinse liquid to produce the etching component and the second reaction component. Where the first reaction component is a carboxylic acid ester or a sulfonic acid ester, the first reaction component undergoes hydrolysis. Thus, the etching component forming step in which the etching component is formed in the processing film 100 is executed by the etching component forming processing of the processing film 100 (heating and supply of rinse liquid). The substrate W is etched by the etching component which is formed in the processing film 100 (etching step). The heater unit 6 and the third moving nozzle 11 function as an etching component forming processing unit.

Supply of the rinse liquid and heating of the substrate W continue for a predetermined time of, for example, 30 seconds. In the processing film heating step (Step S4) and the decomposition accelerating liquid supplying step (Step S5), the substrate W is rotated at a predetermined etching component forming rotational speed of, for example, 800 rpm.

Next, the light irradiation step (Step S6) is executed in which the processing film 100 on the substrate W is irradiated with light.

Specifically, the rinse liquid valve 52 is closed and the third nozzle moving unit 37 moves the third moving nozzle 11 to the retreat position. The rinse liquid valve 52 is closed to stop supply of the rinse liquid to the upper surface of the substrate W. A liquid film of the rinse liquid on the substrate W is, thereby, removed.

Figure 7E:
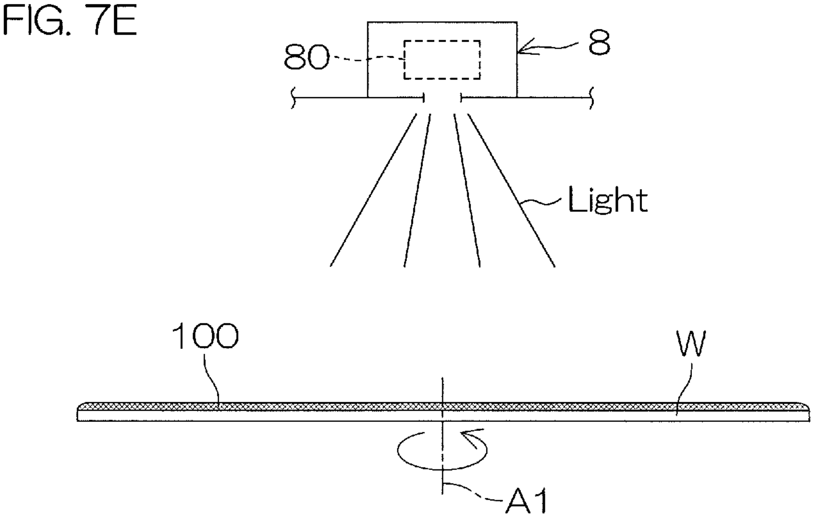
FIG. 7E is a schematic view for describing conditions of a light irradiation step (Step S6) of the substrate processing.

Then, the heater raising/lowering unit 65 moves the heater unit 6 to the non-heating position. Then, the shutter opening/closing unit 86 moves the shutter 82 to the open position. Thereby, as shown in FIG. 7E, the processing film 100 is irradiated with light from the light irradiation unit 8 (light irradiation step).

The processing film 100 is irradiated with light to decompose the second reaction component in the processing film 100, thereby producing the first high solubility component. Where the first reaction component is a carboxylic acid ester or a sulfonic acid ester, the second reaction component undergoes hydrolysis. Thus, the high solubility component forming step is executed in which the processing film 100 is subjected to the high solubility component forming processing (light irradiation) and, thereby, the first high solubility component is formed in the processing film 100. The light irradiation unit 8 functions as a high solubility component forming processing unit.

It is preferable that the rinse liquid supplied in the decomposition accelerating liquid supplying step remains in the processing film 100 and it is also preferable that an amount of heat supplied in the processing film heating step remains in the processing film 100. If so, decomposition of the second reaction component by light irradiation is accelerated. In particular, where the first reaction component is a carboxylic acid ester or a sulfonic acid ester, hydrolysis is accelerated remarkably by the rinse liquid and the amount of heat which remain.

In the light irradiation step (Step S6), the substrate W is rotated at a predetermined high solubility component forming rotational speed of, for example, 800 rpm.

Next, the processing film removing step (Step S7) is executed in which the peeling liquid is supplied to the upper surface of the substrate W to peel and remove the processing film 100 from the upper surface of the substrate W.

Specifically, the shutter opening/closing unit 86 moves the shutter 82 to the closed position, thereby stopping light irradiation onto the processing film 100. Then, the second nozzle moving unit 36 moves the second moving nozzle 10 to the processing position. The processing position of the second moving nozzle 10 is, for example, the central position.

Figure 7F:
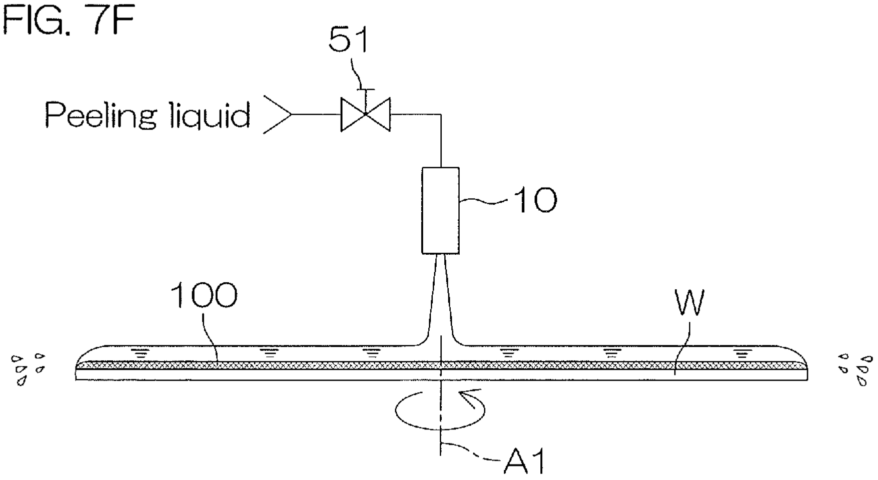
FIG. 7F is a schematic view for describing conditions of a processing film removing step (Step S7) of the substrate processing.
Figure 7G:
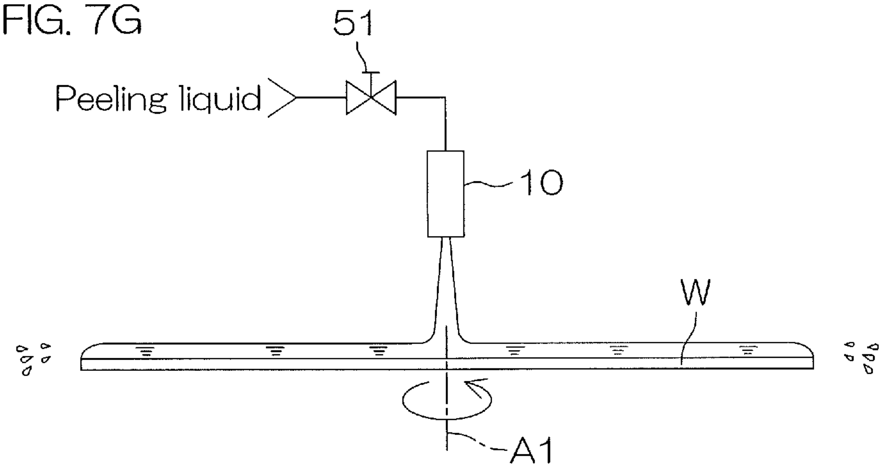
FIG. 7G is a schematic view for describing conditions of the processing film removing step (Step S7) of the substrate processing.

In a state that the second moving nozzle 10 is positioned at the processing position, the peeling liquid valve 51 is opened. Thereby, as shown in FIG. 7F, the peeling liquid is supplied (discharged) from the second moving nozzle 10 to the central region of the upper surface of the substrate W in a rotating state (peeling liquid supplying step, peeling liquid discharging step). The peeling liquid supplied to the upper surface of the substrate W spreads across an entirety of the substrate W by a centrifugal force. The peeling liquid supplied to the upper surface of the substrate W reaches an interface between the upper surface of the substrate W and the processing film 100, while dissolving the first high solubility component in the processing film 100, and enters between the processing film 100 and the upper surface of the substrate W. As shown in FIG. 7G, the peeling liquid is supplied continuously, thereby peeling and removing the processing film 100 from the upper surface of the substrate W (processing film removing step).

In the processing film removing step (Step S7), the substrate W is rotated at a predetermined removing rotational speed of, for example, 800 rpm.

Next, the rinsing step (Step S8) which washes away the peeling liquid from the upper surface of the substrate W is executed. Specifically, the second nozzle moving unit 36 moves the second moving nozzle 10 to the retreat position. Then, the third nozzle moving unit 37 moves the third moving nozzle 11 to the processing position. The processing position of the third moving nozzle 11 is, for example, the central position.

Figure 7H:
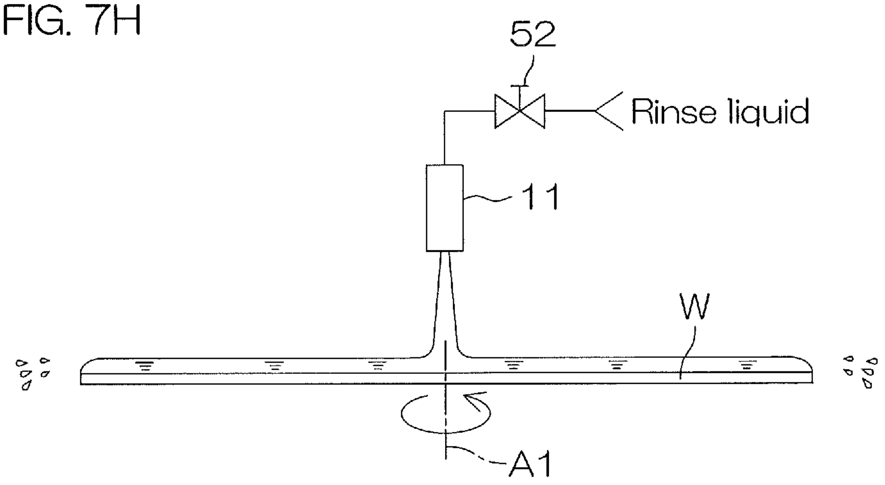
FIG. 7H is a schematic view for describing conditions of a rinsing step (Step S8) of the substrate processing.
Figure 7:
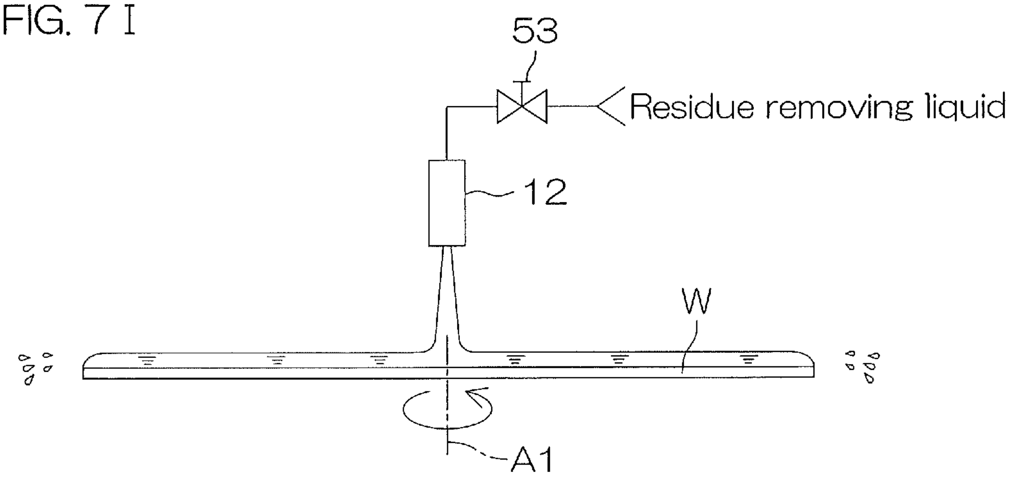
FIG. 7I is a schematic view for describing conditions of a residue removing step (Step S9) of the substrate processing.

Then, in a state that the third moving nozzle 11 is positioned at the processing position, the rinse liquid valve 52 is opened. Thereby, as shown in FIG. 7H, the rinse liquid is supplied (discharged) from the third moving nozzle 11 to the central region of the upper surface of the substrate W in a rotating state (rinse liquid supplying step, rinse liquid discharging step). The rinse liquid supplied to the upper surface of the substrate W spreads across the entire upper surface of the substrate W by a centrifugal force. Thereby, the peeling liquid adhering to the upper surface of the substrate W is expelled to the outside of the substrate W together with the rinse liquid and replaced by the rinse liquid (rinsing step, peeling liquid expelling step).

Supply of the rinse liquid to the upper surface and the lower surface of the substrate W continues for a predetermined time of, for example, 30 seconds. In the rinsing step (Step S8), the substrate W is rotated at a predetermined peeling liquid removing rotational speed of, for example, 800 rpm.

Next, the residue removing step (Step S9) is executed in which the residue removing liquid such as an organic solvent is supplied to remove residue of the processing film 100 from the upper surface of the substrate W.

Specifically, the third nozzle moving unit 37 moves the third moving nozzle 11 to the retreat position. Then, the fourth nozzle moving unit 38 moves the fourth moving nozzle 12 to the processing position. The processing position of the fourth moving nozzle 12 is, for example, the central position.

Then, in a state that the fourth moving nozzle 12 is positioned at the processing position, the residue removing liquid valve 53 is opened. Thereby, as shown in FIG. 7I, the residue removing liquid is supplied (discharged) from the fourth moving nozzle 12 to the central region of the upper surface of the substrate W in a rotating state (residue removing liquid supplying step, residue removing liquid discharging step).

The residue removing liquid supplied from the fourth moving nozzle 12 to the upper surface of the substrate W spreads radially by receiving a centrifugal force and spreads across the entire upper surface of the substrate W. Even after the processing film has been peeled from the substrate W by the peeling liquid and removed from the substrate W, residue of the processing film may remain on the upper surface of the substrate W. The residue removing liquid supplied to the upper surface of the substrate W dissolves the above-described residue of the processing film. The residue removing liquid which dissolves the residue of the processing film is expelled by a centrifugal force from a peripheral edge of the upper surface of the substrate W. Thereby, the residue of the processing film on the substrate W is removed (residue removing step).

In the residue removing liquid supplying step, discharge of the residue removing liquid from the fourth moving nozzle 12 continues for a predetermined time of, for example, 30 seconds. In the residue removing step (Step S9), the substrate W is rotated at a predetermined residue removing rotational speed of, for example, 300 rpm.

Next, the spin drying step (Step S10) in which the substrate W is rotated at a high speed to dry the upper surface of the substrate W is executed. Specifically, the residue removing liquid valve 53 is closed. Thereby, supply of the residue removing liquid to the upper surface of the substrate W is stopped.

Then, the spin motor 23 accelerates the rotation of the substrate W to rotate the substrate W at a high speed. In the spin drying step, the substrate W is rotated at a drying speed of, for example, 1500 rpm. The spin drying step continues for a predetermined time of, for example, 30 seconds.

Thereby, a large centrifugal force is applied to the residue removing liquid on the substrate W, and the residue removing liquid on the substrate W is spun off around the substrate W.

Then, the spin motor 23 stops the rotation of the substrate W. The guard raising/lowering unit 74 moves the first guard 71A and the second guard 71B to the lower position.

The transfer robot CR enters the processing unit 2, lifts up the processed substrate W from the chuck pin 20 of the spin chuck 5 and carries it to the outside of the processing unit 2 (Step S11). The substrate W is transferred from the transfer robot CR to the transfer robot IR and housed in the carrier C by the transfer robot IR.

Next, with reference to FIG. 8A to FIG. 8F, a detailed description will be given of conditions in which the processing film 100 is peeled from the substrate W. FIG. 8A to FIG. 8F are each a schematic view for describing the conditions in which the processing film 100 is peeled from the substrate W.

Figure 8A:
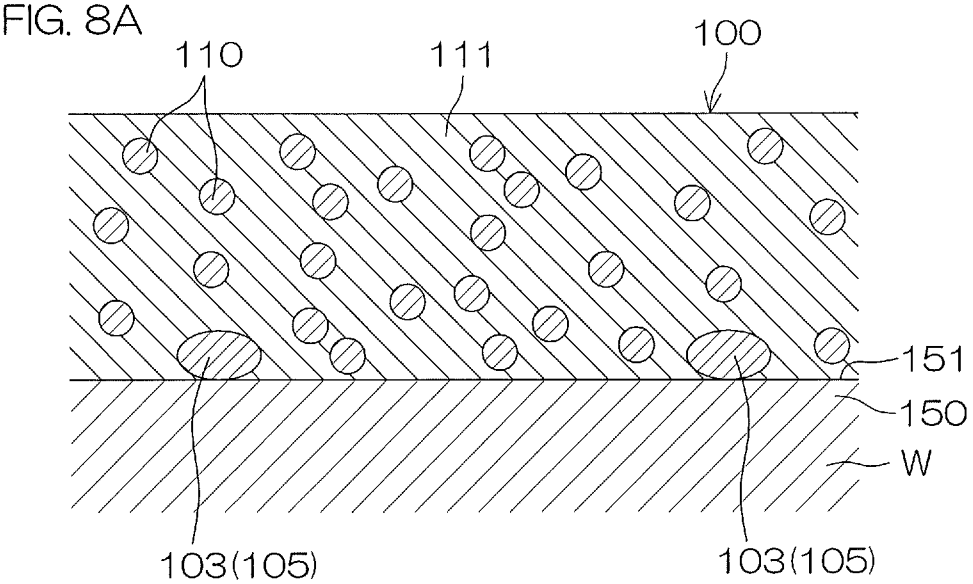
FIG. 8A is a schematic view for describing conditions in which a processing film is removed from a front surface of a substrate.

As shown in FIG. 8A, the processing film 100 formed in the processing film forming step (Step S3) holds particles 103 adhering to the front surface of the substrate W. Before the etching component forming processing is performed, the processing film 100 contains a first reaction component 110 in a solid state and a low solubility component 111 in a solid state. The first reaction component 110 and the low solubility component 111 are solidified or cured by at least partial evaporation of the solvent which is contained in the processing liquid.

Figure 8B:
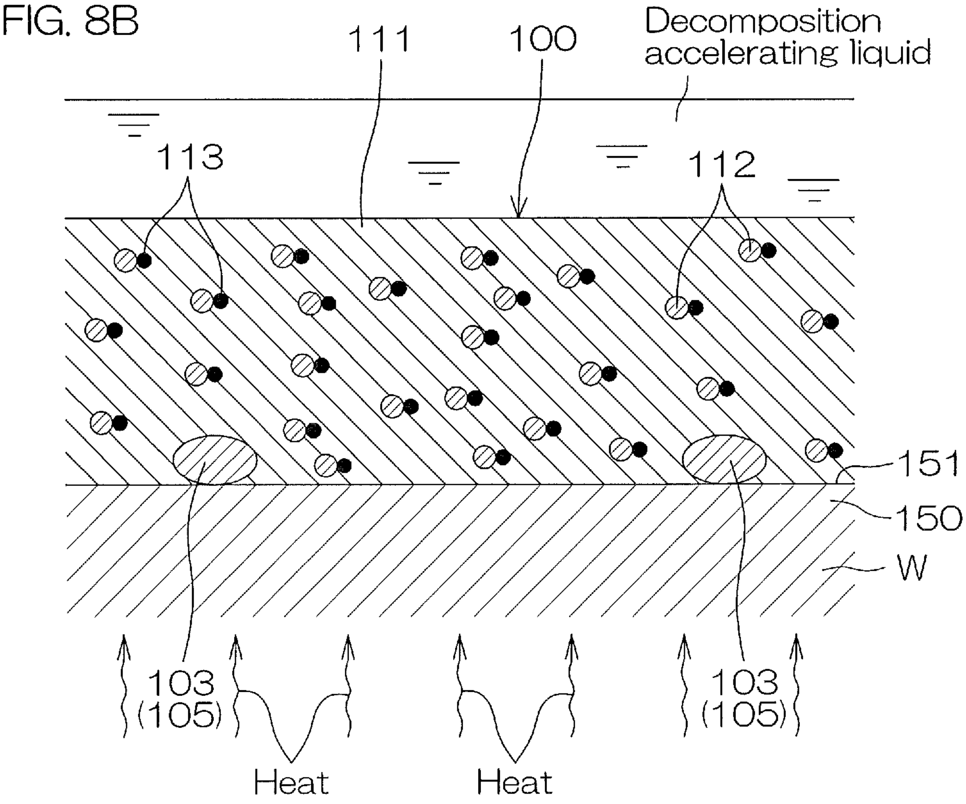
FIG. 8B is a schematic view for describing conditions in which a processing film is removed from a front surface of a substrate.
Figure 8C:
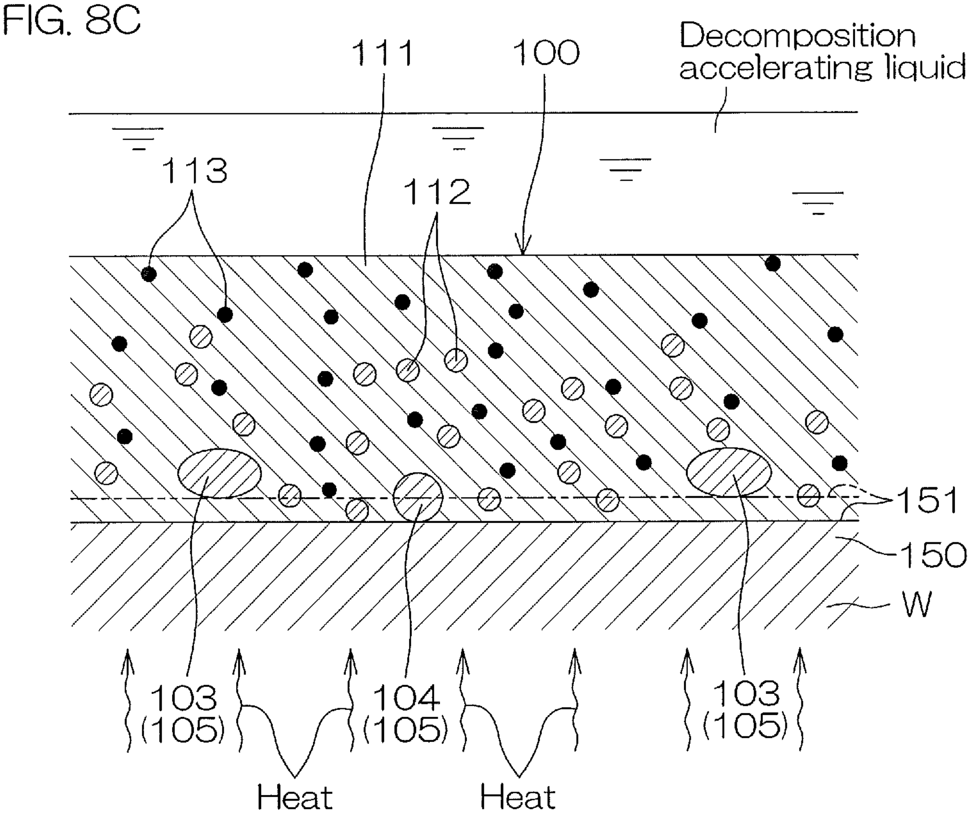
FIG. 8C is a schematic view for describing conditions in which a processing film is removed from a front surface of a substrate.

Next, with reference to FIG. 8B, the first reaction component 110 is decomposed by the etching component forming processing (heating and supply of decomposition accelerating liquid such as water). In detail, in the decomposition accelerating liquid supplying step (Step S4), the rinse liquid as a decomposition accelerating liquid is supplied to the processing film 100, thereby swelling the processing film 100. In the presence of the rinse liquid, the substrate W is heated (processing film heating step) to decompose the first reaction component 110. The first reaction component 110 is decomposed to form an etching component 112 and a second reaction component 113 in the processing film 100 (etching component forming step, second reaction component forming step). As shown in FIG. 8C, a surface layer portion 150 of the substrate W is etched by the etching component 112 formed in the processing film 100 (etching step). The surface layer portion 150 of the substrate W is a portion in the vicinity of an upper surface 151 of the substrate W.

The etching component 112 is dissolved by the rinse liquid as a decomposition accelerating liquid. The etching component 112 in contact with the upper surface 151 of the substrate W disappears by etching of the surface layer portion 150 of the substrate W. Therefore, as shown in FIG. 8C, the etching component 112 in the processing film 100 moves to the upper surface 151 side of the substrate W so that the etching component 112 in contact with the upper surface 151 of the substrate W inside the processing film 100 will not decrease in concentration. Since the processing film 100 is swollen by the rinse liquid, the etching component 112 easily moves the processing film 100. Etching of the surface layer portion 150 of the substrate W proceeds gradually and the upper surface 151 of the substrate W recedes toward the lower surface side.

The upper surface 151 of the substrate W recedes (etching of surface layer portion 150 of substrate W), by which the particles 103 rise from the upper surface 151 of the substrate W. Thereby, the particles 103 are wrapped by the processing film 100 (in particular, low solubility component 111 in a solid state) and held more firmly. The surface layer portion 150 of the substrate W is etched to form etching residue 104. The processing film 100 (in particular, low solubility component 111 in a solid state) holds the etching residue 104 together with the particles 103 that have been adhering to the upper surface 151 of the substrate W since before the etching step. The particles 103 and the etching residue 104 are collectively referred to as objects 105 to be removed.

Figure 8D:
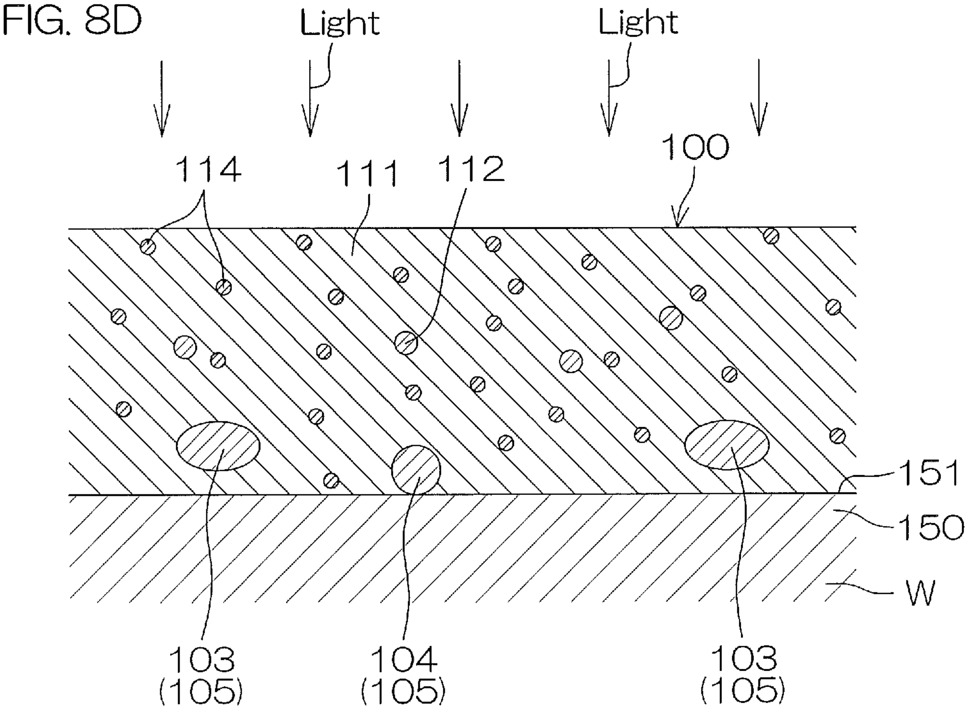
FIG. 8D is a schematic view for describing conditions in which a processing film is removed from a front surface of a substrate.

Next, the second reaction component 113 is decomposed by the high solubility component forming processing (light irradiation). In detail, in the light irradiation step (Step S6), the processing film 100 is irradiated with light to decompose the second reaction component 113. The second reaction component 113 is decomposed, by which, as shown in FIG. 8D, a first high solubility component 114 is formed in the processing film 100 (first high solubility component forming step). As described previously, in a state that the rinse liquid remains in the processing film 100 and also the processing film 100 is sufficiently heated, light irradiation is executed to accelerate decomposition of the second reaction component 113.

Figure 8E:
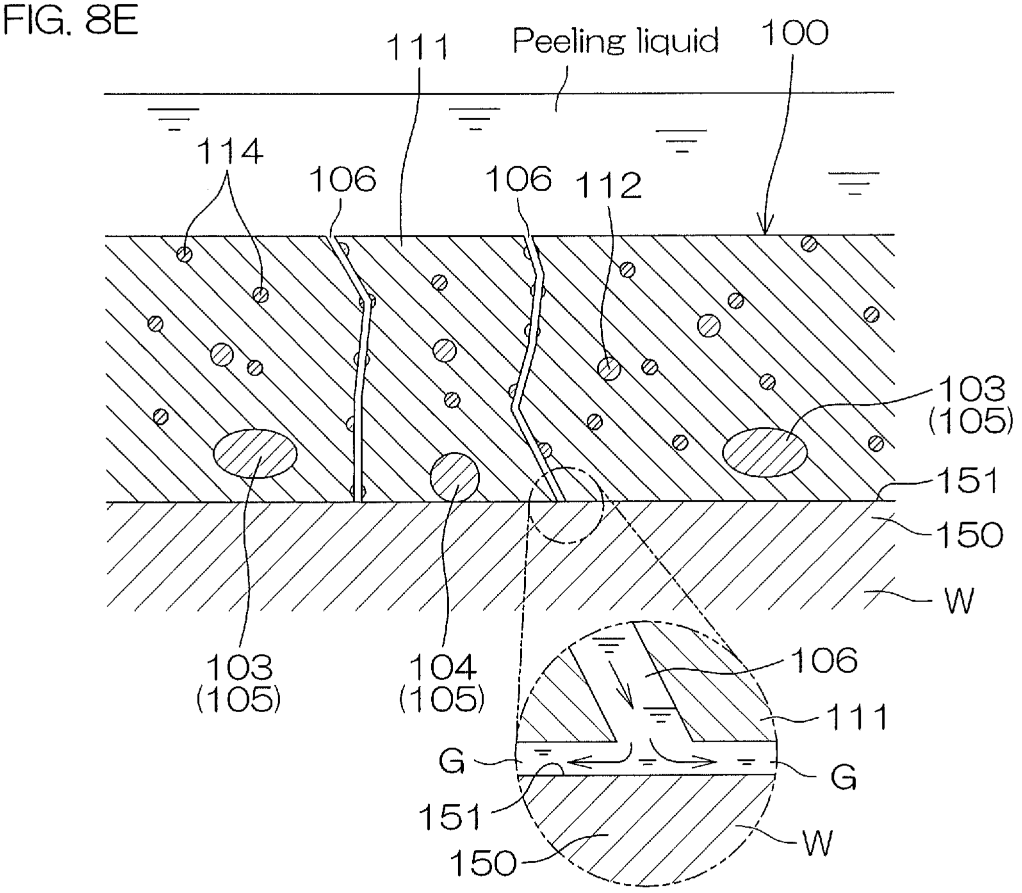
FIG. 8E is a schematic view for describing conditions in which a processing film is removed from a front surface of a substrate.

Next, with reference to FIG. 8E, the first high solubility component 114 is selectively dissolved by the peeling liquid. That is, the processing film 100 is partially dissolved (dissolution step, partial dissolution step).

"The first high solubility component 114 in a solid state is selectively dissolved" does not mean that only the first high solubility component 114 in a solid state is dissolved. "The first high solubility component 114 in a solid state is selectively dissolved" means that although the low solubility component 111 in a solid state is also slightly dissolved, the first high solubility component 114 in a solid state is mostly dissolved.

In response to the selective dissolution of the first high solubility component 114, a through hole 106 is formed at a portion where the first high solubility component 114 is locally present in the processing film 100 (through hole forming step).

At the portion where the first high solubility component 114 is locally present, not only is the first high solubility component 114 present but also the low solubility component 111 is present. The peeling liquid dissolves not only the first high solubility component 114 but also the low solubility component 111 around the first high solubility component 114, thereby, accelerating formation of the through hole 106.

The through hole 106 has a size that is, for example, several nanometers in diameter in a plan view. The through hole 106 is not required to be formed clearly so as to be observable. That is, the through hole 106 is such that a channel for the peeling liquid to move from an upper surface of the processing film 100 to the upper surface 151 of the substrate W may be formed in the processing film 100 and the channel may penetrate through the processing film 100, as a whole.

Here, where the solvent and the rinse liquid remain appropriately in the processing film 100, the peeling liquid partially dissolves the processing film 100, while being dissolved into the solvent and rinse liquid that remain in the processing film 100. In detail, the peeling liquid dissolves the first high solubility component 114 in the processing film 100, while being dissolved into the solvent and the rinse liquid that remain in the processing film 100, thereby forming the through hole 106. Therefore, the peeling liquid easily enters into the processing film 100 (dissolution entry step).

The peeling liquid which has reached the upper surface 151 of the substrate W acts on an interface between the processing film 100 and the substrate W, thereby peeling the processing film 100 and removing the thus-peeled processing film 100 from the upper surface 151 of the substrate W (peeling/removing step).

In detail, the low solubility component 111 is low in solubility with respect to the peeling liquid, and the low solubility component 111 is mostly kept in a solid state. Therefore, the peeling liquid which has reached the vicinity of the upper surface 151 of the substrate W via the through hole 106 slightly dissolves a portion of the low solubility component 111 near the upper surface 151 of the substrate W. Thereby, as shown in an enlarged view of FIG. 8E, the peeling liquid enters a gap G between the processing film 100 and the upper surface 151 of the substrate W, while gradually dissolving the low solubility component 111 in a solid state near the upper surface 151 of the substrate W (peeling liquid entry step).

Figure 8F:
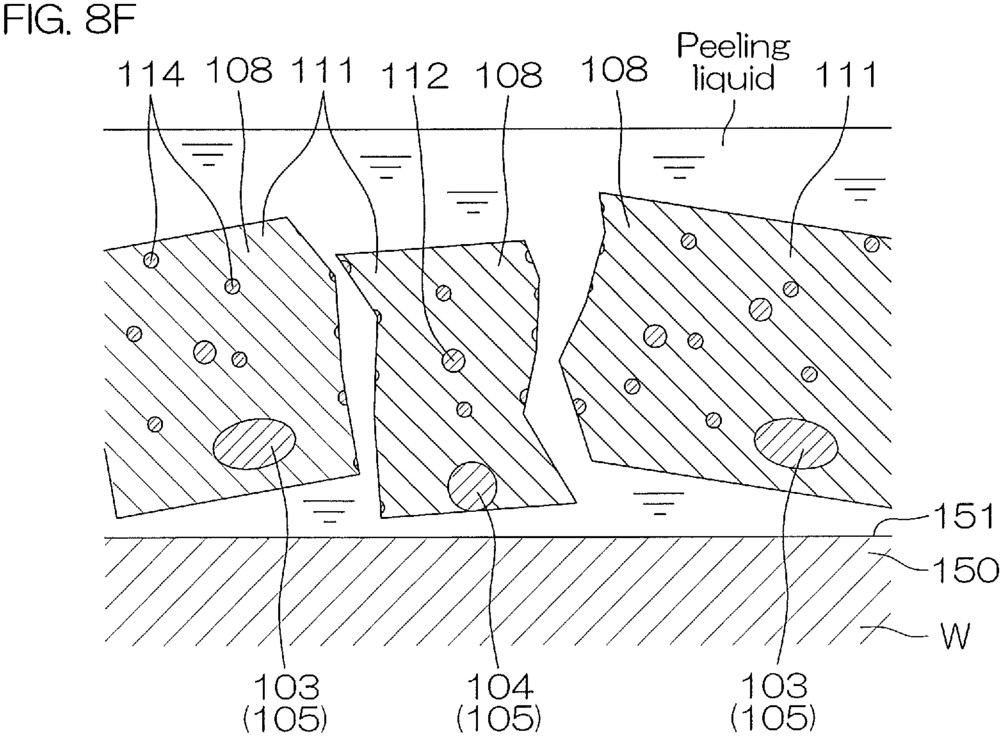
FIG. 8F is a schematic view for describing conditions in which a processing film is removed from a front surface of a substrate.

Then, cracks are formed in the processing film 100, for example, with a peripheral edge of the through hole 106 as a starting point. Therefore, the first high solubility component 114 is also referred to as a crack occurring component. The processing film 100 is split by formation of cracks and made into film fragments 108. As shown in FIG. 8F, the film fragments 108 of the processing film 100 are peeled from the substrate W in a state that the objects 105 to be removed are held (processing film splitting step, processing film peeling step).

Then, the peeling liquid is supplied continuously, by which the processing film 100 which has been made into the film fragments 108 is washed away by the peeling liquid in a state that the objects 105 to be removed are held. In other words, the film fragments 108 which hold the objects 105 are pushed outside the substrate W and removed from the upper surface 151 of the substrate W (processing film removing step, removal objects removing step). It is, thereby, possible to favorably clean the upper surface 151 of the substrate W.

The first preferred embodiment provides the following effects.

According to the first preferred embodiment, the processing film 100 formed on the substrate W is subjected to the etching component forming processing such as heating, light irradiation, and supply of water. Thereby, the etching component 112 is formed in the processing film 100, and the surface layer portion 150 of the substrate W is etched by the etching component 112.

Unlike this method, according to a method in which the etching liquid is supplied continuously to the upper surface 151 of the substrate W to etch the surface layer portion 150 of the substrate W, the etching component 112 is expelled one after another to the outside of the substrate W. By contrast thereto, the etching component 112 formed in the processing film 100 is not removed to the outside of the substrate W but reacts with the surface layer portion 150 of the substrate W. Therefore, it is possible to reduce the amount of the etching component 112 to be consumed.

Further, in the processing film removing step, the processing film 100 is not removed from the upper surface 151 of the substrate W by being dissolved in the peeling liquid but peeled from the upper surface 151 of the substrate W and removed. Therefore, it is possible to detach the objects 105 such as the particles 103 adhering to the upper surface 151 of the substrate W from the upper surface 151 of the substrate W and remove them.

Further, the surface layer portion 150 of the substrate W is etched by the etching component 112, by which the upper surface 151 of the substrate W recedes further to the lower surface side of the substrate W than before the etching step is started. Therefore, the objects 105 to be removed are allowed to rise from the upper surface 151 of the substrate W. Therefore, the processing film 100 is removed by peeling after performing the etching by the etching component 112 in the processing film 100, thus making it possible to detach favorably the objects to be removed 105.

Further, according to the first preferred embodiment, after the etching component forming step and also before the processing film removing step, the processing film 100 is subjected to the high solubility component forming processing such as light irradiation, thereby forming the first high solubility component 114 in the processing film 100. The first high solubility component 114 in the processing film 100 is dissolved by supplying the peeling liquid to the upper surface 151 of the substrate W in the subsequent processing film removing step. The first high solubility component 114 in the processing film 100 is dissolved by the peeling liquid to form the through hole 106 in the processing film 100. Therefore, the peeling liquid is able to quickly reach the interface between the processing film 100 and the substrate W via the through hole 106 formed in the processing film 100. The peeling liquid enters the interface between the substrate W and the processing film 100 to peel the processing film 100 from the upper surface 151 of the substrate W. Thereby, it is possible to quickly peel the processing film 100 from the upper surface 151 of the substrate W after completion of the etching by the etching component 112.

Further, according to the first preferred embodiment, in the processing film forming step, the processing film 100 is formed which contains the low solubility component 111 that is lower in solubility with respect to the peeling liquid than the first high solubility component 114.

According to this method, the solubility of the low solubility component 111 with respect to the peeling liquid is lower than the solubility of the first high solubility component 114 with respect to the peeling liquid. Therefore, while the first high solubility component 114 is dissolved by the peeling liquid, the low solubility component 111 is not dissolved in the peeling liquid but kept in a solid state in the processing film 100.

Consequently, while the first high solubility component 114 is dissolved in the peeling liquid, the low solubility component 111 can be kept in the processing film 100 without being dissolved in the peeling liquid. Therefore, the peeling liquid reaches the interface between the substrate W and the processing film 100 through the through hole 106 which is formed by dissolution of the first high solubility component 114.

As a result, it is possible to quickly peel the processing film 100 from the upper surface 151 of the substrate W after completion of the etching by the etching component 112.

Since the low solubility component 111 is kept in a solid state, it is possible to hold the objects 105 to be removed by the low solubility component 111 even after the first high solubility component 114 is dissolved. Also, when the processing film 100 is removed from the front surface of the substrate by the peeling liquid, it is possible to keep a state that the objects 105 to be removed are held by the processing film 100. Therefore, as compared with a case where the objects 105 to be removed are not held by the low solubility component 111, it is possible to increase an energy (physical force) that the objects 105 to be removed receive from a flow of the peeling liquid. As a result, it is possible to effectively remove the objects 105 by the peeling liquid from the upper surface of the substrate W.

Further, according to the first preferred embodiment, the processing film 100 which contains the first reaction component 110 is formed in the processing film forming step. In the etching component forming step, the first reaction component 110 is decomposed by the etching component forming processing, by which the second reaction component 113 is formed in the processing film 100 together with the etching component 112. Then, in the high solubility component forming step, the second reaction component 113 is decomposed by the high solubility component forming processing, by which the first high solubility component 114 is formed in the processing film 100.

According to this method, the first reaction component 110 is decomposed by the etching component forming processing to form the etching component 112. Since the etching component 112 is formed in response to an external stimulation, it is easier to control the timing of the start of the etching as compared with a case where the etching component 112 is formed by spontaneous decomposition of a component in the processing film 100.

Then, the second reaction component 113 is decomposed in response to an external stimulation of the high solubility component forming processing, thereby forming the first high solubility component 114 which is to be dissolved by the peeling liquid that is supplied subsequently to the upper surface 151 of the substrate W. Therefore, the processing film 100 is kept on the substrate W before supply of the peeling liquid and quickly peeled by supply of the peeling liquid. Consequently, it is possible to accurately control an etching amount of the surface layer portion 150 of the substrate W, while suppressing the amount of the etching component 112 to be consumed.

Further, according to the first preferred embodiment, the decomposition accelerating liquid which accelerates decomposition of the first reaction component 110 in the etching component forming step is supplied to the upper surface 151 of the substrate W. Since decomposition of the first reaction component 110 is accelerated by the decomposition accelerating liquid, it is possible to quickly etch the surface layer portion 150 of the substrate W.

Further, according to the first preferred embodiment, decomposition of the second reaction component 113 is accelerated by the decomposition accelerating liquid supplied to the upper surface 151 of the substrate W in the decomposition accelerating liquid supplying step. According to this method, decomposition of the second reaction component 113 is accelerated by the decomposition accelerating liquid. It is, thereby, possible to quickly form the first high solubility component 114.

Further, according to the first preferred embodiment, the first reaction component 110 is a carboxylic acid ester or a sulfonic acid ester. The carboxylic acid ester, the sulfonic acid ester, etc., undergo hydrolysis, thus making it possible to form an acid component (organic acid) such as carboxylic acid and sulfonic acid which function as the etching component 112.

Further, according to the first preferred embodiment, the surface layer portion 150 of the substrate W is etched in the etching step to form the etching residue 104. The etching residue 104 is held by the processing film 100 which is formed in the processing film forming step. Then, the processing film removing step includes a step in which the etching residue 104 is removed together with the processing film 100 in a state that the etching residue 104 is held by the processing film 100.

According to this method, the etching residue 104 which is generated by the etching of the surface layer portion 150 of the substrate W is removed from the upper surface 151 of the substrate W together with the processing film 100 in the processing film removing step. Therefore, there is no need to perform processing for separately removing the etching residue 104 after removal of the processing film 100.

Next, a description will be given of another example of the substrate processing according to the first preferred embodiment.

Figure 9A:
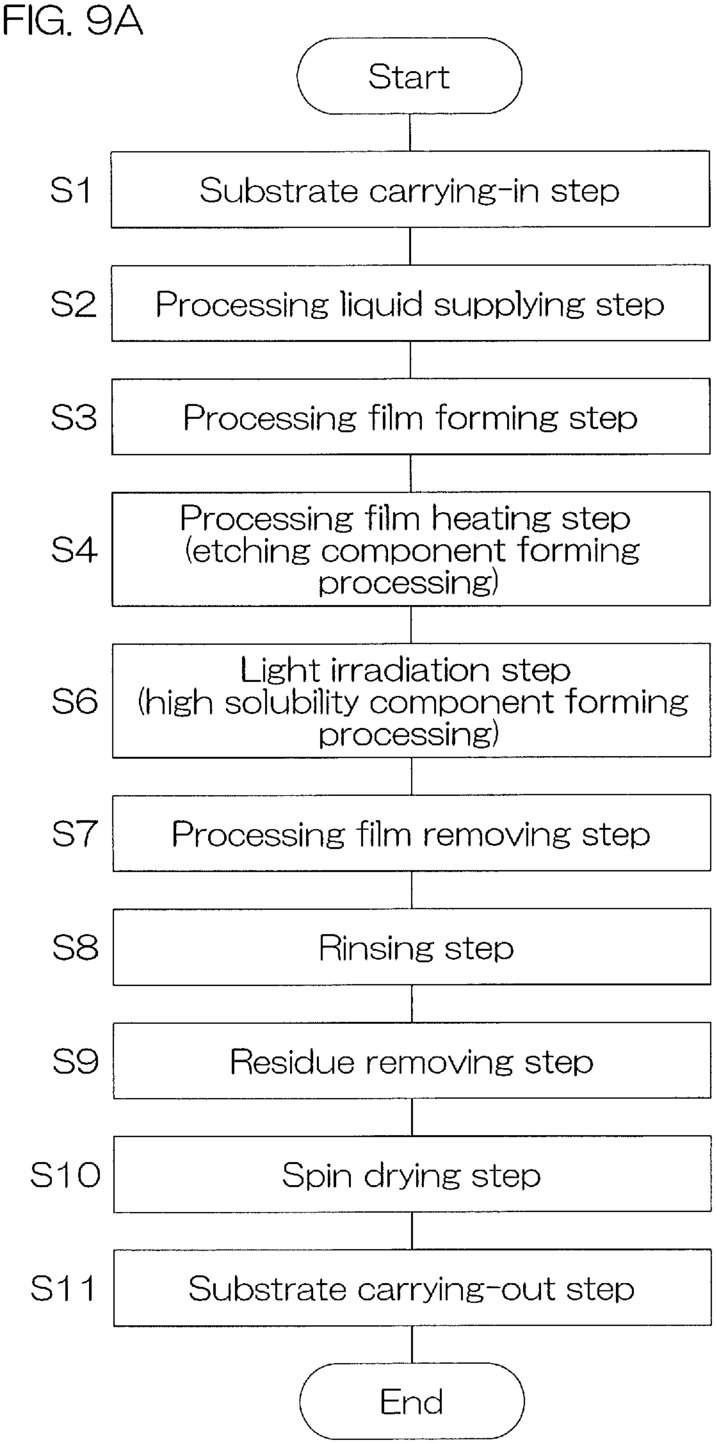
FIG. 9A is a flowchart for describing a second example of the substrate processing.

FIG. 9A is a flowchart for describing a second example of the substrate processing according to the first preferred embodiment. The second example of the substrate processing is different from the substrate processing in FIG. 6 in that the decomposition accelerating liquid supplying step (Step S5) is omitted. That is, in the second example of the substrate processing, the etching component forming processing is heating of the processing film, and the high solubility component forming processing is light irradiation onto the processing film. In the second example of the substrate processing, the heater unit 6 functions as an etching component forming processing unit, and the light irradiation unit 8 functions as a high solubility component forming processing unit.

The first reaction component is decomposed by heating. Decomposition of the first reaction component may be accelerated by using moisture in the processing film or in an atmosphere. The second reaction component is decomposed by light irradiation onto the processing film. Decomposition of the second reaction component is accelerated by an amount of heat that remains in the processing film.

Figure 9B:
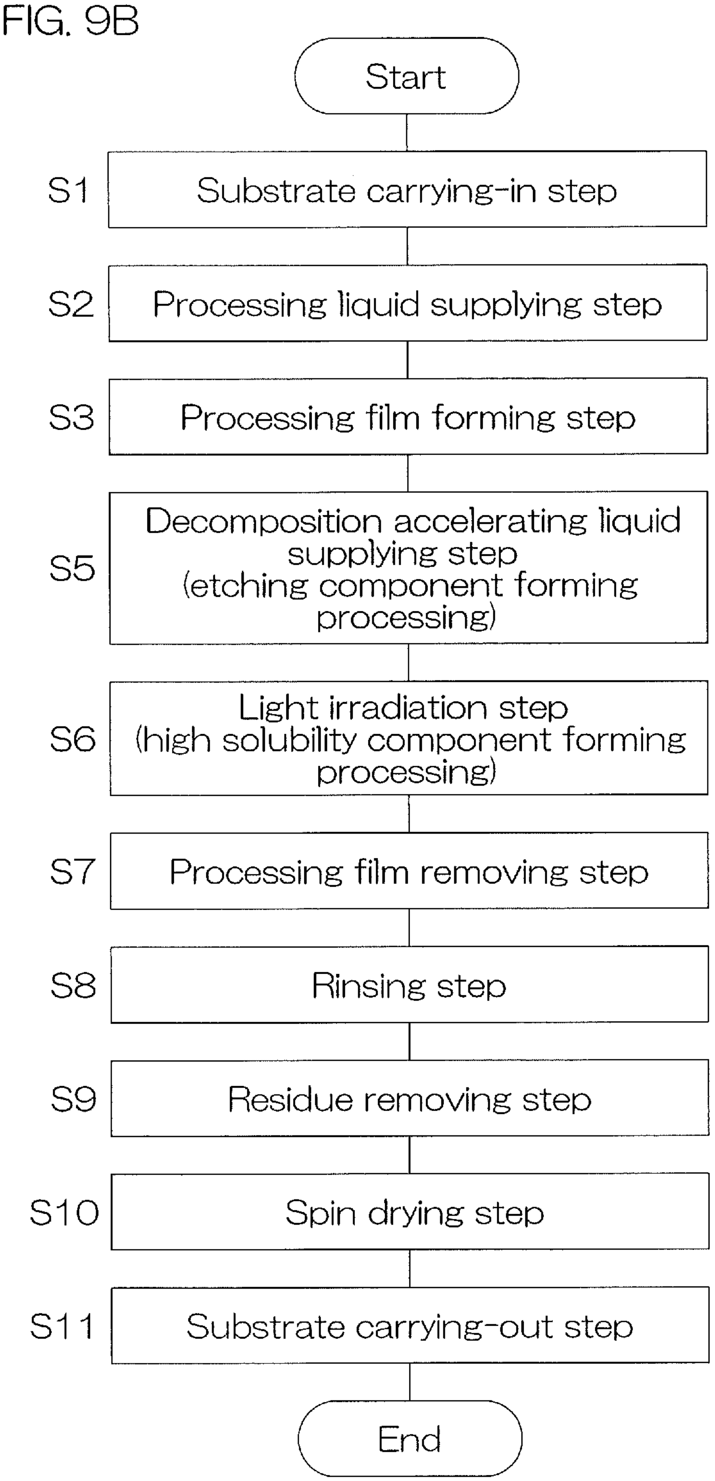
FIG. 9B is a flowchart for describing a third example of the substrate processing.

FIG. 9B is a flowchart for describing a third example of the substrate processing according to the first preferred embodiment. The third example of the substrate processing is different from the substrate processing in FIG. 6 in that the processing film heating step (Step S4) is omitted. That is, in the third example of the substrate processing, the etching component forming processing is supply of the decomposition accelerating liquid, and the high solubility component forming processing is light irradiation onto the processing film. The first reaction component is decomposed at a normal temperature in the presence of the decomposition accelerating liquid. The normal temperature is, for example, a temperature of not less than 5° C. and not more than 25° C. The second reaction component is decomposed by light irradiation onto the processing film.

In the third example of the substrate processing, the third moving nozzle 11 functions as an etching component forming processing unit, and the light irradiation unit 8 functions as a high solubility component forming processing unit.

Figure 9C:
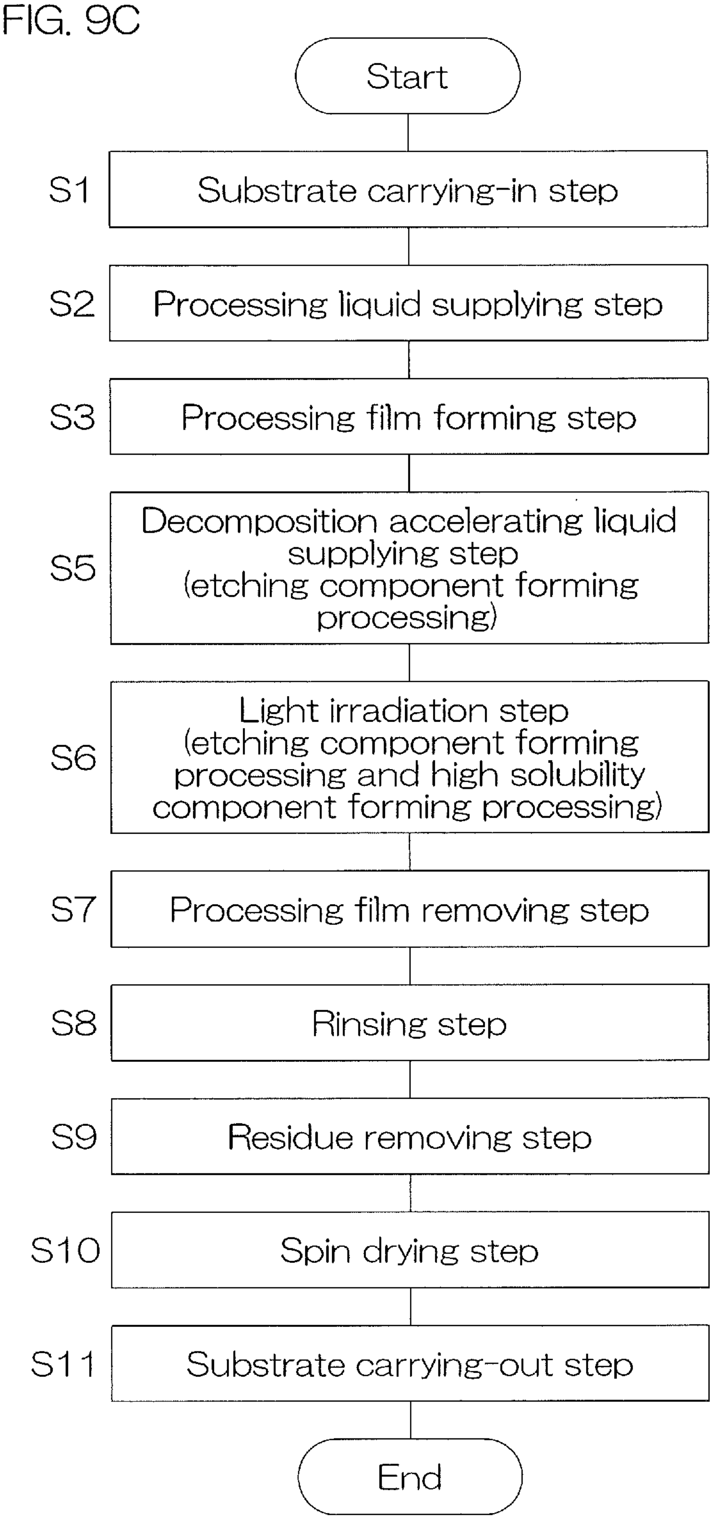
FIG. 9C is a flowchart for describing a fourth example of the substrate processing.

FIG. 9C is a flowchart for describing a fourth example of the substrate processing according to the first preferred embodiment. The fourth example of the substrate processing is the same as the third example of the substrate processing shown in FIG. 9B. However, in the fourth example of the substrate processing, the etching component forming processing is supply of the decomposition accelerating liquid and light irradiation onto the processing film, and the high solubility component forming processing is light irradiation onto the processing film. The first reaction component and the second reaction component are decomposed by light energy in the presence of the decomposition accelerating liquid.

In the fourth example of the substrate processing, the light irradiation unit 8 and the third moving nozzle 11 function as an etching component forming processing unit, and the light irradiation unit 8 functions as a high solubility component forming processing unit.

Figure 9D:
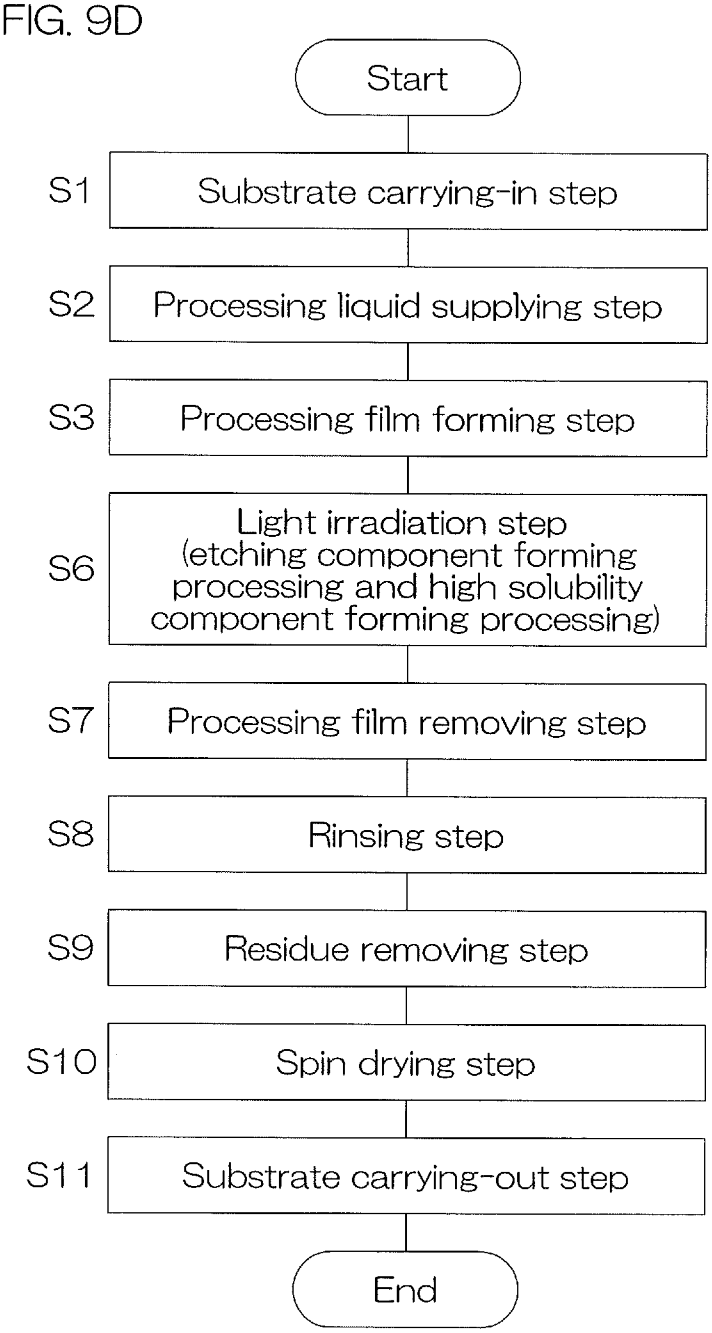
FIG. 9D is a flowchart for describing a fifth example of the substrate processing.

FIG. 9D is a flowchart for describing a fifth example of the substrate processing according to the first preferred embodiment. The fifth example of the substrate processing is different from the substrate processing in FIG. 6 in that the processing film heating step (Step S4) and the decomposition accelerating liquid supplying step (Step S5) are omitted. That is, in the fifth example of the substrate processing, both of the etching component forming processing and the high solubility component forming processing are light irradiation onto the processing film. In this case, the first reaction component and the second reaction component are decomposed at the same time. Where a decomposition reaction of the first reaction component is hydrolysis, the first reaction component and the second reaction component are decomposed by using moisture in the processing film 100 or in an atmosphere, with light emitted at a normal temperature.

In the fifth example of the substrate processing, the light irradiation unit 8 functions as an etching component forming processing unit and a high solubility component forming processing unit.

Although not shown, the decomposition accelerating liquid supplying step (Step S5) and the light irradiation step (Step S6) may be omitted, and the etching component forming processing and the high solubility component forming processing may be executed in the processing film heating step (Step S4).

Second Preferred Embodiment

A substrate processing apparatus 1P according to the second preferred embodiment has the same arrangement as the substrate processing apparatus 1 according to the first preferred embodiment (refer to FIG. 2). The substrate processing apparatus 1P is mainly different from the substrate processing apparatus 1 according to the first preferred embodiment in that a processing liquid contains as a solute a second high solubility component, in addition to a first reaction component and a low solubility component.

The first reaction component may be such that it will not form an etching component or a second reaction component by etching component forming processing but will form only the etching component. The first reaction component can be the same carboxylic acid ester or the same sulfonic acid ester as that used in the first preferred embodiment.

Figure 10:
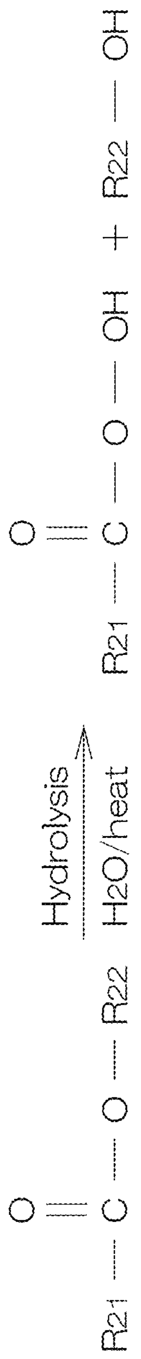
FIG. 10 is a schematic view for describing an example of a decomposition reaction of a first reaction component in a processing film by the etching component forming processing in substrate processing according to a second preferred embodiment.

As shown in FIG. 10, where the first reaction component is a carboxylic acid ester, the first reaction component undergoes hydrolysis under heating conditions (for example, not less than 50° C. and not more than 80° C.) in the presence of water. A carboxylic acid produced by hydrolysis is the etching component.

Figure 11:
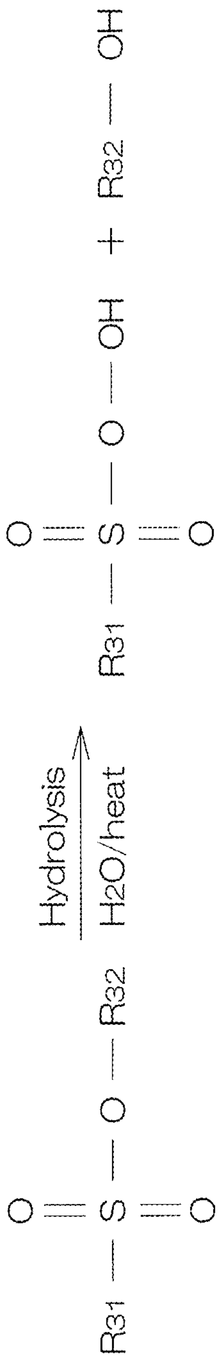
FIG. 11 is a schematic view for describing another example of the decomposition reaction of the first reaction component in the processing film by the etching component forming processing in the substrate processing according to the second preferred embodiment.

In FIG. 10, $R_{21}$ is, for example, a hydrocarbon group and $R_{22}$ is, for example, a functional group which partially has a carboxylic acid ester group. $R_{21}$ may be such that hydrogen atoms in the hydrocarbon group are replaced by fluorine atoms or chlorine atoms. Where $R_{21}$ is such that hydrogen atoms in the hydrocarbon are replaced by fluorine atoms or chlorine atoms, the etching component is higher in acidity as compared with a case where $R_{21}$ is a functional group in which fluorine atoms or chlorine atoms are not contained in the hydrocarbon group.

Where the first reaction component is a sulfonic acid ester, as shown in FIG. 11, the first reaction component undergoes hydrolysis under heating conditions (for example, not less than 50° C. and not more than 80° C.) in the presence of water. A sulfonic acid that is produced by hydrolysis of the first reaction component is the etching component.

In FIG. 11, $R_{31}$ is, for example, a hydrocarbon group, and $R_{32}$ is, for example, a functional group which partially has a sulfonic acid ester group. $R_{31}$ may be such that hydrogen atoms in the hydrocarbon group are replaced by fluorine atoms or chlorine atoms. Where $R_{31}$ is such that hydrogen atoms in the hydrocarbon group are replaced by fluorine atoms or chlorine atoms, the etching component is higher in acidity as compared with a case where $R_{31}$ is a functional group in which fluorine atoms or chlorine atoms are not contained in the hydrocarbon group. Therefore, it is possible to quickly etch a surface layer portion of the substrate W.

The second high solubility component is a component that is relatively high in solubility with respect to a peeling liquid. The second high solubility component is, for example, 2,2-bis(4-hydroxyphenyl)propane. The low solubility component may be such a substance that is lower in solubility with respect to the peeling liquid than the second high solubility component. The low solubility component is, for example, novolak. The low solubility component is an example of a first low solubility component and also an example of a second low solubility component.

A solvent which is contained in a processing liquid may be a liquid which dissolves the second high solubility component, in addition to the low solubility component and the first reaction component. The solvent which is contained in the processing liquid is preferably a liquid having compatibility (miscibility) with the peeling liquid. The solvent which is contained in the processing liquid may be the same solvent as that contained in the processing liquid of the first preferred embodiment.

A processing film is constituted mainly of the low solubility component in a solid state (low solubility component solid), the first reaction component in a solid state (first reaction component solid), and the second high solubility component in a solid state (second high solubility component solid). The solvent may remain in the processing film. Details of the solvent, the low solubility component, and the second high solubility component which are contained in the processing liquid will be described later.

Figure 12:
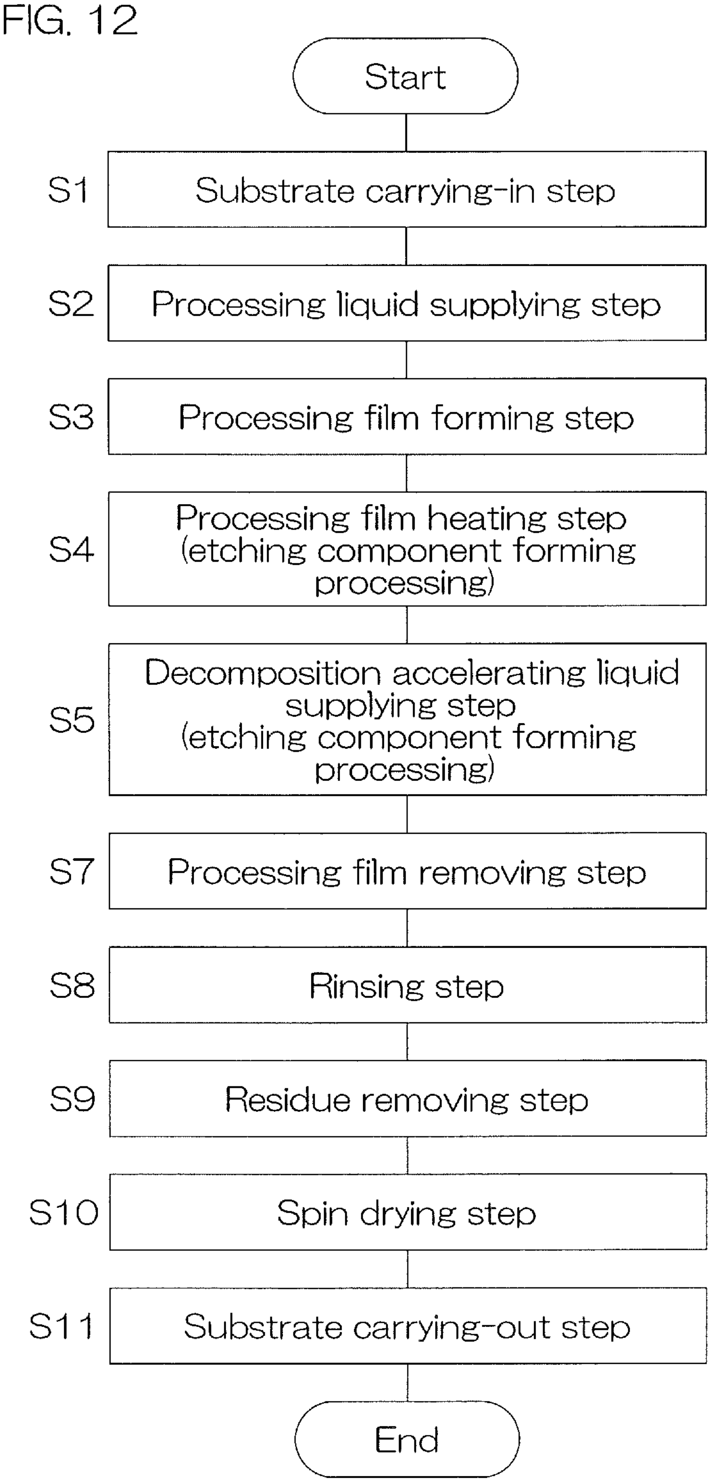
FIG. 12 is a flowchart for describing an example of substrate processing by a substrate processing apparatus according to the second preferred embodiment.

Next, a description will be given of an example of the substrate processing by the substrate processing apparatus 1P according to the second preferred embodiment. FIG. 12 is a flowchart for describing a first example of the substrate processing by the substrate processing apparatus 1P according to the second preferred embodiment.

In the substrate processing by the substrate processing apparatus 1P, for example, as shown in FIG. 12, a substrate carrying-in step (Step S1), a processing liquid supplying step (Step S2), a processing film forming step (Step S3), a processing film heating step (Step S4), a decomposition accelerating liquid supplying step (Step S5), a processing film removing step (Step S7), a rinsing step (Step S8), a residue removing step (Step S9), a spin drying step (Step S10), and a substrate carrying-out step (Step S11) are executed in this order. That is, unlike the substrate processing shown in FIG. 6, the light irradiation step (Step S6) is omitted.

Next, with reference to FIG. 13A to FIG. 13E, a detailed description will be given of conditions in which a processing film 100 is peeled from a substrate W. FIG. 13A to FIG. 13E are each a schematic view for describing conditions in which the processing film 100 is peeled from the substrate W.

Figure 13A:
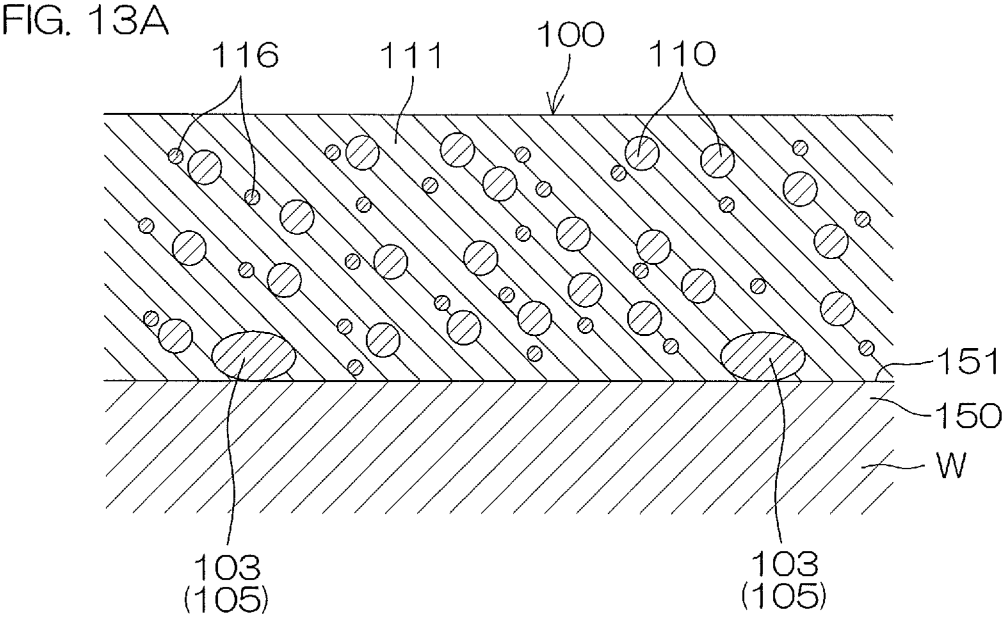
FIG. 13A is a schematic view for describing conditions in which a processing film is removed from a front surface of a substrate in the substrate processing according to the second preferred embodiment.

The processing film 100 which is formed in the processing film forming step (Step S3) holds particles 103 adhering to a surface layer portion 150 of the substrate W, as shown in FIG. 13A. Before etching component forming processing is performed, the processing film 100 contains a first reaction component 110, a low solubility component 111, and a second high solubility component 116. The first reaction component 110, the low solubility component 111, and the second high solubility component 116 are solidified or cured by at least partial evaporation of the solvent contained in the processing liquid.

Figure 13B:
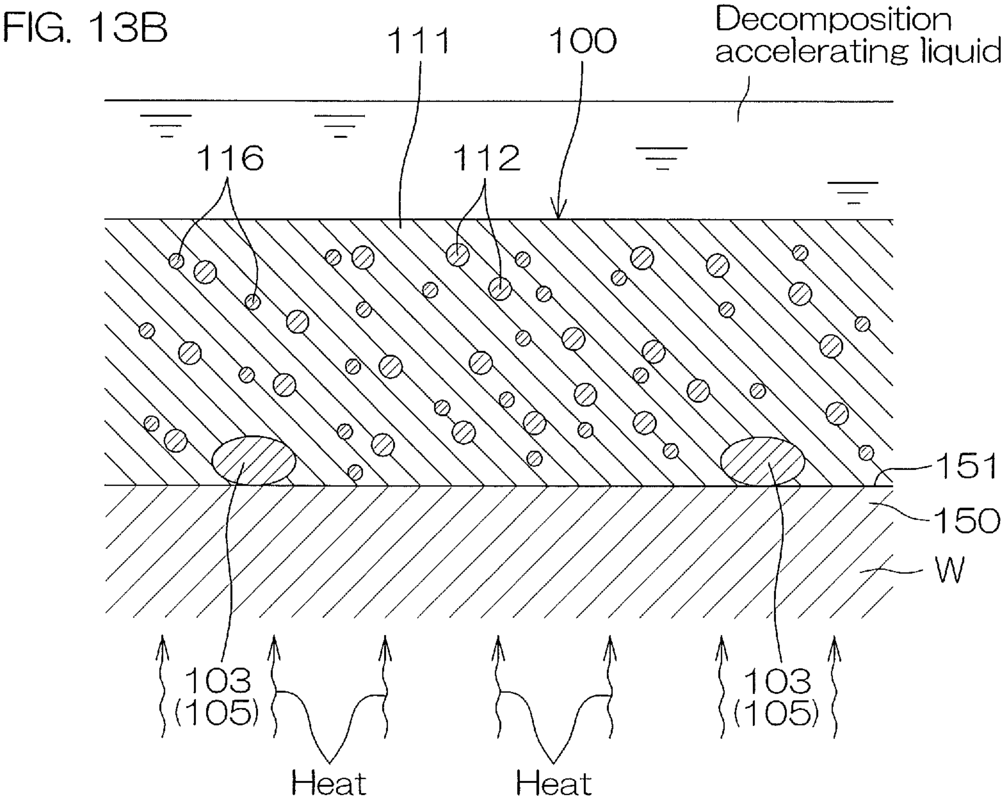
FIG. 13B is a schematic view for describing conditions in which a processing film is removed from a front surface of a substrate in the substrate processing according to the second preferred embodiment.
Figure 13C:
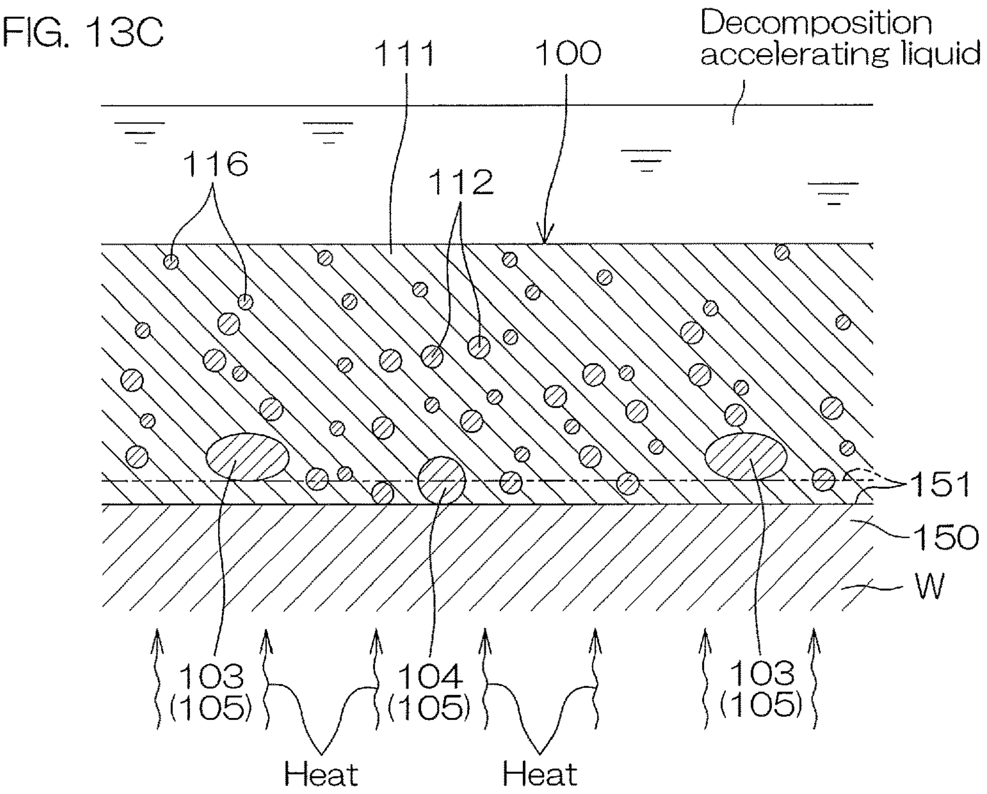
FIG. 13C is a schematic view for describing conditions in which a processing film is removed from a front surface of a substrate in the substrate processing of the second preferred embodiment.

Next, with reference to FIG. 13B, the first reaction component 110 is decomposed by etching component forming processing (heating and supply of decomposition accelerating liquid). In detail, in the decomposition accelerating liquid supplying step (Step S4), a rinse liquid as the decomposition accelerating liquid is supplied to the processing film 100 to swell the processing film 100. When the substrate W is heated in the presence of the rinse liquid (processing film heating step), the first reaction component 110 is decomposed. The first reaction component 110 is decomposed to form an etching component 112 in the processing film 100 (etching component forming step). As shown in FIG. 13C, the surface layer portion 150 of the substrate W is etched by the etching component 112 which is formed in the processing film 100 (etching step). A heater unit 6 and a third moving nozzle 11 function as an etching component forming processing unit.

The etching component 112 is dissolved by the rinse liquid as the decomposition accelerating liquid. A portion of the etching component 112 in contact with an upper surface 151 of the substrate W in the processing film 100 disappears by etching of the surface layer portion 150 of the substrate W. Therefore, as shown in FIG. 13C, the etching component 112 in the processing film 100 moves to an upper surface 151 side of the substrate W so that a portion of the etching component 112 in contact with the upper surface 151 of the substrate W in the processing film 100 will not decrease in concentration. Thus, the etching of the surface layer portion 150 of the substrate W proceeds gradually and the upper surface 151 of the substrate W recedes toward the lower surface side.

The upper surface 151 of the substrate W recedes (etching of surface layer portion 150 of substrate W), by which the particles 103 rise from the upper surface 151 of the substrate W. Thereby, the particles 103 are wrapped by the processing film 100 (in particular, low solubility component 111 in a solid state) and held more firmly. The surface layer portion 150 of the substrate W is etched to form etching residue 104. The processing film 100 (in particular, low solubility component 111 in a solid state) holds the etching residue 104 together with the particles 103 that have been adhering to the upper surface 151 of the substrate W since before the etching step.

Figure 13D:
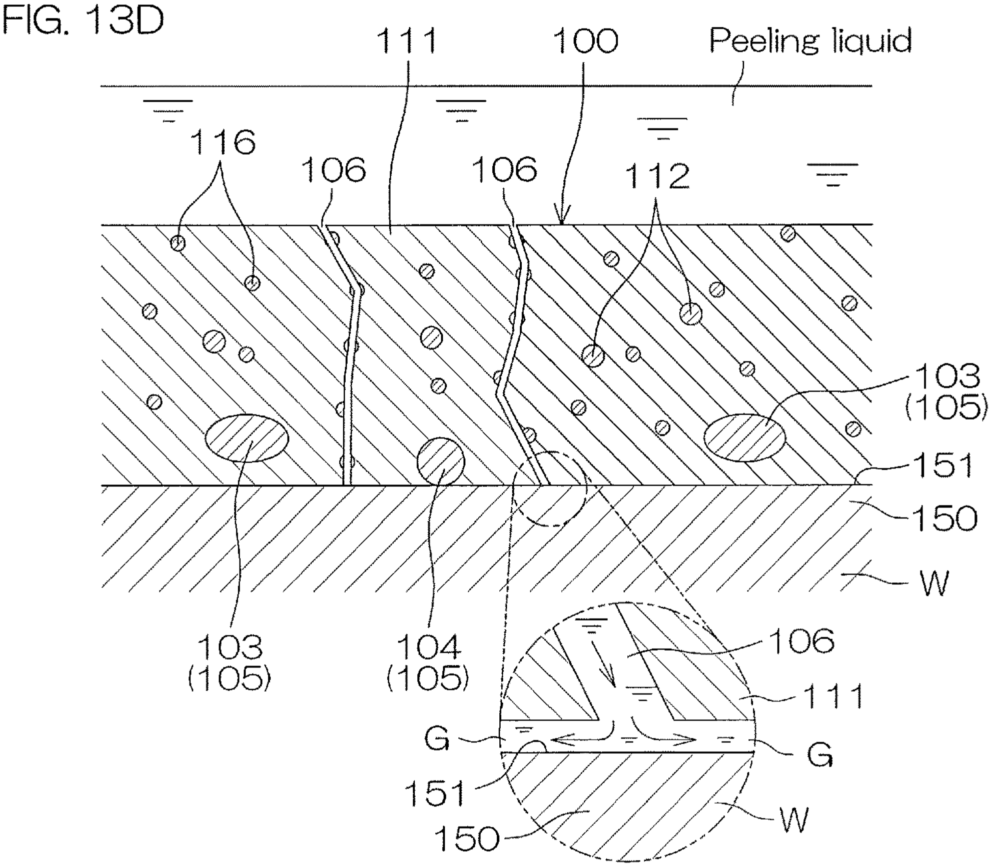
FIG. 13D is a schematic view for describing conditions in which a processing film is removed from a front surface of a substrate in the substrate processing according to the second preferred embodiment.

Next, with reference to FIG. 13D, the second high solubility component 116 is dissolved by the peeling liquid. That is, the processing film 100 is partially dissolved (dissolution step, partial dissolution step). The second high solubility component 116 is dissolved to form a through hole 106 at a portion where the second high solubility component 116 is locally present in the processing film 100 (through hole forming step).

At the portion where the second high solubility component 116 is locally present, not only is the second high solubility component 116 present but also the low solubility component 111 is present. Since the peeling liquid dissolves not only the second high solubility component 116 but also the low solubility component 111 around the second high solubility component 116, formation of the through hole 106 is accelerated.

Here, where the solvent and the rinse liquid remain appropriately in the processing film 100, the peeling liquid partially dissolves the processing film 100, while being dissolved into the solvent and the rinse liquid remaining in the processing film 100. In detail, while being dissolved into the solvent and the rinse liquid remaining in the processing film 100, the peeling liquid dissolves the first high solubility component 114 in the processing film 100 to form the through hole 106. Therefore, the peeling liquid easily enters into the processing film 100 (dissolution entry step).

The peeling liquid which has reached the upper surface of the substrate W acts on an interface between the processing film 100 and the substrate W, thereby peeling the processing film 100 and removing the thus-peeled processing film 100 from the upper surface of the substrate W (peeling/removing step).

In detail, the low solubility component 111 is low in solubility with respect to the peeling liquid, and the low solubility component 111 is mostly kept in a solid state. Therefore, the peeling liquid which has reached the vicinity of the upper surface of the substrate W via the through hole 106 slightly dissolves a portion of the low solubility component 111 near the upper surface of the substrate W. Thereby, as shown in an enlarged view of FIG. 13D, the peeling liquid enters a gap G between the processing film 100 and the upper surface of the substrate W, while gradually dissolving the low solubility component 111 in a solid state near the upper surface of the substrate W (peeling liquid entry step).

Figure 13E:
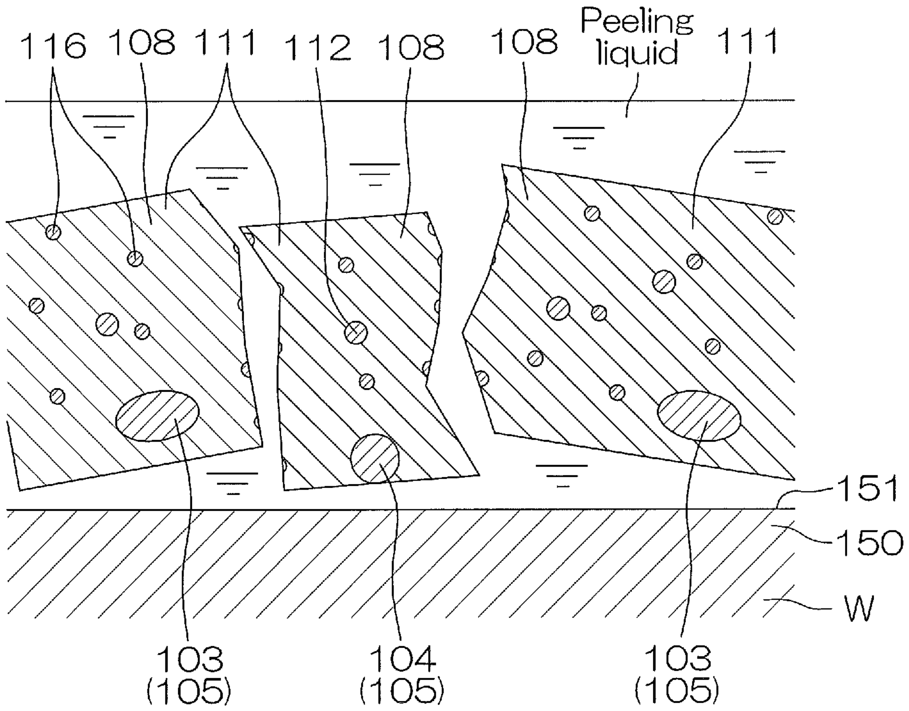
FIG. 13E is a schematic view for describing conditions in which a processing film is removed from a front surface of the substrate in the substrate processing according to the second preferred embodiment.

Then, for example, cracks occur in the processing film 100, with a peripheral edge of the through hole 106 as a starting point. Therefore, the second high solubility component 116 is also referred to as a crack occurring component. The processing film 100 is split by occurrence of the cracks and made into film fragments 108. As shown in FIG. 13E, the film fragments 108 of the processing film 100 are peeled from the substrate W in a state that the objects 105 to be removed are held (processing film splitting step, processing film peeling step).

Then, supply of the peeling liquid continues, thereby washing away the processing film 100 which has made been into the film fragments 108 by the peeling liquid in a state that the objects 105 to be removed are held. In other words, the film fragments 108 which hold the objects 105 are pushed outside the substrate W and removed from the upper surface of the substrate W (processing film removing step, removal objects removing step). Thereby, it is possible to favorably clean the upper surface of the substrate W.

The second preferred embodiment provides the same effects as those of the first preferred embodiment described above. The surface layer portion 150 of the substrate W is etched by the etching component formed in the processing film 100, thus making it possible to reduce the amount of the etching component 112 to be used. Further, in the processing film removing step, the processing film 100 is peeled and removed by the peeling liquid from the upper surface 151 of the substrate W and, therefore, the objects 105 adhering to the upper surface 151 of the substrate W can be detached and removed from the upper surface 151 of the substrate W. Further, the upper surface 151 of the substrate W recedes by the etching and, thereby, the objects 105 to be removed are allowed to rise from the upper surface 151 of the substrate W. Thus, it is possible to favorably detach the objects 105 to be removed upon peeling of the processing film 100.

The second preferred embodiment also provides the following effects. In the processing film forming step, the processing film 100 which contains the second high solubility component 116 is formed. Then, the second high solubility component 116 in the processing film 100 is dissolved by the peeling liquid supplied in the processing film removing step.

According to this method, in the processing film forming step, the processing film 100 which contains the second high solubility component 116 is formed. The second high solubility component 116 in the processing film 100 is dissolved by the peeling liquid which is subsequently supplied to the upper surface 151 of the substrate W. The second high solubility component 116 in the processing film 100 is dissolved by the peeling liquid, thereby forming the through hole 106 in the processing film 100. Therefore, the peeling liquid is able to quickly reach the interface between the processing film 100 and the substrate W via the through hole 106 formed in the processing film 100. The peeling liquid enters the interface between the substrate W and the processing film 100 to peel the processing film 100 from the upper surface 151 of the substrate W. Thereby, it is possible to quickly peel the processing film 100 from the upper surface 151 of the substrate W after completion of the etching by the etching component 112.

Further, according to the second preferred embodiment, the solubility of the low solubility component 111 with respect to the peeling liquid is lower than the solubility of the second high solubility component 116 with respect to the peeling liquid. Therefore, while the second high solubility component 116 is dissolved by the peeling liquid, the low solubility component 111 is not dissolved in the peeling liquid but kept in a solid state in the processing film 100.

Consequently, while the second high solubility component 116 is dissolved in the peeling liquid, the low solubility component 111 is not dissolved in the peeling liquid and can be kept in the processing film 100. Therefore, the peeling liquid reaches the interface between the substrate W and the processing film 100 via the through hole 106 which is formed by dissolution of the second high solubility component 116.

As a result, it is possible to quickly peel the processing film 100 from the upper surface 151 of the substrate W after completion of the etching by the etching component.

Since the low solubility component 111 is kept in a solid state, it is possible to hold the objects 105 to be removed by the low solubility component 111 even after dissolution of the second high solubility component 116. After supply of the peeling liquid, a state that the objects 105 to be removed are held by the processing film 100 can be kept. Therefore, as compared with a case where the objects 105 to be removed are not held by the low solubility component 111, it is possible to increase an energy (physical force) that the objects 105 to be removed receive from a flow of the peeling liquid.

Next, a description will be given of another example of the substrate processing according to the second preferred embodiment.

Figure 14A:
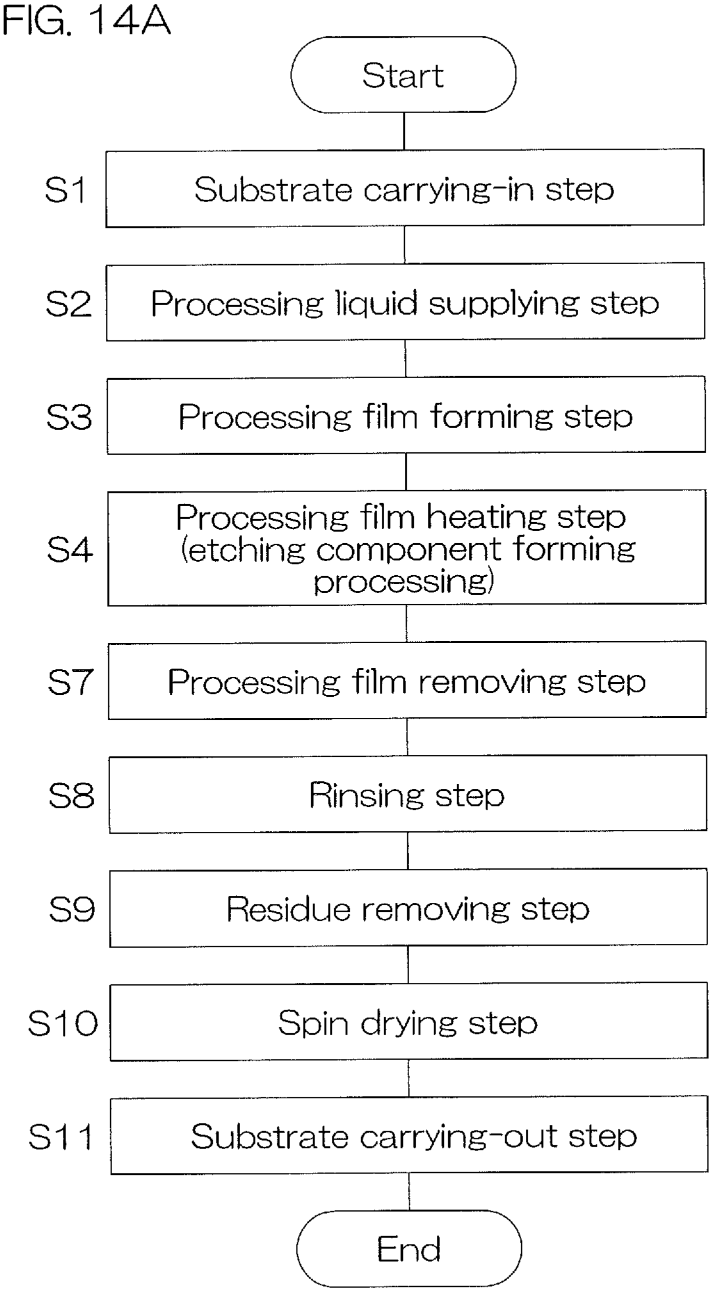
FIG. 14A is a flowchart for describing a second example of the substrate processing.

FIG. 14A is a flowchart for describing a second example of the substrate processing according to the second preferred embodiment. The second example of the substrate processing is different from the substrate processing in FIG. 12 in that the decomposition accelerating liquid supplying step (Step S5) is omitted. That is, in the second example of the substrate processing according to the second preferred embodiment, the etching component forming processing is heating of the processing film 100. The first reaction component is decomposed by heating. Decomposition of the first reaction component may be accelerated by moisture in the processing film or in an atmosphere. In the second example of the substrate processing, the heater unit 6 functions as an etching component forming processing unit.

Figure 14B:
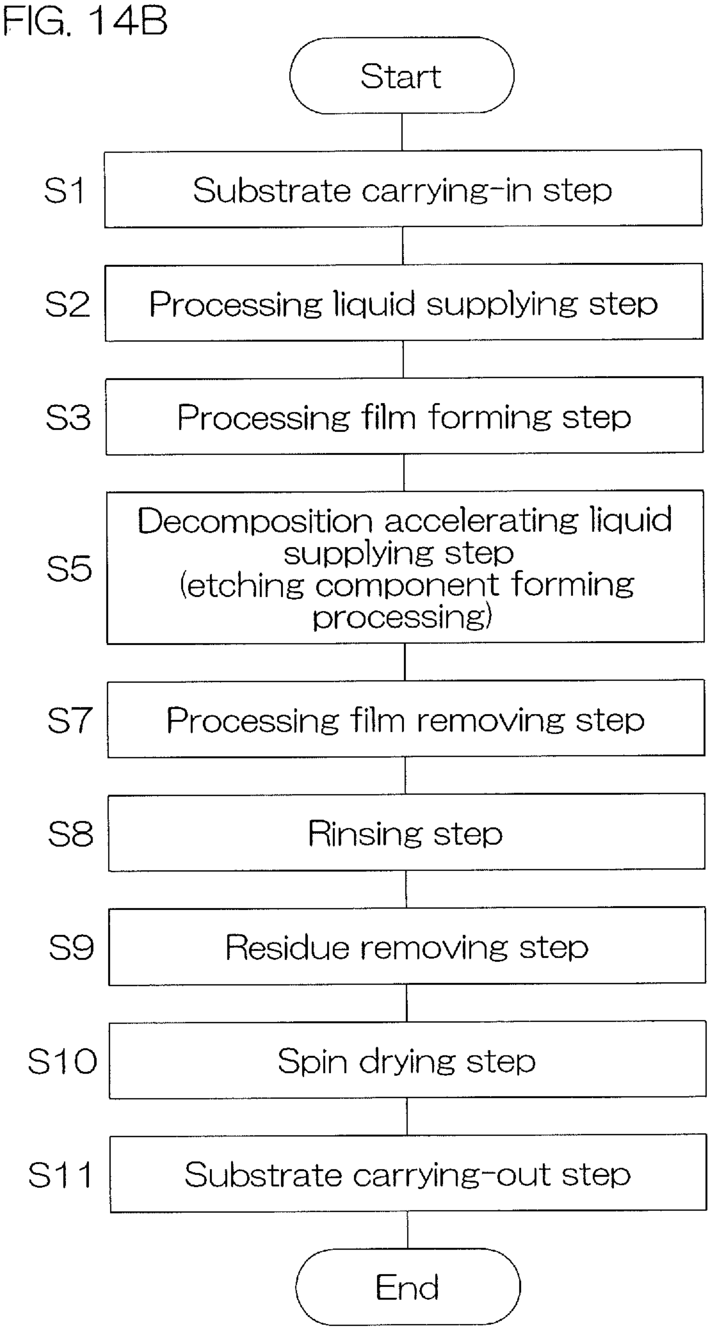
FIG. 14B is a flowchart for describing a third example of the substrate processing.

FIG. 14B is a flowchart for describing a third example of the substrate processing according to the second preferred embodiment. The third example of the substrate processing according to the second preferred embodiment is different from the substrate processing in FIG. 12 in that the processing film heating step (Step S4) is omitted. That is, in the third example of the substrate processing, the etching component forming processing is supply of the decomposition accelerating liquid. The first reaction component is decomposed at a normal temperature in the presence of the decomposition accelerating liquid. In the third example of the substrate processing, the third moving nozzle 11 functions as an etching component forming processing unit.

Figure 14C:
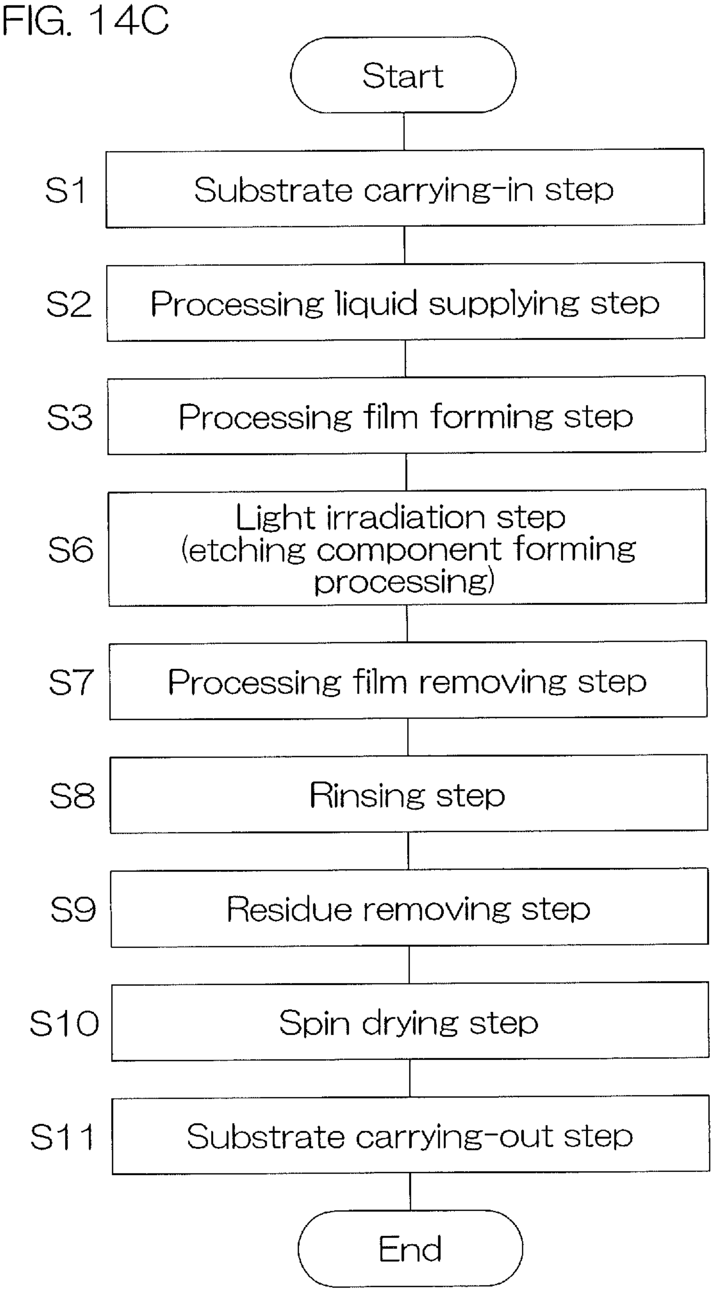
FIG. 14C is a flowchart for describing a fourth example of the substrate processing.

FIG. 14C is a flowchart for describing a fourth example of the substrate processing according to the second preferred embodiment. The fourth example of the substrate processing is different from the substrate processing in FIG. 12 in that the processing film heating step (Step S4) and the decomposition accelerating liquid supplying step (Step S5) are omitted. In place of them, the light irradiation step (Step S6) is executed. That is, in the fourth example of the substrate processing, the etching component forming processing is light irradiation. The first reaction component is decomposed by light energy. Decomposition of the first reaction component may be accelerated by moisture in the processing film or in an atmosphere. In the fourth example of the substrate processing, the light irradiation unit 8 functions as an etching component forming processing unit.

Figure 14D:
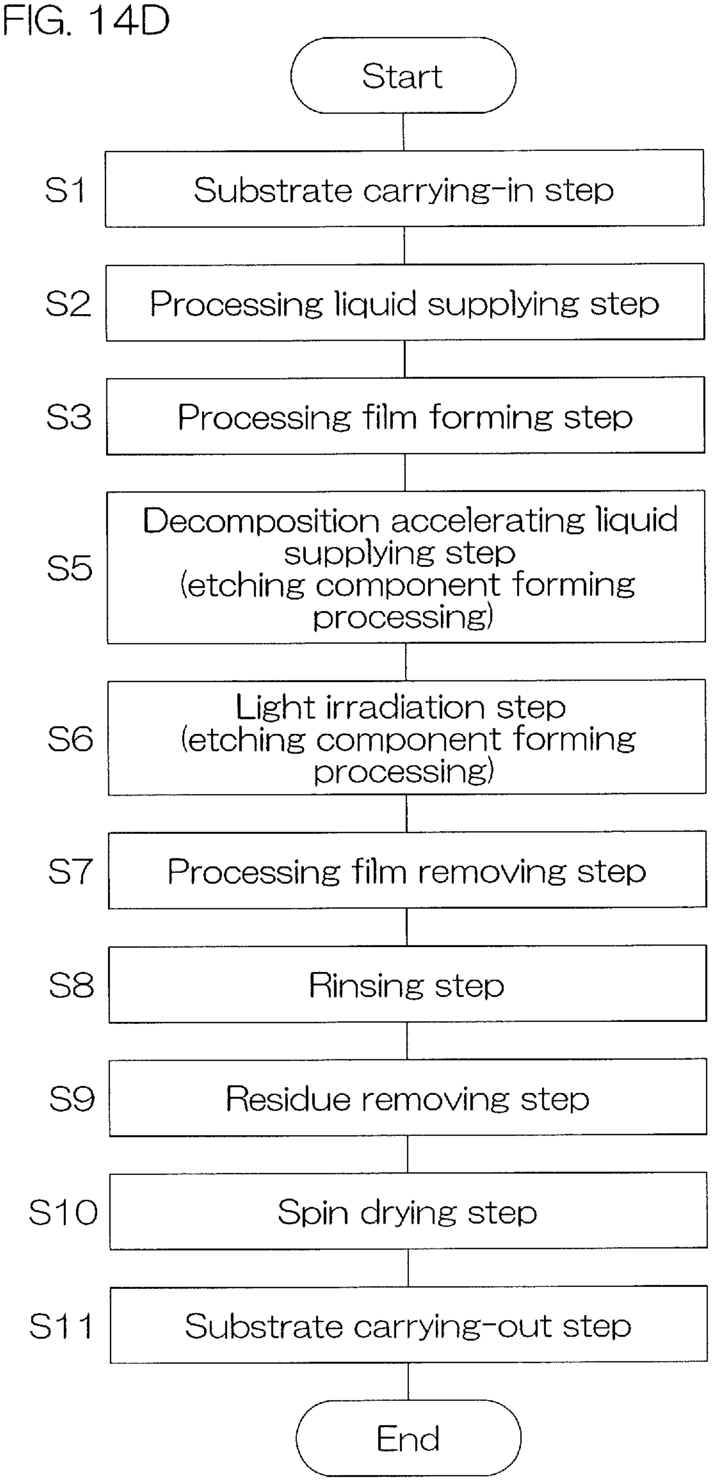
FIG. 14D is a flowchart for describing a fifth example of the substrate processing.

FIG. 14D is a flowchart for describing a fifth example of the substrate processing according to the second preferred embodiment. The fifth example of the substrate processing is different from the substrate processing in FIG. 12 in that in place of the processing film heating step (Step S4), the light irradiation step (Step S6) is performed. That is, in the fifth example of the substrate processing, the etching component forming processing is light irradiation and supply of the decomposition accelerating liquid. The first reaction component is decomposed by light irradiation at a normal temperature in the presence of the decomposition accelerating liquid. In the fifth example of the substrate processing, the third moving nozzle 11 and the light irradiation unit 8 function as an etching component forming processing unit.

<Details of Components in Processing Liquid>

Hereinafter, a description will be given of components (solvent, low solubility component, second high solubility component) in the processing liquid used in the above-described preferred embodiments.

Hereinafter, expressions of "$C_{x-y}$," "$C_x$ to $C_y$," and "$C_x$" mean the number of carbons in a molecule or in a substituent. For example, $C_{1-6}$ alkyl means an alkyl chain (methyl, ethyl, propyl, butyl, pentyl, hexyl, etc.) having carbon atoms of not less than 1 and not more than 6.

Where a polymer has plural types of repeating units, these repeating units undergo copolymerization. Unless otherwise specified in a limited manner, the copolymerization may be alternating copolymerization, random copolymerization, block copolymerization, graft copolymerization, or a mixture of them. Where a polymer and a resin are indicated by a structural formula, n, m, etc., written together in parentheses indicate the number of repetitions.

<Low Solubility Component>

(A) The low solubility component contains at least one of novolak, polyhydroxystyrene, polystyrene, a polyacrylic acid derivative, a polymaleic acid derivative, polycarbonate, a polyvinyl alcohol derivative, a polymethacrylic acid derivative, and a copolymer of their combination. Preferably, (A) the low solubility component may contain at least one of novolak, polyhydroxystyrene, a polyacrylic acid derivative, polycarbonate, a polymethacrylic acid derivative, and a copolymer of their combination. More preferably, (A) the low solubility component may contain at least one of novolak, polyhydroxystyrene, polycarbonate, and a copolymer of their combination. Novolak may be phenol novolak.

The processing liquid may contain a combination of one or two or more of the above-described favorable examples as (A) the low solubility component. For example, (A) the low solubility component may contain both novolak and polyhydroxystyrene.

Such a mode is preferable that (A) the low solubility component is made into a film by drying and the film is not largely dissolved by the peeling liquid but peeled, with objects to be removed being held. It is noted that such a mode is permissible that only a small part of (A) the low solubility component is dissolved by the peeling liquid.

Preferably, (A) the low solubility component does not contain fluorine and/or silicon, and more preferably it contains neither of them.

The aforementioned copolymerization is preferably random copolymerization or block copolymerization.

With no intention to limit the scope of claims, specific examples of (A) the low solubility component include the following compounds expressed by Chemical Formula 1 to Chemical Formula 7 given below.

[Chemical Formula 1]

[化1]

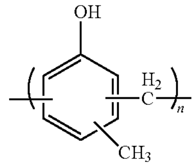

[Chemical Formula 2]

[化2]

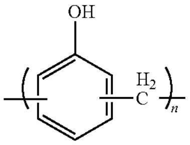

[Chemical Formula 3]

[化3]

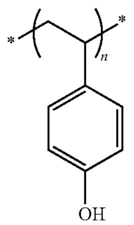

(Asterisk * indicates a bonding to an adjacent constituent unit.)

[Chemical Formula 4]

[化4]

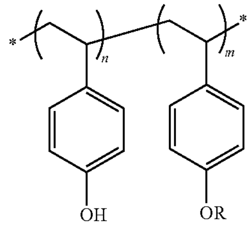

(R represents a substituent such as $C_{1-4}$ alkyl. Asterisk* indicates a bonding to an adjacent constituent unit.)

[Chemical Formula 5]

[化5]

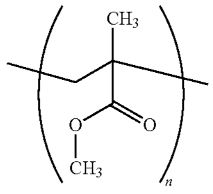

[Chemical Formula 6]

[化6]

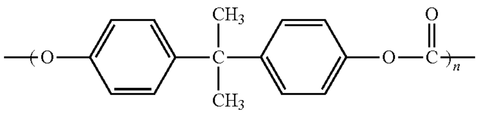

[Chemical Formula 7]

[化7]

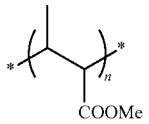

(Me represents a methyl group. Asterisk* indicates a bonding to an adjacent constituent unit.)

A weight average molecular weight (Mw) of (A) the low solubility component is preferably 150 to 500,000, more preferably 300 to 300,000, further more preferably 500 to 100,000, and still further more preferably 1,000 to 50,000.

(A) The low solubility component can be obtained by synthesis. It can also be purchased. In the case of purchase, the following are suppliers. It is also possible for suppliers to synthesize (A) polymers.

Novolak: Showa Chemical Industry Co., Ltd., Asahi Yukizai Corporation, Gun Ei Chemical Industry Co., Ltd., Sumitomo Bakelite Co., Ltd.

Polyhydroxystyrene: Nippon Soda Co., Ltd., Maruzen Petrochemical Co., Ltd., Toho Chemical Industry Co., Ltd.

Polyacrylic acid derivative: Nippon Shokubai Co., Ltd.

Polycarbonate: Sigma-Aldrich

Polymethacrylic acid derivative: Sigma-Aldrich

As compared with a total mass of the processing liquid, (A) the low solubility component is 0.1 to 50 mass %, preferably 0.5 to 30 mass %, more preferably 1 to 20 mass %, and further more preferably 1 to 10 mass %. That is, where the total mass of the processing liquid is given as 100 mass % and used as a reference, (A) the low solubility component is 0.1 to 50 mass %. That is, "as compared with" can be read as "as a reference." Unless otherwise specified, the same shall apply to the following.

<Second High Solubility Component>

(B) The second high solubility component is (B') a crack promoting component. (B') The crack promoting component contains hydrocarbon and also contains a hydroxy group (—OH) and/or a carbonyl group (—C(═O)—). (B') Where the crack promoting component is a polymer, one type of constituent unit contains hydrocarbon for each unit and also has a hydroxy group and/or a carbonyl group. Examples of the carbonyl group include carboxylic acid (—COOH), aldehyde, ketone, ester, amide, and enone, and carboxylic acid is preferable.

With no intention to limit the scope of claims or without being constrained by theory, when a processing liquid is dried to form a processing film on a substrate and a peeling liquid peels the processing film, (B) the second high solubility component is thought to yield a portion which responds by peeling the processing film. Therefore, (B) the second high solubility component is preferably higher in solubility with respect to the peeling liquid than (A) the low solubility component. Examples of a mode that (B') the crack promoting component contains ketone as a carbonyl group include a cyclic hydrocarbon. Specific examples include 1,2-cyclohexanedione and 1,3-cyclohexanedione.

As a more specific mode, (B) the second high solubility component is represented by at least any one of the following (B-1), (B-2), and (B-3).

(B-1) is a compound which contains 1 to 6 (preferably 1 to 4) of Chemical Formula 8 given below as a constituent unit and in which each constituent unit is bonded by a linking group (linker $L_1$). Here, the linker $L_1$ may be a single bond or may be $C_{1-6}$ alkylene. The $C_{1-6}$ alkylene links a constituent unit as a linker and is not limited to a divalent group. Divalent to tetravalent groups are preferable. The $C_{1-6}$ alkylene may be either a linear chain or a branched chain.

[Chemical Formula 8]

[化8]

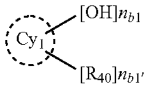

$Cy_1$ is a hydrocarbon ring of $C_{5-30}$ and preferably phenyl, cyclohexane or naphthyl and more preferably phenyl. As a favorable mode, the linker $L_1$ links a plurality of $Cy_1$.

$R_{40}$ is each independently $C_{1-5}$alkyl and preferably methyl, ethyl, propyl or butyl. The $C_{1-5}$alkyl may be either a linear chain or a branched chain.

$n_{b1}$ is 1, 2 or 3, preferably 1 or 2 and more preferably 1. $n_{b1'}$ is 0, 1, 2, 3 or 4 and preferably 0, 1 or 2.

Chemical Formula 9 below is a chemical formula of the constituent unit of Chemical Formula 8 expressed by using a linker $L_9$. The linker $L_9$ is preferably a single bond, methylene, ethylene or propylene.

[Chemical Formula 9]

[化9]

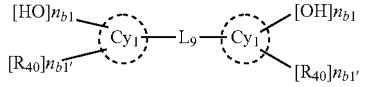

With no intention to limit the scope of claims, favorable examples of (B-1) include 2,2-bis(4-hydroxyphenyl)propane, 2,2'-methylenebis(4-methylphenol), 2,6-bis[(2-hydroxy-5-methylphenyl)methyl]-4-methylphenol, 1,3-cyclohexanediol, 4,4'-dihydroxybiphenyl, 2,6-naphthalenediol, 2,5-di-tert-butylhydroquinone, and 1,1,2,2-tetrakis(4-hydroxyphenyl)ethane. These may be obtained by polymerization or condensation.

As an example, 2,6-bis[(2-hydroxy-5-methylphenyl)methyl]-4-methylphenol shown in Chemical Formula 10 below will be described. This compound has three constituent units of Chemical Formula 8 in (B-1), and the constituent units are linked by the linker $L_1$ (methylene). $n_{b1}=n_{b1'}=1$ and $R_{40}$ is methyl.

[Chemical Formula 10]

[化10]

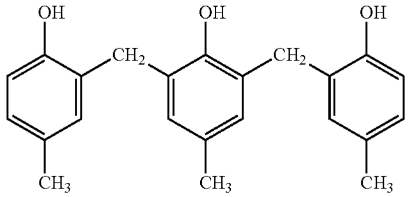

(B-2) is expressed by Chemical Formula 11 below.

[Chemical Formula 11]

[化11]

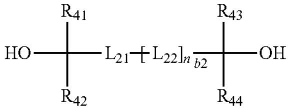

$R_{41}$, $R_{42}$, $R_{43}$ and $R_{44}$ are each independently hydrogen or $C_{1-5}$ alkyl, preferably hydrogen, methyl, ethyl, t-butyl or isopropyl, more preferably hydrogen, methyl or ethyl, and further more preferably methyl or ethyl.

Linker $L_{21}$ and linker $L_{22}$ are each independently $C_{1-20}$ alkylene, $C_{1-20}$ cycloalkylene, $C_{2-4}$ alkenylene, $C_{2-4}$ alkynylene or $C_{6-20}$ arylene. These groups may be substituted by $C_{1-5}$ alkyl or hydroxyl. Here, alkenylene means divalent hydrocarbon having one or more double bonds, and alkynylene means a divalent hydrocarbon group having one or more triple bonds. Linker $L_{21}$ and linker $L_{22}$ are favorably $C_{2-4}$ alkylene, acetylene ($C_2$ alkynylene) or phenylene, more preferably $C_{2-4}$ alkylene or acetylene, and further more preferably acetylene.

$n_{b2}$ is 0, 1 or 2, preferably 0 or 1, and more preferably 0.

With no intention to limit the scope of claims, favorable examples of (B-2) include 3,6-dimethyl-4-octyne-3,6-diol, and 2,5-dimethyl-3-hexane-2,5-diol. Favorable examples of (B-2) in another form include 3-hexene-2,5-diol, 1,4-butynediol, 2,4-hexadiene-1,6-diol, 1,4-butanediol, cis-1,4-dihydroxy-2-butane, and 1,4-benzenedimethanol.

(B-3) is a polymer which contains the constituent unit expressed by Chemical Formula 12 below and has a weight average molecular weight (Mw) of 500 to 10,000. Mw is preferably 600 to 5,000 and more preferably 700 to 3,000.

[Chemical Formula 12]

[化12]

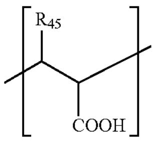

Here, $R_{45}$ is —H, —$CH_3$, or —COOH and preferably —H or —COOH. One (B-3) polymer may contain two or more constituent units, each of which is expressed by Chemical Formula 12.

With no intention to limit the scope of claims, favorable examples of (B-3) polymer include acrylic acid, maleic acid, and a polymer of their combination. More favorable examples are polyacrylic acid and a maleic acid/acrylic acid copolymer.

In the case of copolymerization, random copolymerization and block copolymerization are preferable, and random copolymerization is more preferable.

As an example, the maleic acid/acrylic acid copolymer shown in Chemical Formula 13 below will be described. The copolymer is included in (B-3) and has two types of constituent units expressed by Chemical Formula 12 in which $R_{45}$ is —H in one constituent unit and $R_{45}$ is —COOH in the other constituent unit.

[Chemical Formula 13]

[化13]

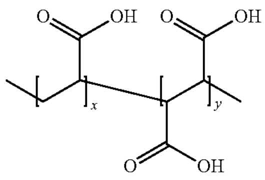

As a matter of course, the processing liquid may contain a combination of one or two or more of the above-described favorable examples as (B) the second high solubility component. For example, (B) the second high solubility component may contain both 2,2-bis(4-hydroxyphenyl)propane and 3,6-dimethyl-4-octyne-3,6-diol.

(B) The second high solubility component may be 80 to 10,000 in molecular weight. The second high solubility component is preferably 90 to 5000 in molecular weight and more preferably 100 to 3000. Where (B) the second high solubility component is a resin, a polymeride or a polymer, the molecular weight is expressed by a weight average molecular weight (Mw).

(B) The second high solubility component can be obtained by synthesis or purchase. Suppliers include Sigma-Aldrich, Tokyo Chemical Industry Co., Ltd., and Nippon Shokubai Co., Ltd.

<Solvent>

(C) The solvent preferably contains an organic solvent. (C) The solvent may have volatility. To have volatility means that it is higher in volatility than water.

Examples of the organic solvent include alcohols such as isopropanol (IPA); ethylene glycol monoalkyl ethers such as ethylene glycol monomethyl ether, ethylene glycol monoethyl ether; ethylene glycol monoalkyl ether acetates such as ethylene glycol monomethyl ether acetate, ethylene glycol monoethyl ether acetate; propylene glycol monoalkyl ethers such as propylene glycol monomethyl ether (PGME), propylene glycol monoethyl ether (PGEE); propylene glycol monoalkyl ether acetates such as propylene glycol monomethyl ether acetate (PGMEA), propylene glycol monoethyl ether acetate; esters of lactic acid such as methyl lactate, ethyl lactate (EL); aromatic hydrocarbons such as toluene, xylene; ketones such as methyl ethyl ketone, 2-heptanone, cyclohexane; amides such as N,N-dimethyl acetamide, N-methylpyrrolidone; and lactones such as γ-butyrolactone. These organic solvents may be used solely or in a mixture of two or more of them.

Other Preferred Embodiments

The present invention is not limited to the above preferred embodiments and can be carried out in still other embodiments.

For example, the spin chuck 5 is not limited to a clamping type chuck by which the plurality of chuck pins are brought into contact with a peripheral surface of the substrate W but may be a vacuum-suction type chuck by which a lower surface of the substrate W is suctioned to an upper surface of the spin base 21, thereby holding the substrate W horizontally.

In the substrate processing according to the above preferred embodiments, the shutter 82 is opened or closed, thereby changing light irradiation by the light irradiation unit 8 to on or off. However, there may be provided such an arrangement that light irradiation by the light irradiation unit 8 is changed to on or off by energizing or stopping energizing the lamp 80.

Figure 15:
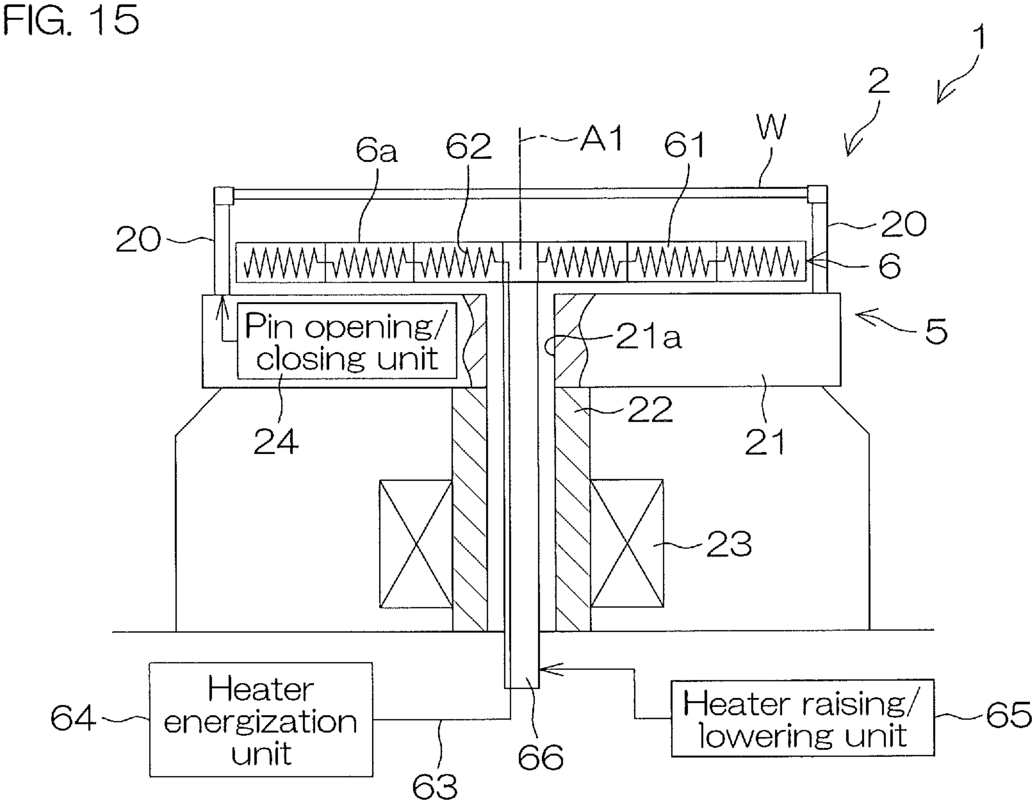
FIG. 15 is a schematic view for describing a modified example of a heater unit included in the substrate processing apparatus.

Further, as shown in FIG. 15, the heater 62 may be arranged to have a plurality of regions which are divided along a rotational radial direction so that a different temperature can be set for each region. In the heater 62, the temperature may be set for each region, for example, so as to rise as the heater 62 moves further away from a rotational center position of the substrate W. In contrast thereto, the temperature of the heater 62 may be set for each region so as to rise as the heater 62 moves closer to the rotational center position of the substrate W.

Figure 16:
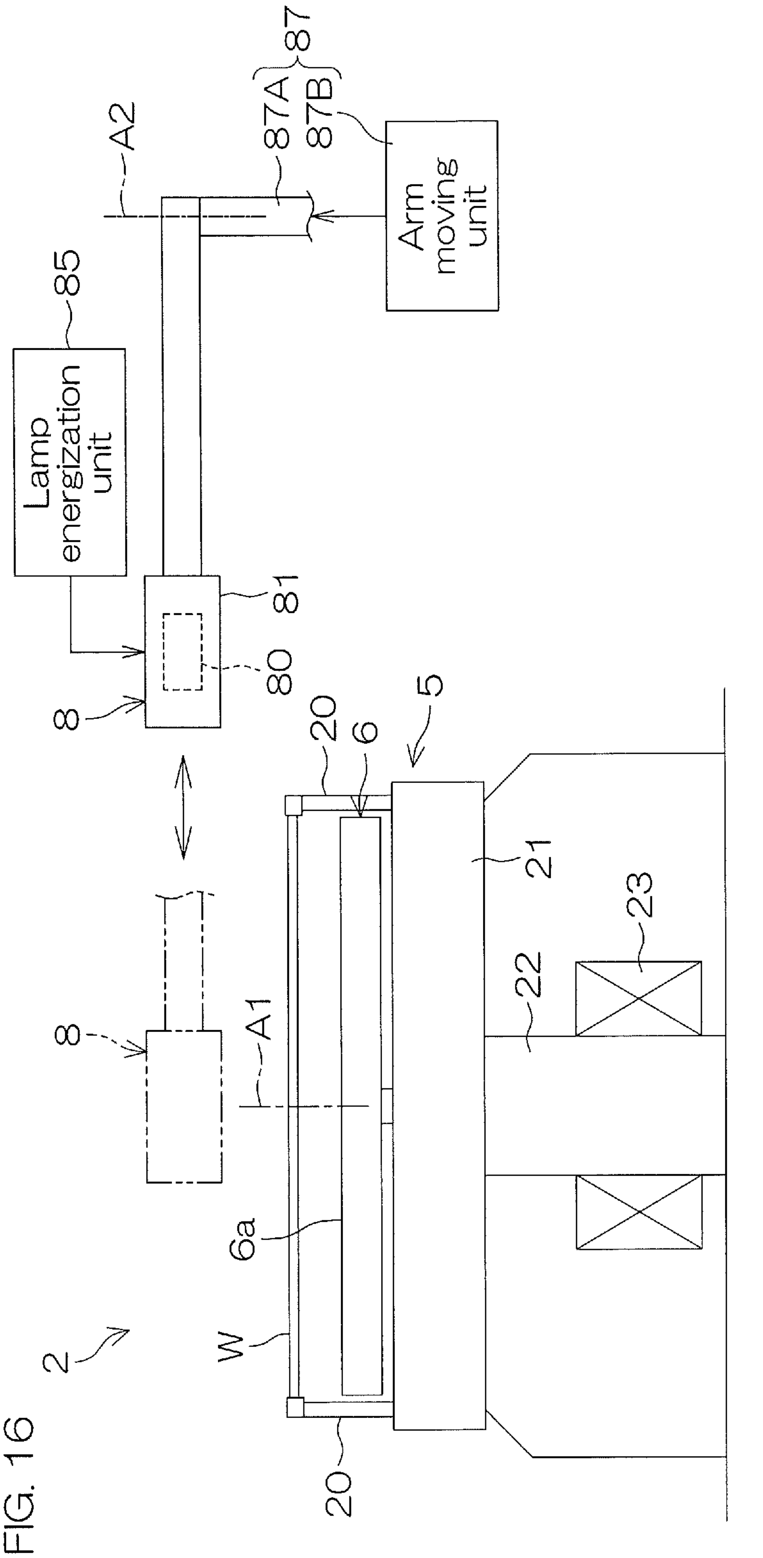
FIG. 16 is a schematic view for describing a first modified example of a light irradiation unit included in the substrate processing apparatus.

Further, as shown in FIG. 16, the light irradiation unit 8 may be arranged so as to move between an irradiation position and a home position (retreat position) by a lamp moving unit 87 installed inside the chamber 4. The irradiation position is a position at which the light irradiation unit 8 faces the upper surface of the substrate W. The irradiation position is a position at which the upper surface of the substrate W can be irradiated with light from the light irradiation unit 8. The retreat position is a position at which the upper surface of the substrate W is not irradiated with light from the light irradiation unit 8. When the light irradiation unit 8 is positioned at the irradiation position, the light irradiation unit 8 faces the upper surface of the substrate W. When positioned at the home position, the light irradiation unit 8 does not face the upper surface of the substrate W and is positioned outside the processing cup 7 in a plan view (refer to FIG. 2).

The lamp moving unit 87 includes an arm 87A which supports the lamp housing 81 and an arm moving unit 87B which moves the arm 87A. The arm moving unit 87B includes, for example, a motor which rotates the arm 87A around the rotational axis A2 for moving horizontally and a ball screw mechanism to raise and to lower the arm 87A.

Figure 17:
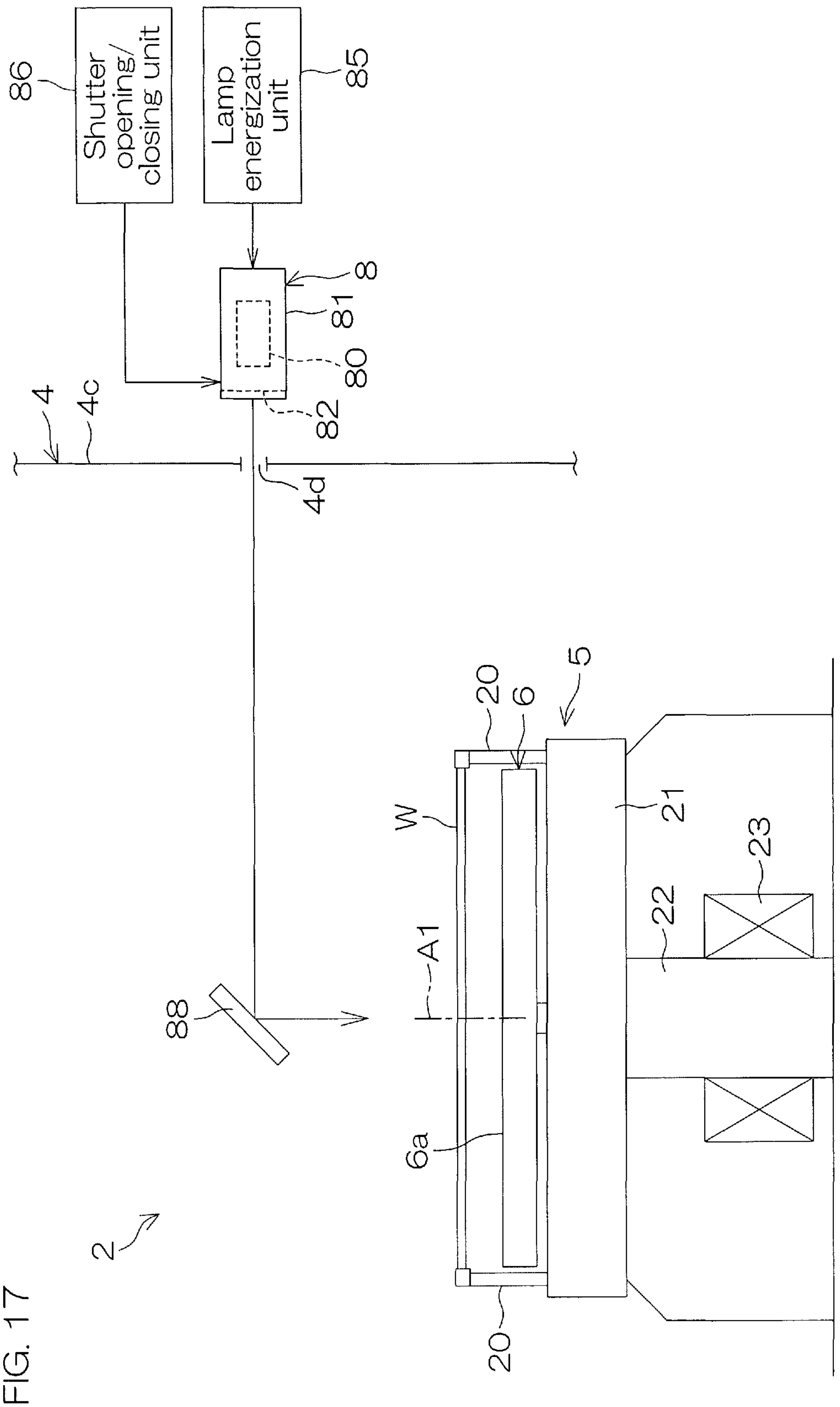
FIG. 17 is a schematic view for describing a second modified example of the light irradiation unit included in the substrate processing apparatus.

Further, as shown in FIG. 17, the light irradiation unit 8 may be positioned outside a side wall 4*c* of the chamber 4. In this case, light emitted from the light irradiation unit 8 is made incident into the chamber 4 via a slit 4*d* provided in the side wall 4*c* and reflected by a reflection board 88 disposed inside the chamber 4, and the upper surface of the substrate W is irradiated with the light.

Further, the light irradiation unit 8 may be a projector. In this case, it is possible to change an irradiation intensity of light which is emitted onto the upper surface of the substrate W by luminance of an image projected by the projector.

In the above-described preferred embodiments, the etching component is formed by a decomposition reaction of the first reaction component, and the first high solubility component is formed by a decomposition reaction of the second reaction component. However, there may be provided such an arrangement that the first reaction component is modified to the etching component by a reaction other than the decomposition reaction (for example, rearrangement reaction, etc.). There may be also provided such an arrangement that the second reaction component is modified to the first high solubility component by a reaction other than the decomposed reaction (for example, rearrangement reaction, oxidation reaction, etc.).

The above-described first and second preferred embodiments may be combined. For example, the processing liquid which contains, as a solute, the low solubility component, the first reaction component, and the second high solubility component can be used to perform the substrate processing according to the first preferred embodiment (for example, FIG. 6). In this case, since the first high solubility component is formed by the high solubility component forming processing, the first high solubility component and the second high solubility component are contained in the processing film 100 after the high solubility component forming processing. In the processing film removing step, the peeling liquid is supplied to the upper surface of the substrate W, by which the first high solubility component and the second high solubility component are dissolved to form a through hole 106 in the processing film 100. Further, in this case, it is possible to use two types of components as the low solubility component. Specifically, the first low solubility component that is lower in solubility with respect to the peeling liquid than the first high solubility component and the second low solubility component that is lower in solubility with respect to the peeling liquid than the second high solubility component can be contained in the processing liquid.

Further, in the above-described preferred embodiments, the processing liquid, the peeling liquid, the rinse liquid (decomposition accelerating liquid), and the residue removing liquid are respectively discharged from the first to the fourth moving nozzles. However, each of the liquids may be arranged so as to be discharged from a fixed nozzle having a position which is fixed with respect to the substrate W.

In this specification, where "to" or "-" is used to indicate a numerical range, each of them includes both ends thereof and a unit is applied commonly, unless otherwise specified.

While the preferred embodiments of the present invention have been described in detail, these are merely specific examples used to clarify the technical content of the present invention and the present invention should not be interpreted as being limited to these specific examples, and the scope of the present invention shall be limited only by the appended claims.

This application corresponds to Japanese Patent Application No. 2020-126876 filed on Jul. 27, 2020, with the Japan Patent Office, and the entire disclosure of this application is incorporated herein by reference.

REFERENCE SIGNS LIST

1: substrate processing apparatus
1P: substrate processing apparatus
3: controller
6: heater unit (etching component forming processing unit)
8: light irradiation unit (etching component forming processing unit)
9: first moving nozzle (processing liquid supplying unit)
10: second moving nozzle (peeling liquid supplying unit)
11: third moving nozzle (etching component forming processing unit)
23: spin motor (processing film forming unit)
100: processing film
104: etching residue
106: through hole
110: first reaction component
111: low solubility component (first low solubility component, second low solubility component)
112: etching component
113: second reaction component
114: first high solubility component
116: second high solubility component
150: surface layer portion
151: upper surface
W: substrate

The invention claimed is:

1. A substrate processing method comprising:

a processing film forming step in which a processing liquid is supplied to a front surface of a substrate to solidify or cure the processing liquid on the front surface of the substrate, thereby forming a processing film on the front surface of the substrate;

an etching component forming step in which the processing film is subjected to etching component forming processing to form an etching component in the processing film;

an etching step in which a surface layer portion of the substrate is etched by the etching component formed in the etching component forming step;

a processing film removing step in which a peeling liquid is supplied to a front surface of the processing film, thereby peeling the processing film from the front surface of the substrate and removing the processing film from the front surface of the substrate; and a high solubility component forming step in which after the etching component forming step and before the processing film removing step, the processing film is subjected to high solubility component forming processing, thereby forming in the processing film a first high solubility component which is higher in solubility with respect to the peeling liquid than other components in the processing film, wherein in the processing film removing step, the peeling liquid is supplied to the front surface of the substrate, thereby dissolving the first high solubility component in the processing film, and in the processing film forming step, the processing film is formed which contains a first low solubility component that is different from the first high solubility component and that is lower in solubility with respect to the peeling liquid than the first high solubility component.

2. The substrate processing method according to claim 1, wherein the etching component forming processing is processing which includes at least any one of heating of the processing film, supply of water to the processing film, and light irradiation onto the processing film.

3. The substrate processing method according to claim 1, wherein the high solubility component forming processing is light irradiation onto the processing film.

4. The substrate processing method according to claim 1, wherein the first high solubility component is dissolved in the peeling liquid to form a through hole in the processing film.

5. The substrate processing method according to claim 1, wherein in the processing film forming step, the processing film which contains a first reaction component is formed, in the etching component forming step, the first reaction component is decomposed by the etching component forming processing to form a second reaction component in the processing film together with the etching component, and in the high solubility component forming step, the second reaction component is decomposed by the high solubility component forming processing to form the first high solubility component in the processing film.

6. The substrate processing method according to claim 5, further comprising a decomposition accelerating liquid supplying step in which a decomposition accelerating liquid to accelerate decomposition of the first reaction component in the etching component forming step is supplied to the front surface of the substrate.

7. The substrate processing method according to claim 6, wherein in the decomposition accelerating liquid supplying step, decomposition of the second reaction component is accelerated by the decomposition accelerating liquid which is supplied to the front surface of the substrate.

8. The substrate processing method according to claim 5, wherein the first reaction component is a carboxylic acid ester or a sulfonic acid ester.

9. The substrate processing method according to claim 1, wherein in the processing film forming step, the processing film which contains a first reaction component is formed, and in the etching component forming step, the processing film is subjected to the etching component forming processing, by which the first reaction component in the processing film is decomposed to form an etching component.

10. The substrate processing method according to claim 9, further comprising a decomposition accelerating liquid supplying step in which the decomposition accelerating liquid to accelerate decomposition of the first reaction component in the etching component forming step is supplied to the front surface of the substrate.

11. The substrate processing method according to claim 1, wherein in the processing film forming step, the processing film which contains a second high solubility component is formed, and the second high solubility component in the processing film is dissolved by the peeling liquid which is supplied in the processing film removing step.

12. The substrate processing method according to claim 11, wherein the second high solubility component is dissolved in the peeling liquid supplied to the front surface of the processing film in the processing film removing step, thereby forming a through hole in the processing film.

13. The substrate processing method according to claim 11, wherein in the processing film forming step, the processing film is formed which contains a second low solubility component that is lower in solubility with respect to the peeling liquid than the second high solubility component.

14. The substrate processing method according to claim 1, wherein in the etching step, etching residue is formed by etching of the surface layer portion of the substrate, the etching residue is held by the processing film which is formed in the processing film forming step, and the processing film removing step includes a step in which the etching residue is removed together with the processing film in a state that the etching residue is held by the processing film.

15. A substrate processing apparatus comprising:

a processing liquid supplying unit that includes a processing liquid nozzle which supplies a processing liquid to a front surface of a substrate;

a processing film forming unit by which the processing liquid present on the front surface of the substrate is solidified or cured to form a processing film on the front surface of the substrate;

an etching component forming processing unit which applies etching component forming processing to the processing film;

a peeling liquid supplying unit that includes a peeling liquid nozzle which supplies to the front surface of the substrate a peeling liquid to peel the processing film from the front surface of the substrate; and a controller which controls the processing liquid supplying unit, the processing film forming unit, the etching component forming processing unit, and the peeling liquid supplying unit; wherein the controller is programmed so as to execute a processing film forming step in which the processing liquid is supplied from the processing liquid supplying unit to the front surface of the substrate and the processing liquid supplied to the front surface of the substrate is solidified or cured by the processing film forming unit to form the processing film on the front surface of the substrate, an etching component forming step in which the etching component forming processing is performed by the etching component forming processing unit to form an etching component in the processing film, an etching step in which a surface layer portion of the substrate is etched by the etching component that is formed in the etching component forming step, and a processing film removing step in which the peeling liquid is supplied from the peeling liquid supplying unit to the front surface of the substrate, thereby peeling the processing film from the front surface of the substrate and removing the processing film from the front surface of the substrate, the controller is further programmed to execute a high solubility component forming step in which after the etching component forming step and before the processing film removing step, the processing film is subjected to high solubility component forming processing, thereby forming in the processing film a first high solubility component which is higher in solubility with respect to the peeling liquid than other components in the processing film, in the processing film removing step, the peeling liquid is supplied to the front surface of the substrate, thereby dissolving the first high solubility component in the processing film, and in the processing film forming step, the processing film is formed which contains a first low solubility component that is different from the first high solubility component and that is lower in solubility with respect to the peeling liquid than the first high solubility component.

16. A processing liquid which is solidified or cured to form a processing film that can be peeled from a front surface of a substrate by a peeling liquid, the processing liquid having a reaction component that forms in the processing film an etching component to etch a surface layer portion of the substrate by etching component forming processing and a solid-state keeping component that has a material composition different from the reaction component and that keeps a solid state in the processing film even after the etching component forming processing is performed, wherein the reaction component is a carboxylic acid ester or a sulfonic acid ester.

* * * * *